(12) United States Patent
Burak

(10) Patent No.: US 9,154,112 B2
(45) Date of Patent: Oct. 6, 2015

(54) COUPLED RESONATOR FILTER COMPRISING A BRIDGE

(75) Inventor: Dariusz Burak, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 508 days.

(21) Appl. No.: 13/036,489

(22) Filed: Feb. 28, 2011

(65) Prior Publication Data
US 2012/0218056 A1 Aug. 30, 2012

(51) Int. Cl.
*H03H 9/58* (2006.01)
*H03H 9/02* (2006.01)
*H03H 9/13* (2006.01)

(52) U.S. Cl.
CPC .............. *H03H 9/58* (2013.01); *H03H 9/02086* (2013.01); *H03H 9/02118* (2013.01); *H03H 9/132* (2013.01); *H03H 9/584* (2013.01)

(58) Field of Classification Search
CPC ... H03H 9/02; H03H 9/0211; H03H 9/02086; H03H 9/02118; H03H 9/13; H03H 9/173; H03H 9/175; H03H 9/178; H03H 9/564; H03H 9/566; H03H 9/584–9/589; H03H 9/60
USPC ........... 333/187–189; 310/322–324, 334, 335
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |

(Continued)

FOREIGN PATENT DOCUMENTS

| | | |
|---|---|---|
| CN | 1383611 A | 12/2002 |
| DE | 10160617 | 6/2003 |

(Continued)

OTHER PUBLICATIONS

G. G. Fattinger et al.; "Spurious Mode Suppression in coupled Resonator Filters"; 2005 IEEE MTT-S International Microwave Symposium Digest, pp. 409-412, Jun. 12-17, 2005.*

(Continued)

*Primary Examiner* — Barbara Summons

(57) ABSTRACT

In accordance with a representative embodiment, a bulk acoustic wave (BAW) resonator structure, comprises: a first BAW resonator comprising a first lower electrode, a first upper electrode and a first piezoelectric layer disposed between the first lower electrode and the first upper electrode; a second BAW resonator comprising a second lower electrode, a second upper electrode and a second piezoelectric layer disposed between the second lower electrode and the second upper electrode; an acoustic coupling layer disposed between the first BAW resonator and the second BAW resonator; and a bridge disposed between the first lower electrode of the first BAW resonator and the second upper electrode of the second BAW resonator.

46 Claims, 26 Drawing Sheets

(56) References Cited

U.S. PATENT DOCUMENTS

| | | |
|---|---|---|
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,975,892 A | 12/1990 | Defranould et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Boloforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,903,087 A | 5/1999 | Mattson et al. |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita et al. |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,114,795 A | 9/2000 | Tajima et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk et al. |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |

(56) References Cited

U.S. PATENT DOCUMENTS

| | | | |
|---|---|---|---|
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 6,738,267 B1 | 5/2004 | Navas Sabater et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta et al. |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson, III et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,148,466 B2 | 12/2006 | Eckman et al. |
| 7,158,659 B2 | 1/2007 | Baharav et al. |
| 7,161,448 B2 | 1/2007 | Feng et al. |
| 7,170,215 B2 | 1/2007 | Namba et al. |
| 7,173,504 B2 | 2/2007 | Larson, III et al. |
| 7,179,392 B2 | 2/2007 | Robert et al. |
| 7,187,254 B2 | 3/2007 | Su et al. |
| 7,199,683 B2 | 4/2007 | Thalhammer |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,235,915 B2 | 6/2007 | Nakamura et al. |
| 7,242,270 B2 | 7/2007 | Larson, III et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson, III et al. |
| 7,345,410 B2 | 3/2008 | Grannen et al. |
| 7,358,831 B2 | 4/2008 | Larson et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,391,286 B2 | 6/2008 | Jamneala et al. |
| 7,400,217 B2 | 7/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson, III et al. |
| 7,425,787 B2 | 9/2008 | Larson, III |
| 7,439,824 B2 | 10/2008 | Aigner |
| 7,463,118 B2 | 12/2008 | Jacobsen |
| 7,466,213 B2 | 12/2008 | Lobl et al. |
| 7,468,608 B2 | 12/2008 | Feucht et al. |
| 7,482,737 B2 | 1/2009 | Yamada et al. |
| 7,508,286 B2 | 3/2009 | Ruby et al. |
| 7,515,018 B2 | 4/2009 | Handtmann et al. |
| 7,535,154 B2 | 5/2009 | Umeda et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,576,471 B1 | 8/2009 | Solal |
| 7,602,101 B2 | 10/2009 | Hara et al. |
| 7,602,102 B1 * | 10/2009 | Barber et al. .................. 310/320 |
| 7,616,079 B2 | 11/2009 | Tikka et al. |
| 7,619,493 B2 | 11/2009 | Uno et al. |
| 7,629,865 B2 | 12/2009 | Ruby |
| 7,636,026 B2 | 12/2009 | Heinze et al. |
| 7,649,304 B2 | 1/2010 | Umeda et al. |
| 7,655,963 B2 | 2/2010 | Sadaka et al. |

(56) References Cited

U.S. PATENT DOCUMENTS

| | | |
|---|---|---|
| 7,684,109 B2 | 3/2010 | Godshalk et al. |
| 7,758,979 B2 | 7/2010 | Yamada et al. |
| 7,768,364 B2 | 8/2010 | Hart et al. |
| 7,795,781 B2 | 9/2010 | Barber et al. |
| 7,869,187 B2 | 1/2011 | McKinzie et al. |
| 7,889,024 B2 | 2/2011 | Bradley et al. |
| 7,966,722 B2 | 6/2011 | Hart et al. |
| 7,978,025 B2 | 7/2011 | Yokoama et al. |
| 8,008,993 B2 | 8/2011 | Milsom et al. |
| 8,030,823 B2 | 10/2011 | Sinha et al. |
| 8,188,810 B2 | 5/2012 | Fazzio et al. |
| 8,222,795 B2 | 7/2012 | Sinha et al. |
| 8,230,562 B2 | 7/2012 | Fazzio et al. |
| 8,248,185 B2 | 8/2012 | Choy et al. |
| 8,456,257 B1 | 6/2013 | Fattinger |
| 8,692,631 B2 | 4/2014 | Zhang |
| 8,902,023 B2 | 12/2014 | Choy et al. |
| 2001/0045793 A1 | 11/2001 | Misu et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0153965 A1 | 10/2002 | Ruby et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0193269 A1 | 10/2003 | Jang et al. |
| 2003/0205948 A1 | 11/2003 | Lin et al. |
| 2003/0227357 A1 | 12/2003 | Metzger et al. |
| 2004/0016995 A1 | 1/2004 | Kuo et al. |
| 2004/0017130 A1 | 1/2004 | Wang et al. |
| 2004/0027216 A1 | 2/2004 | Ma et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093397 A1 | 5/2005 | Yamada et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng |
| 2006/0017352 A1 | 1/2006 | Tanielian |
| 2006/0071736 A1 | 4/2006 | Ruby et al. |
| 2006/0081048 A1 | 4/2006 | Mikado et al. |
| 2006/0087199 A1 | 4/2006 | Larson et al. |
| 2006/0103492 A1 | 5/2006 | Feng et al. |
| 2006/0114541 A1 | 6/2006 | Van Beek |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0164186 A1 | 7/2006 | Stoemmer et al. |
| 2006/0176126 A1 | 8/2006 | Wang et al. |
| 2006/0185139 A1 | 8/2006 | Larson, III et al. |
| 2006/0197411 A1 | 9/2006 | Hoen et al. |
| 2006/0226932 A1 | 10/2006 | Fazzio et al. |
| 2006/0238070 A1 | 10/2006 | Costa et al. |
| 2006/0284706 A1 | 12/2006 | Ginsburg et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2007/0291164 A1 | 12/2007 | Goh et al. |
| 2008/0055020 A1 | 3/2008 | Handtmann et al. |
| 2008/0129414 A1 | 6/2008 | Lobl et al. |
| 2008/0143215 A1 | 6/2008 | Hara et al. |
| 2008/0258842 A1 | 10/2008 | Ruby et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0001848 A1 | 1/2009 | Umeda et al. |
| 2009/0064498 A1 | 3/2009 | Mok et al. |
| 2009/0079302 A1 | 3/2009 | Wall et al. |
| 2009/0096550 A1 | 4/2009 | Handtmann et al. |
| 2009/0127978 A1 | 5/2009 | Asai et al. |
| 2009/0153268 A1 | 6/2009 | Milsom et al. |
| 2009/0201594 A1 | 8/2009 | Smith |
| 2009/0267457 A1* | 10/2009 | Barber et al. ................ 310/334 |
| 2010/0033063 A1* | 2/2010 | Nishihara et al. ............. 310/365 |
| 2010/0039000 A1 | 2/2010 | Milson et al. |
| 2010/0052176 A1 | 3/2010 | Kamada et al. |
| 2010/0052815 A1 | 3/2010 | Bradley et al. |
| 2010/0091370 A1 | 4/2010 | Mahrt et al. |
| 2010/0102358 A1 | 4/2010 | Lanzieri et al. |
| 2010/0107389 A1 | 5/2010 | Nessler et al. |
| 2010/0148637 A1 | 6/2010 | Satou |
| 2010/0176899 A1 | 7/2010 | Schaufele et al. |
| 2010/0187948 A1 | 7/2010 | Sinha et al. |
| 2010/0187949 A1 | 7/2010 | Sinha et al. |
| 2010/0260453 A1 | 10/2010 | Block |
| 2010/0327697 A1 | 12/2010 | Choy et al. |
| 2010/0327994 A1 | 12/2010 | Choy et al. |

(56) References Cited

U.S. PATENT DOCUMENTS

| | | | |
|---|---|---|---|
| 2011/0084779 A1* | 4/2011 | Zhang | 333/187 |
| 2011/0121916 A1 | 5/2011 | Barber et al. | |
| 2011/0148547 A1 | 6/2011 | Zhang | |
| 2011/0204996 A1 | 8/2011 | Gilbert et al. | |
| 2012/0154074 A1 | 6/2012 | Ruby et al. | |
| 2012/0161902 A1 | 6/2012 | Feng et al. | |
| 2012/0177816 A1 | 7/2012 | Larson et al. | |
| 2012/0194297 A1 | 8/2012 | Choy | |
| 2012/0218055 A1 | 8/2012 | Burak et al. | |
| 2012/0218056 A1 | 8/2012 | Burak | |
| 2012/0218057 A1 | 8/2012 | Burak et al. | |
| 2012/0218058 A1* | 8/2012 | Burak et al. | 333/191 |
| 2012/0218059 A1 | 8/2012 | Burak et al. | |
| 2012/0218060 A1 | 8/2012 | Burak et al. | |
| 2012/0226807 A1 | 9/2012 | Panella et al. | |
| 2012/0248941 A1 | 10/2012 | Shirakawa et al. | |
| 2012/0280767 A1 | 11/2012 | Burak et al. | |
| 2013/0038408 A1 | 2/2013 | Burak et al. | |
| 2013/0106534 A1 | 5/2013 | Burak et al. | |
| 2013/0127300 A1 | 5/2013 | Umeda et al. | |
| 2014/0111288 A1 | 4/2014 | Nikkel et al. | |
| 2014/0118088 A1 | 5/2014 | Burak et al. | |
| 2014/0118091 A1 | 5/2014 | Burak et al. | |
| 2014/0118092 A1 | 5/2014 | Burak et al. | |

FOREIGN PATENT DOCUMENTS

| | | | |
|---|---|---|---|
| DE | 10239317 | 3/2004 | |
| EP | 231892 | 8/1987 | |
| EP | 0637875 | 2/1995 | |
| EP | 689254 | 12/1995 | |
| EP | 0865157 | 9/1998 | |
| EP | 880227 | 11/1998 | |
| EP | 1047189 | 10/2000 | |
| EP | 1096259 | 5/2001 | |
| EP | 1100196 | 5/2001 | |
| EP | 1180494 | 2/2002 | |
| EP | 1249932 | 10/2002 | |
| EP | 1258989 | 11/2002 | |
| EP | 1258990 | 11/2002 | |
| EP | 1517443 | 3/2005 | |
| EP | 1517444 | 3/2005 | |
| EP | 1528674 | 5/2005 | |
| EP | 1528675 | 5/2005 | |
| EP | 1528676 | 5/2005 | |
| EP | 1528677 | 5/2005 | |
| EP | 1542362 | 6/2005 | |
| EP | 1557945 | 7/2005 | |
| EP | 1575165 | 9/2005 | |
| EP | 0973256 | 9/2006 | |
| EP | 2299593 | 3/2011 | |
| GB | 1207974 | 10/1970 | |
| GB | 2013343 | 8/1979 | |
| GB | 2411239 | 8/2005 | |
| GB | 2418791 | 4/2006 | |
| GB | 2427773 | 1/2007 | |
| JP | 59023612 | 2/1984 | |
| JP | 61054686 | 3/1986 | |
| JP | 6165507 | 4/1986 | |
| JP | 62-109419 | 5/1987 | |
| JP | 62-200813 | 9/1987 | |
| JP | 1157108 | 6/1989 | |
| JP | 1-295512 | 11/1989 | |
| JP | 2-10907 | 1/1990 | |
| JP | 06005944 | 1/1994 | |
| JP | 8-330878 | 12/1996 | |
| JP | 09-027729 | 1/1997 | |
| JP | 9-83029 | 3/1997 | |
| JP | 10-32456 | 2/1998 | |
| JP | 2000-31552 | 1/2000 | |
| JP | 2000-232334 | 8/2000 | |
| JP | 2000-295065 | 10/2000 | |
| JP | 2001-102901 | 4/2001 | |
| JP | 2001-508630 | 6/2001 | |
| JP | 2002/217676 | 8/2002 | |
| JP | 2002217676 | 8/2002 | |
| JP | 2003/017964 | 1/2003 | |
| JP | 2003-505905 | 2/2003 | |
| JP | 2003/124779 | 4/2003 | |
| JP | 2003124779 | 4/2003 | |
| JP | 2003-332872 | 11/2003 | |
| JP | 2006-109472 | 4/2006 | |
| JP | 2006-186412 | 7/2006 | |
| JP | 2006-295924 | 10/2006 | |
| JP | 2006-319796 | 11/2006 | |
| JP | 2007-006501 | 1/2007 | |
| JP | 2007/028669 | 2/2007 | |
| JP | 2007-208845 | 8/2007 | |
| JP | 2007-295306 | 11/2007 | |
| JP | 2008-066792 | 3/2008 | |
| JP | 2008-131194 | * 6/2008 | |
| JP | 2008-211394 | 9/2008 | |
| WO | WO-98/16957 | 4/1998 | |
| WO | WO-98/38736 | 9/1998 | |
| WO | WO-98/56049 | 12/1998 | |
| WO | WO-99/37023 | 7/1999 | |
| WO | WO-01/06646 | 1/2001 | |
| WO | WO-01/06647 | 1/2001 | |
| WO | WO-0199276 | 12/2001 | |
| WO | WO-02/103900 | 12/2002 | |
| WO | WO-03/030358 | 4/2003 | |
| WO | WO-03/043188 | 5/2003 | |
| WO | WO-03/050950 | 6/2003 | |
| WO | WO-03/058809 | 7/2003 | |
| WO | WO-2004/034579 | 4/2004 | |
| WO | WO-2004/051744 | 6/2004 | |
| WO | WO-2004/102688 | 11/2004 | |
| WO | WO-2005/043752 | 5/2005 | |
| WO | WO-2005/043753 | 5/2005 | |
| WO | WO-2005/043756 | 5/2005 | |
| WO | WO-2006/018788 | 2/2006 | |
| WO | 2006079353 | 8/2006 | |
| WO | 2013065488 | 5/2013 | |

OTHER PUBLICATIONS

G. G. Fattinger et al.; "Coupled Bulk Acoustic Wave Resonator Filters: Key Technology for Single-to-Balanced RF Filters"; 2004 IEEE MTT-S International Microwave Symposium Digest, vol. 2, pp. 927-929, Jun. 6-11, 2004.*

Co-pending U.S. Appl. No. 12/710,640, filed Feb. 23, 2010.

U.S. Appl. No. 10/971,169, Oct. 22, 2004, Larson III, John D., et al.

"GB Search Report for", Application No. GB0522393.8 Jan. 9, 2006, 4 pages.

"GB Search Report for Application No.", GB0525884.3- Feb. 2, 2006, 4 pgs.

"British Search Report Application No.", 0605222.9 Jul. 11, 2006.

"Co-pending U.S. Appl. No. 12/710,640, filed Feb. 23, 2010".

"Co-pending U.S. Appl. No. 13/074,094, filed Mar. 29, 2011".

"Co-pending U.S. Appl. No. 13/074,262, filed Mar. 29, 2011".

"Co-pending U.S. Appl. No. 13/101,376, filed May 5, 2011".

"Examination report corresponding to application No.", GB0605770.7 Aug. 25, 2006.

"Examination Report from UK for application", GB 0605971.1 Aug. 24, 2006.

"Search Report for Great Britain Patent Application", No. 0617742.2 Mar. 29, 2007.

"Search Report for Great Britain Patent Application", No. 0617742.2 Dec. 13, 2006.

"Search Report from corresponding application", No. GB0605225.2 Jun. 26, 2006.

"Search report from corresponding application No.", GB0620152.9 Nov. 15, 2006.

"Search report from corresponding application No.", GB0620653.6 Nov. 17, 2006.

"Search report from corresponding application No.", GB0620655.1 Nov. 17, 2006.

"Search report from corresponding application No.", GB0620657.7 Nov. 23, 2006.

(56) References Cited

OTHER PUBLICATIONS

"Search Report from corresponding application No.", GB 0605779.8 Aug. 23, 2006.

"Search Report in the Great Britian Patent Application", No. 0619698.4 Nov. 30, 2006.

Akiyama, et al., "Enhancement of Piezoelectric Response in Scandium Aluminum Nitride Alloy Thin Films Prepared by Dual Reactive Cosputtering", *Adv. Mater* 2009, 593-596.

Al-Ahmad, M. et al., "Piezoelectric-Based Tunable Microstrip Shunt Resonator", *Proceedings of Asia-Pacific Microwave Conference* 2006.

Aoyama, Takayuki et al., "Diffusion of Boron, Phosphorous, Arsenic and Antimony in Thermally Grown SiliconDioxide", *Journal of the Electrochemical Society*, vol. 146, No. 5 1999, 1879-1883.

Auld, B. A., "Acoustic Resonators", *Acoustic Fields and Waves in Solids, Second Edition*, vol. II 1990, 250-259.

Bauer, L. O. et al., "Properties of Silicon Implanted with Boron Ions through Thermal Silicon Dioxide", *Solid State Electronics*, vol. 16, No. 3 Mar. 1973, 289-300.

Bi, F.Z., "Bulk Acoustic Wave RF Technology", *IEEE Microwave Magazine*, vol. 9, Issue 5, 2008, 65-80.

Chen, , "Fabrication and Characterization of ALN Thin Film Bulk Acoustic Wave Resonator", *Dissertation*, University of Pittsburgh School of Engineering.

Choi, Sungjin et al., "Design of Half-Bridge Piezo-Transformer Converters in the AC Adapter Applications", *APEC* 2005, IEEE Mar. 2005, 244-248.

Coombs, Clyde F., "Electronic Instrument Handbook", *Second Edition, McGraw-Hill, Inc.* 1995, pp. 5.1 to 5.29.

C-S Lee, et al., "Copper-Airbridged Low-Noise GaAs PHEMT With Ti/$WN_x$/Ti Diffusion Barrier for High-Frequency", *IEEE Transactions on Electron Devices*, Vol. 53, Issue: 8. 2006, 1753-1758.

Denisse, C.M.M. et al., "Plasma-Enhanced Growth and Composition of Silicon Oxynitride Films", *J. Appl. Phys.*, vol. 60, No. 7. Oct. 1, 1986, 2536-2542.

Fattinger, G. G. et al., "Coupled Bulk Acoustic Wave Resonator Filters: Key technology for single-to-balanced RF filters", 0-7803-8331-1/4/W20.00; *IEEE MTT-S Digest* 2004, 927-929.

Fattinger, G.G. et al., "Single-To-Balance Filters for Mobile Phones Using Coupled Resonator BAW Technology", 2004 *IEEE Ultrasonics Symposium* Aug. 2004, 416-419.

Fattinger, G. B. et al., "Spurious Mode Suppression in Coupled Resonator Filters", *IEEE MTT-S International Microwave Symposium Digest* 2005, 409-412.

Gilbert, S. R., "An Ultra-Miniature, Low Cost Single Ended to Differential Filter for ISM Band Applications", *Micro. Symp. Digest, 2008 IEEE MTT-S* Jun. 2008, 839-842.

Grill, A. et al., "Ultralow-K Dielectrics Prepared by Plasma-Enhanced Chemical Vapor Deposition", *App. Phys. Lett*, vol. 79 2001, 803-805.

Hadimioglu, B. et al., ""Polymer Films as Acoustic Matching Layers".", *1990 IEEE Ultrasonics Symposium Proceedings*, vol. 3 PP. [Previously submitted as "Polymer Files as Acoustic Matching Layers, 1990 IEEE Ultrasonics Symposium Proceeding. vol. 4 pp. 1227-1340, Dec. 1990". Dec. 1990, 1337-1340.

Hara, K., "Surface Treatment of Quartz Oscillator Plate by Ion Implantation", *Oyo Buturi*, vol. 47, No. 2 Feb. 1978, 145-146.

Holzlohner, Ronald et al., "Accurate Calculation of Eye Diagrams and Bit Error Rates in Optical Transmission Systems Using Linearization", *Journal of Liqhtwave Technology*, vol. 20, No. 3, Mar. 2002, pp. 389-400.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.

Jamneala, T. et al., "Coupled Resonator Filter with Single-Layer Acoustic Coupler", *IEEE Transaction on Ultrasonics, Ferroelectrics, and Frequency Control*, vol. 55 Oct. 2008, 2320-2326.

Jamneala, Tiberiu at al., "Ultra-Miniature Coupled Resonator Filter with Single-Layer Acoustic Coupler", *IEEE Transactions on Ultrasonics, Ferroelectrics, and Frequency Control*, vol. 56, No. 11. Nov. 2009, 2553-2558.

Jiang, Yimin et al., "A Novel Single-Phase Power Factor Correction Scheme", IEEE 1993, 287-292.

Jung, Jun-Phil et al., "Experimental and Theoretical Investigation on the Relationship Between AIN Properties and AIN-Based FBAR Characteristics", *2003 IEEE International Frequency Control Symposium and PDA Exhibition Jointly with the 17th European Frequency and Time Forum* Sep. 3, 2003, 779-784.

Kaitila, J. et al., "Measurement of Acoustical Parameters of Thin Films", *2006 IEEE Ultrasonics Symposium* Oct. 2006, 464-467.

Krishnaswamy, S.V. et al., "Film Bulk Acoustic Wave Resonator Technology", May 29, 1990, 529-536.

Lakin, K.M., "Bulk Acoustic Wave Coupled Resonator Filters", *2002 IEEE International Frequency Control Symposium and PDA Exhibition* May 2002, 8-14.

Lakin, K.M., "Coupled Resonator Filters", *2002 IEEE Ultrasonics Symposium* Mar. 2, 2002, 901-908.

Lakin, K.M. et al., "High Performance Stacked Crystal Filters for GPS and Wide Bandwidth Applications", 2001 *IEEE Ultrasonics Symposium* Jan. 1, 2001, 833-838.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K.M., "Thin Film BAW Filters for Wide Bandwidth and High Performance Applications", *IEEE Microwave Symposium Digest*; vol. 2 Jun. 6-11, 2004, 923-926.

Lakin, K. M., "Thin Film Resonators and Filters", *IEEE Untrasonics Symposium*, Caesar's Tahoe, NV Oct. 1999, 895-906.

Lakin, et al., "Wide Bandwidth Thin Film BAW Filters", *2004 IEEE Ultrasonics Symposium*, vol. 1, Aug. 2004, 407-410.

Larson III, John D. et al., "Measurement of Effective Kt2,Q,Rp,Rs vs. Temperature for Mo/AIN FBAR Resonators", *IEEE Ultrasonics Symposium* 2002, 939-943.

Lee, Jiunn-Homg et al., "Optimization of Frame-Like Film Bulk Acoustic Resonators for Suppression of Spurious Lateral Modes Using Finite Element Method", *IEEE Ultrasonic Symposium*, vol. 1, 2004, 278-281.

Li, Yunxiu et al., "AC-DC Converter with Worldwide Range Input Voltage by Series and Parallel Piezoelectric Transformer Connection", *35th Annual IEEE Power Electronics Specialists Conference* 2004.

Lobl, H.P. et al., "Piezoelectric Materials for BAW Resonators and Filters", *2001 IEEE Ultrasonics Symposium* Jan. 1, 2001, 807-811.

Loboda, M. J., "New Solutions for Intermetal Dielectrics Using Trimethylsilane-Based PECVD Processes", *Microelectronics Eng.*, vol. 50. 2000, 15-23.

Martin, Steven J. et al., "Development of a Low Dielectric Constant Polymer for the Fabrication of Integrated Circuit Interconnect", *12 Advanced Materials* Dec. 23, 2000, 1769-1778.

Martin, et al., "Re-growth of C-Axis Oriented AIN Thin Films", *IEEE Ultrasonics Symposium* 2006, 169-172.

Martin, et al., "Shear Mode Coupling and Tilted Gram Growth of AIN Thin Films in BAW Resonators", *IEEE Transactions on Ultrasonics, Ferroelectrics, and Frequency Control*, vol. 53, No. 7 Jul. 2006, 1339-1343.

Martinez, et al., "High confinement suspended micro-ring resonators in silicon-on-insulator", *Optics Express*, Vo. 14 No. 13 Jun. 26, 2006, 6259-6263.

Merriam-Webster, , "Collegiate Dictionary", *tenth edition* 2000, 2 pages.

Navas, J. et al., "Miniaturised Battery Charger using Piezoelectric Transformers", *IEEE* 2001, 492-496.

Ng, J. et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pandey, et al., "Anchor Loss Reduction in Resonant MEMS using MESA Structures", *Proceedings of the 2nd IEEE International Con-*

(56) References Cited

OTHER PUBLICATIONS ference on Nano/Micro Engineered and Molecular Systems, Bangkok, Thailand Jan. 16-19, 2007, 880-885.

Pang, W. et al., "High Q Single-Mode High-Tone Bulk Acoustic Resonator Integrated With Surface-Machined FBAR Filter", Microwave Symposium Digest, IEEE MTT-S International 2005, 413-416.

Parker, T. E. et al., "Temperature-Compensated Surface Acoustic-Wave Devices with SiO2 Film Overlays", J. Appl. Physics, vol. 50 1360-1369, Mar. 1979.

Pensala, et al., "Spurious resonance supression in gigahertz-range ZnO thin-film bulk acoustic wave resonators by the boundary frame method: modeling and experiment", IEEE Transactions on Ultrasonics, Ferroelectrics, and Frequency Control, vol. 56, No. 8 Aug. 2009, 1731-1744.

Pensala, "Thin film bulk acoustic wave devices: performance optimization and modeling", http://www.vtt.fi/inf/pdf/publications/2011/P756.pdf.

Reinhardt, Alexandre et al., "Design of Coupled Resonator Filters Using Admittance and Scattering Matrices", 2003 IEEE Ultrasonics Symposium May 3, 2003, 1428-1431.

Ruby, R. C., "MicroMachined Thin Film Bulk Acoustic Resonators", IEEE International Frequency Control Symposium 1994, 135-138.

Ruby, R. et al., "The Effect of Perimeter Geometry on FBAR Resonator Electrical Performance", Microwave Symposium Digest, 2005 IEEE MTT-S International Jun. 12, 2005, 217-221.

Sanchez, A.M. et al., "Mixed Analytical and Numerical Design Method for Piezoelectric Transformers", IEEE Xplore 2003, 841-846.

Schoenholz, J.E. et al., "Plasma-Enhanced Deposition of Silicon Oxynitride Films", Thin Solid Films 1987, 285-291.

Schuessler, Hans H., "Ceramic Filters and Resonators", Reprinted from IEEE Trans. Sonics Ultrason., vol. SU-21 Oct. 1974, 257-268.

Shirakawa, A. A. et al., "Bulk Acoustic Wave Coupled Resonator Filters Synthesis Methodology", 2005 European Microwave Conference, vol. 1 Oct. 2005.

Small, M. K. et al., "A De-Coupled Stacked Bulk Acoustic Resonator (DSBAR) Filter with 2 dB Bandwidth >4%", 2007 IEEE Ultrasonics Symposium Oct. 2007, 604-607.

Spangenberg, B. et al., "Dependence of the Layer Resistance of Boron Implantation in Silicon and the Annealing Conditions", Comptus Rendus de l'Academic Bulgare des Sciences, vol. 33, No. 3 1980, 325-327.

Tas, et al., "Reducing Anchor Loss in Micromechanical Extensional Mode Resonators", IEEE Transactions on Ultrasonics, Ferroelectrics and Frequency Control, vol. 57, No. 2. Feb. 2010, 448-454.

Thomsen, C. et al., "Surface Generation and Detection of Phonons by Picosecond Light Pulses", Phys. Rev. B, vol. 34 1986, 4129.

Tiersten, H. F. et al., "An Analysis of Thickness-Extensional Trapped Energy Resonant Device Structures with Rectangular Electrodes in the Piezoelectric Thin Film on Silicon Configuration", J. Appl. Phys. 54 (10) Oct. 1983, 5893-5910.

Topich, J. A. et al., "Effects of Ion Implanted Fluorine in Silicon Dioxide", Nuclear Instr. and Methods, Cecon Rec, Cleveland, OH May 1978, 70-73.

Tsubbouchi, K. et al., "Zero Temperature coefficient Surface Acoustic Wave Devices using Epitaxial AlN Films", IEEE Ultrasonic symposium, San Diego, CA, 1082 1982, 240-245.

Vasic, D et al., "A New Method to Design Piezoelectric Transformer Used in MOSFET & IGBT Drive Circuits", IEEE 34th Annual Power Electronics Specialists Conference, 2003 vol. 1 Jun. 15-19, 2003, 307-312.

Vasic, D et al., "A New MOSFET & IGBT Gate Drive Insulated by a Piezoelectric Transformer", IEEE 32 nd Annual Power Electronics Specialists Conference, 2001 vol. 3 2001, 1479-1484.

Yanagitani, et al., "Giant Shear Mode Electromechanical Coupling Coefficient k15 in C-Axis Tilted ScAlN Films", IEEE International Ultrasonics Symposium 2010.

Yang, C.M. et al., "Highly C Axis Oriented AlN Film Using MOCVD for 5GHx Band FBAR Filter", 2003 IEEE Ultrasonics Symposium Oct. 5, 2003, pp. 170-173.

Allaha, Mohamed A., "Solidl Mounted BAW Resonators With Layer-Transferred AlN Using Sacrificial Si Surfaces", Solid State Electronics, ESSDERC 2009 Conference, vol. 54, Issue (Sep. 2010, 1041-1046.

Dubois, M A., "Solid Mounted Resonator Based on Aluminum Nitride Thin Film", 1998 IEEE Ultrasonics Symposium, vol. 1 1998, 909-912.

Strijbos, R., "Design and Characterisation of High-Q Solidly-Mounted Bulk Acoustic Wave Filters", ECTC '07. Proceedings. 57th Electronic Components and Technology Conference, Publication Year 2007 2007, 169-174.

"Co-pending U.S. Appl. No. 13/036,489, filed Feb. 28, 2011".
"Co-pending U.S. Appl. No. 13/161,946, filed Jun. 16, 2011".
"Co-pending U.S. Appl. No. 13/286,038, filed Oct. 31, 2011".
"Co-pending U.S. Appl. No. 13/654,718, filed Oct. 18, 2012".
"Co-pending U.S. Appl. No. 13/658,024, filed Oct. 23, 2012".
"Co-pending U.S. Appl. No. 13/660,941, filed Oct. 25, 2012".
"Co-pending U.S. Appl. No. 13/663,449, filed Oct. 29, 2012".
"Co-pending U.S. Appl. No. 13/781,491, filed Feb. 28, 2013".

Lee, et al., "Development of High-Quality FBAR Devices for Wireless Applications Employing Two-Step Annealing Treatments", IEEE Microwave and Wireless Components Letters, vol. 21, No. 11 Nov. 2011.

Tang, et al., "Micromachined Bulk Acoustic Resonator With a Raised Frame", 16th International Conference on Mechatronics Technology, Oct. 16-19, 2012, Tianjin, China Oct. 16-19, 2012.

"Co-pending U.S. Appl. No. 13/151,631, filed Jun. 2, 2011".
"Non-Final Office Action dated Feb. 26, 2014 from U.S. Appl. No. 13/151,631".

Moriera, et al., "Aluminum Scandium Nitride Thin-Film Bulk Acoustic Resonators for Wide Band Applications", Vacuum 86 (2011) 23-26.

, "IEEE Xplore Abstract for Suppression of Acoustic Energy Leakage in FBARS with Al Bottom Electrode: FEM Simulation and Experimental Results", Oct. 28-31, 2007, 2 pages.

, "Machine Translation of JP 2007-208845", Aug. 16, 2007, 1-9.
, "Machine Translation of JP 2008-211394", Sep. 11, 2008, 1-8.

Ohara, et al., "Suppression of Acoustic Energy Leakage in FBARs with Al Bottom Electrode: FEM Simulation and Experimental Results", 2007 IEEE Ultrasonics Symposium,, Oct. 28-31, 2007, 1657-1660.

Machine translation of JP 2006-186412.
Machine translation of JP 2008-066792.
Machine Translation of CN1383611A.

Office Action mailed Apr. 15, 2015 in Chinese Patent Application No. 201210093059.0 (Unofficial/Non-certified translation provided by foreign agent included).

* cited by examiner

COUPLED RESONATOR FILTER COMPRISING A BRIDGE

BACKGROUND

In many electronic applications, electrical resonators are used. For example, in many wireless communications devices, radio frequency (RF) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Bulk Acoustic Wave (BAW) resonator. The BAW resonator includes an acoustic stack comprising, inter alia, a layer of piezoelectric material disposed between two electrodes. Acoustic waves achieve resonance across the acoustic stack, with the resonant frequency of the waves being determined by the materials in the acoustic stack. One type of BAW resonator comprises a piezoelectric film for the piezoelectric material. These resonators are often referred to as Film Bulk Acoustic Resonators (FBAR).

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to certain known resonators.

FBARs may comprise an acoustic stack disposed over air. In such a structure, the acoustic stack can be referred to as a membrane. Often, the membrane is suspended over a cavity provided in a substrate. Other FBARs comprise the acoustic stack formed over an acoustic mirror formed in the substrate.

Filters based on FBAR technology provide a comparatively low in-band insertion loss due to the comparatively high quality (Q) factor of FBAR devices. FBAR-based filters are often employed in cellular or mobile telephones that can operate in multiple frequency bands. In such devices, it is important that a filter intended to pass one particular frequency band ("the passband") should have a high level of attenuation at other nearby frequency bands which contain signals that should be rejected. Specifically, there may be one or more frequencies or frequency bands near the passband which contain signals at relatively high amplitudes that should be rejected by the filter. In such cases, it would be beneficial to be able to increase the filter's rejection characteristics at those particular frequencies or frequency bands, even if the rejection at other frequencies or frequency bands does not receive the same level of rejection.

One type of filter based on FBAR technology is known as a coupled resonator filter (CRF). A CRF comprises a coupling structure disposed between two vertically stacked FBARs. The CRF combines the acoustic action of the two FBARs and provides a bandpass filter transfer function. For a given acoustic stack, the CRF has two fundamental resonance modes, a symmetric mode and an anti-symmetric mode, of different frequencies. The degree of difference in the frequencies of the modes depends, inter alia, on the degree or strength of the coupling between the two FBARs of the CRF. If the degree of coupling between the two FBARs is too great (over-coupled), the passband is unacceptably wide, and an unacceptable 'swag' or 'dip' in the center of the passband results, as does an attendant unacceptably high insertion loss in the center of the passband. If the degree of coupling between the FBARs is too low (under-coupled), the passband of the CRF is too narrow.

All FBARs and filters based on FBARs have an active region. The active region of a CRF comprises the region of overlap of the top FBAR, the coupling structure, and the bottom FBAR. Generally, it is desirable to confine the acoustic energy of certain desired acoustic modes within the active region. As should be appreciated by one of ordinary skill in the art, at the boundaries of the active region, reflection of desired modes can result in mode conversion into spurious/undesired modes, and loss of acoustic energy over a desired frequency range (e.g., the passband of the CRF).

In FBAR devices, mitigation of acoustic losses at the boundaries and the resultant mode confinement in the active region of the FBAR (the region of overlap of the top electrode, the piezoelectric layer, and the bottom electrode) has been effected through various methods. Notably, frames are provided along one or more sides of the FBARs. The frames create an acoustic impedance mismatch that reduces losses by reflecting desired modes back to the active area of the resonator, thus improving the confinement of desired modes within the active region of the FBAR.

While the incorporation of frames has resulted in improved mode confinement and attendant improvement in the quality (Q) factor of the FBAR, direct application of known frame elements has not resulted in significant improvement in mode confinement and Q of known CRFs.

What is needed, therefore, is a CRF that overcomes at least the known shortcomings described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
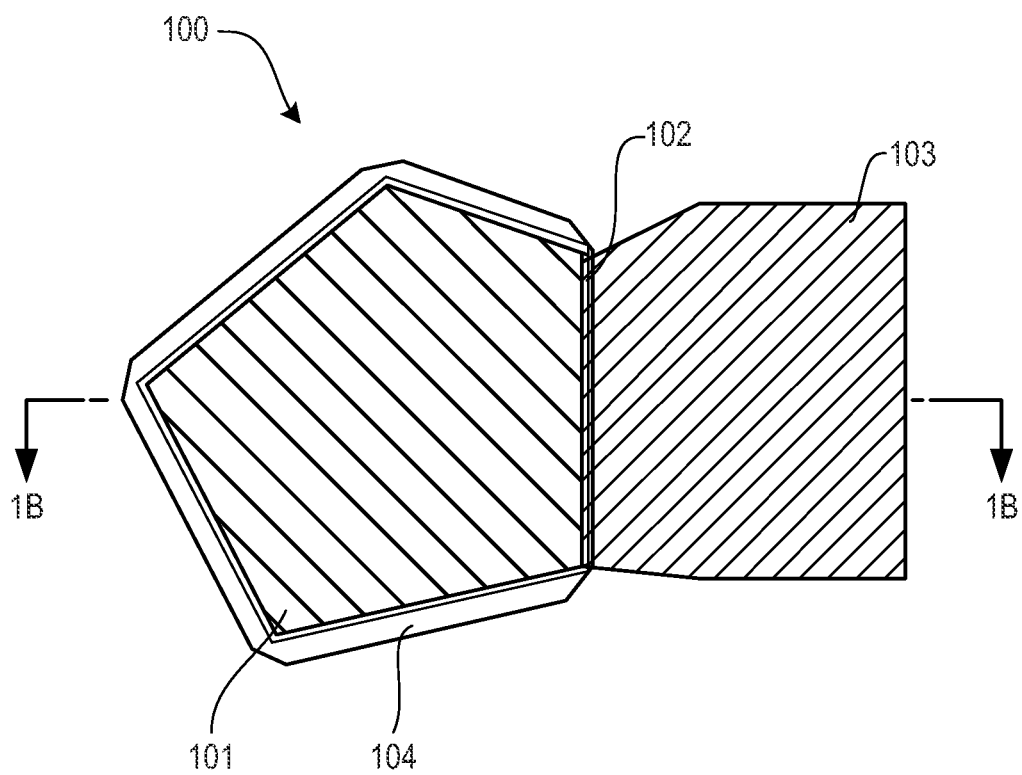
FIG. 1A shows a top-view of a CRF in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example. 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonator-based filters (e.g., CRFs) including FBAR-based filters, their materials and their methods of fabrication. Certain details of FBAR-based filters, materials thereof and their methods of fabrication may be found in one or more of the following commonly owned U.S. Patents and Patent Applications: U.S. Pat. No. 6,107,721, to Lakin; U.S. Pat. Nos. 5,587,620, 5,873, 153 and 6,507,983 to Ruby, et al.; U.S. patent application Ser. No. 11/443,954, entitled "Piezoelectric Resonator Structures and Electrical Filters" to Richard C. Ruby, et al.; U.S. patent application Ser. No. 10/990,201, entitled "Thin Film Bulk Acoustic Resonator with Mass Loaded Perimeter" to Htongjun Feng, et al.; U.S. patent application Ser. No. 11/713,726, entitled "Piezoelectric Resonator Structures and Electrical Filters having Frame Elements" to Jamneala, et al.; U.S. patent application Ser. No. 11/159,753, entitled "Acoustic Resonator Performance Enhancement Using Alternating Frame Structure" to Richard C. Ruby, et al; U.S. patent application Ser. No. 12/490,525 entitled "Acoustic Resonator Structure Comprising a Bridge" to John Choy, et al. and filed on Jun. 24, 2009; and U.S. patent application Ser. No. 12/626, 035, entitled "Acoustic Resonator Structure Having an Electrode with a Cantilevered Portion" to John Choy, et al. and filed on Nov. 25, 2009. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

FIG. 1A shows a top view of a CRF 100 in accordance with a representative embodiment. The CRF 100 comprises a top electrode 101 (referred to below as second upper electrode 101), comprising five (5) sides, with a connection side 102 configured to provide the electrical connection to an interconnect 103. The interconnect 103 provides electrical signals to the top electrode 101 to excite desired acoustic waves in piezoelectric layers (not shown in FIG. 1) of the CRF 100. The top electrode 101 comprises a bridge 104 (referred to below as second bridge 104) disposed on all sides (the bridge on the connection side 102 cannot be seen in the top view of FIG. 1A). As described more fully below, providing the bridge 104 about the perimeter of the CRF 100 contributes to improved insertion loss and the Q-factors of odd and even modes ($Q_o$ and $Q_e$, respectively) over a desired frequency range (e.g., a passband of the CRF).

Figure 1B:
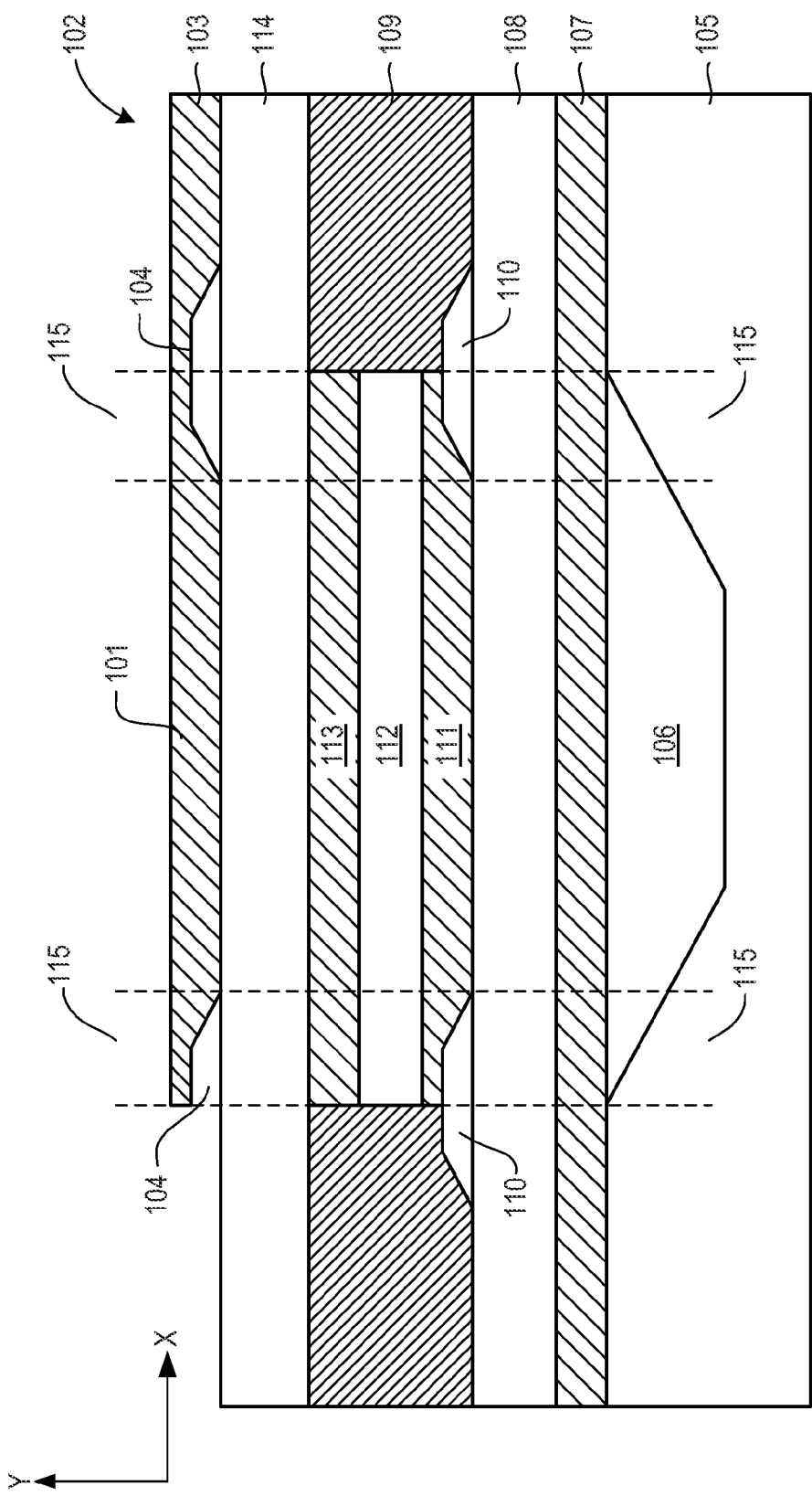
FIG. 1B is a cross-sectional view of the CRF of FIG. 1A, taken along the line 1B-1B.

FIG. 1B shows a cross-sectional view of the CRF 100 taken along line 1B-1B in accordance with a representative embodiment. The CRF 100 comprises a plurality of layers disposed over a substrate 105 having a cavity 106. The inclusion of a cavity 106 for reflection of acoustic waves in the CRF 100 is merely illustrative. It is emphasized that rather than cavity 106 a known acoustic reflector (e.g., a Bragg mirror (not shown)) comprising alternating layers of high and low acoustic impedance may be provided in the substrate 105 to provide acoustic isolation.

A first lower electrode 107 is disposed over the substrate 105 and partially over the cavity 106 (or Bragg mirror). A first piezoelectric layer 108 is disposed over the first lower electrode 107. A planarization layer 109 is disposed over the first piezoelectric layer 108 and generally does not overlap the cavity 106. In a representative embodiment, the planarization layer 109 comprises non-etchable borosilicate glass (NEBSG). As should be appreciated by one of ordinary skill in the art, the structure provided by the first lower electrode 107, the first piezoelectric layer 108 and the first upper electrode 111 is a bulk acoustic wave (BAW) resonator, which in this illustrative embodiment comprises a first BAW resonator of the CRF 100. When the BAW resonator is disposed over a cavity, it is a so-called FBAR; and when the BAW resonator is disposed over an acoustic reflector (e.g., Bragg mirror) it is a so-called solidly mounted resonator (SMR). The present teachings contemplate the use of either FBARs or SMRs in filters (e.g., CRFs).

A first bridge 110 is provided at an interface of a first upper electrode 111 and the planarization layer 109, and is disposed about the perimeter of the CRF 100. In representative embodiments first and second bridges 110, 104 (and other bridges described in connection with representative embodiments below) have a trapezoidal cross-sectional shape. It is emphasized that the trapezoidal cross-sectional shape of the bridges of the representative embodiments is merely illustrative and the bridges are not limited to a trapezoidal cross-sectional shape. For example, the cross-sectional shape of the bridges of the representative embodiments could be square or rectangular, or of an irregular shape. The "slanting" walls of first and second bridges 110, 104 (and other bridges described in connection with representative embodiments below) is beneficial to the quality of layers (e.g., the quality of the crystalline piezoelectric layer(s)) grown over the first and second bridges 110, 104 (and other bridges described in connection with representative embodiments below). Notably, the first bridge 110 and the second bridge 104 (and other bridges described in connection with representative embodiments below) are not necessarily the same shape (e.g., one could have trapezoidal cross-sectional shape and one could have a rectangular cross-sectional in shape). Typical dimensions of the first and second bridges 110, 104 (and other bridges described in connection with representative embodiments below) are approximately 2.0 μm to approximately 10.0 μm in width (x-dimension in the coordinate system shown in FIG. 1B and approximately 300 A to approximately 1500 A in height (y-dimension in the coordinate system shown in FIG. 1B). In certain embodiments, first and second bridges 110, 104 (and other bridges described in connection with representative embodiments below) extend over the cavity 106 (depicted as overlap 115 in FIG. 1B). The overlap 115 has a width (x-dimension) of approximately 0.0 μm (i.e., no overlap with the cavity 106) to approximately 5.0 μm. Notably, the first bridge 110 and the second bridge 104 (and other bridges described in connection with representative embodiments below) do not need to be the same dimensions or located at the same relative position. For example, the overlap 115 of the first and second bridges 110 with cavity 106 is shown in FIG. 1B to be identical for all bridges 104, 110; but this is not essential as different bridges 104, 110 may overlap the cavity 106 to a greater or lesser extent than other bridges 104, 110.

Generally, first and second bridges 110, 104 (and other bridges described in connection with representative embodiments below) need to be wide enough to ensure suitable decay of evanescent waves at the boundary of a CRF region and a decoupling region (described below in connection with FIG. 2B) in order to minimize tunneling of modes into the field region (described below in connection with FIG. 2B) where propagating modes exist at the frequency of operation. On the other hand, if the bridge is too wide, reliability issues can arise and can also limit the placement of similar CRFs (not shown) from being placed in proximity (thus unnecessary increasing the total area of a chip). As such, the optimum width of the first and second bridges 110, 104 is determined experimentally.

In addition, the width and position of the first and second bridges 110, 104 (and other bridges described in connection with representative embodiments) and overlap 115 with the cavity 106 are selected to improve Q-enhancement of resonant mode. In general, the greater the overlap 115 of each bridge 104, 110 with the cavity 106 of the CRF 100, the greater the improvement $Q_o$ and $Q_e$ with the improvement realized being fairly small after an initial increase. The improvement in $Q_o$ and $Q_e$ must be weighed against a decrease in the electromechanical effective coupling coefficient $kt^2$, which decreases with increasing overlap 115 of the first and second bridges 110,104 with the cavity 106. Degradation of $kt^2$ results in a degradation of insertion loss ($S_{21}$). As such, the overlap 115 of the first and second bridges 110,104 with the cavity 106 is typically optimized experimentally.

The first and second bridges 110, 104 (and other bridges described in connection with representative embodiments below) have a height (y-dimension in the coordinate system of FIG. 1B) of approximately 300 A to approximately 1500 A. Notably, the lower limit of the height is determined by the limits of the process of releasing sacrificial material in the forming of the first and second bridges 110, 104 (and other bridges described in connection with representative embodiments below), and the upper limit of the height is determined by the quality of layers grown over the first and second bridges 110, 104 (and other bridges described in connection with representative embodiments) and by the quality of subsequent processing of possibly non-planar structures. An acoustic coupling layer 112 ("coupling layer 112") is provided over the first upper electrode 111. In a representative embodiment, the coupling layer 112 comprises carbon doped oxide (CDO), or NEBSG, or carbon-doped silicon oxide (SiOCH) such as described in commonly owned U.S. patent application Ser. No. 12/710,640, entitled "Bulk Acoustic Resonator Structures Comprising a Single Material Acoustic Coupling Layer Comprising Inhomogeneous Acoustic Property" to Elbrecht, et al. and filed on Feb. 23, 2010. The disclosure of this patent application is specifically incorporated herein by reference. Notably, SiOCH films of the representative embodiment belong to a general class of comparatively low dielectric constant (low-k) dielectric materials often referred to as carbon-doped oxide (CDO). Alternatively, the coupling layer 112 may comprise other dielectric materials with suitable acoustic impedance and acoustic attenuation, including, but not limited to porous silicon oxynitride (SiON); porous boron doped silicate glass (BSG); or porous phosphosilicate glass (PSG). Generally, the material used for the coupling layer 112 is selected to provide comparatively low acoustic impedance and loss in order to provide desired pass-band characteristics.

A second lower electrode 113 is provided over the coupling layer 112, and a second piezoelectric layer 114 is provided over the second lower electrode 113. The second upper electrode 101 is provided over the second piezoelectric layer 114.

Illustratively, the first lower electrode 107 and the second upper electrode 101 are molybdenum (Mo) having a thickness of approximately 3000 A to approximately 10000 A. Illustratively, the first piezoelectric layer 108 and the second piezoelectric layer 114 are aluminum nitride (AlN) having a thickness of approximately 5000 A to approximately 15000 A. The first upper electrode 111 and the second lower electrode 113 are illustratively tungsten (W) having a thickness of approximately 3000 A to approximately 10000 A.

The second bridge 104 is disposed about the perimeter of the CRF 100. As should be appreciated by one of ordinary skill in the art, the structure provided by the second lower electrode 113, the second piezoelectric layer 114 and the second upper electrode 101 is a (BAW) resonator, which in this illustrative embodiment comprises a second BAW resonator of the CRF 100.

As should be appreciated by one of ordinary skill in the art, the structure provided by the second lower electrode 113, the second piezoelectric layer 114 and the second upper electrode 101 is an FBAR, which in this illustrative embodiment comprises the upper FBAR of the CRF 100.

The first and second bridges 110, 104 are formed by patterning a sacrificial material over the first piezoelectric layer 108 and the second piezoelectric layer 114, and forming the depicted layers thereover. After the layers of the CRF 100 are formed as desired, the sacrificial material is released leaving the first and second bridges 110, 104 "filled" with air. In a representative embodiment, the sacrificial material used to form the first and second bridges 110, 104 is the same as the sacrificial material used to form the cavity 106 (e.g., PSG).

In a representative embodiment, the first bridge 110 and the second bridge 104 provide a perimeter around an active region of the CRF 100. The active region thus includes the portions of the first BAW resonator, the second BAW resonator, the coupling layer 112 disposed over the cavity 106 (or other acoustic reflector), and bounded by the perimeter provided by the first bridge 110 and the second bridge 104. As should be appreciated by one of ordinary skill in the art, the active region of the CRF 100 is bordered around its perimeter by an acoustic impedance discontinuity created at least in part by the first and second bridges 110, 104, and above and below (cavity 106) by an acoustic impedance discontinuity due to the presence of air. Thus, a resonant cavity is beneficially provided in the active region of the CRF 100. In certain embodiments, the first bridge 110 and the second bridge 104 are unfilled (i.e., contain air), as is the cavity 106. In other embodiments described more fully below, the first bridge 110, the second bridge 104, or both, are filled with a material to provide the desired acoustic impedance discontinuity.

It is noted that the first bridge 110, or the second bridge 104, or both, do not necessarily have to extend along all edges of the CRF 100, and therefore not along the entire perimeter of the CRF 100. For example, the first bridge 110 or the second bridge 104, or both, may be provided on four "sides" of the five-sided CRF 100 shown in FIG. 1A. In certain embodiments, the first bridge 110 is disposed along the same four sides of the CRF, for example, as the second bridge 104. In other embodiments, the first bridge 110 is disposed along four sides (e.g., all sides but the connection side 102) of the CRF 100 and the second bridge 104 is disposed along four sides of the CRF 100, but not the same four sides as the first bridge 110 (e.g., second bridge 104 is disposed along the connection side 102).

As described more fully below, the acoustic impedance mismatch provided by the first bridge 110 and the second bridge 104 causes reflection of acoustic waves at the boundary that may otherwise propagate out of the active region and be lost, resulting in energy loss. The first bridge 110 and the second bridge 104 serve to confine the modes of interest within the active region of the CRF 100 and reduce energy losses in the CRF. Reducing such losses serves to increase the Q-factor of the modes ($Q_o$ and $Q_e$) of interest in the CRF 100, and improve insertion loss over the passband of the CRF.

Figure 1C:
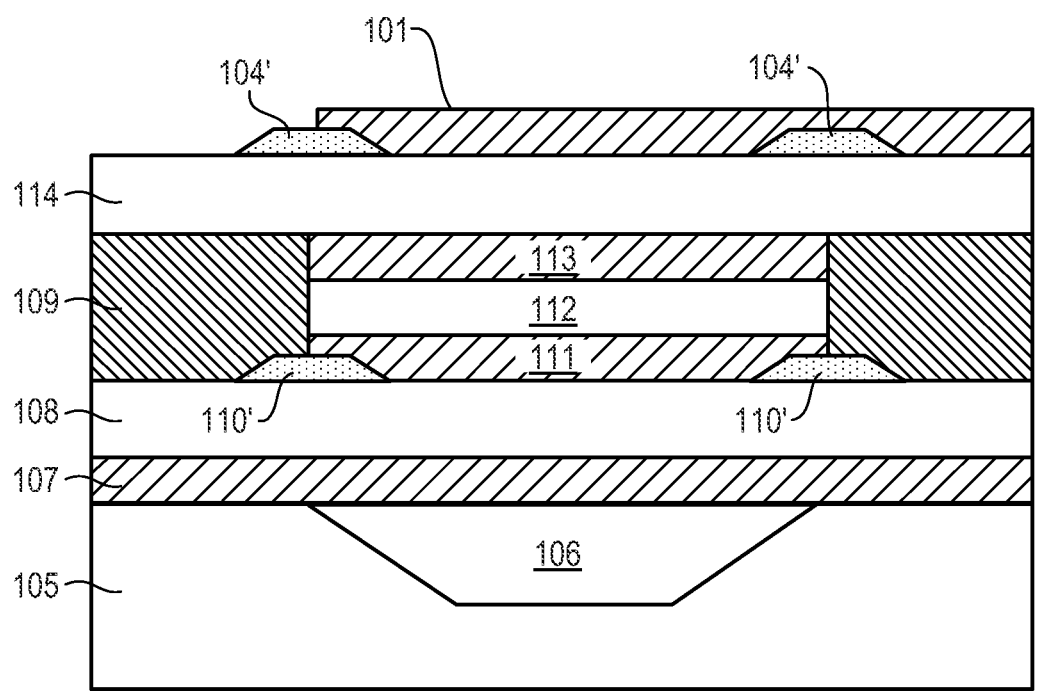
FIG. 1C is a cross-sectional view of a CRF in accordance with a representative embodiment.

In the representative embodiment shown and described in connection with FIGS. 1A, 1B, the first and second bridges 110, 104 were unfilled (i.e., contained air as the acoustic medium). FIG. 1C shows a cross-sectional view of CRF 100 in which both bridges are filled with a material to provide the acoustic impedance discontinuity to reduce losses. In certain embodiments, first bridge 110' and second bridge 104' are filled with NEBSG, CDO, silicon carbide (SiC) or other suitable dielectric material that will not release when the sacrificial material disposed in the cavity 106 is released. The first and second bridges 110', 104' are fabricated by forming the NEBSG or other fill material over the first piezoelectric layer 108 and over the second piezoelectric layer 114 by a known method, and forming respective layers of the CRF 100 thereover. When the cavity 106 is formed through the release of the sacrificial, the first bridge 110' and the second bridge 104' remain "filled" with the selected material.

Figure 1D:
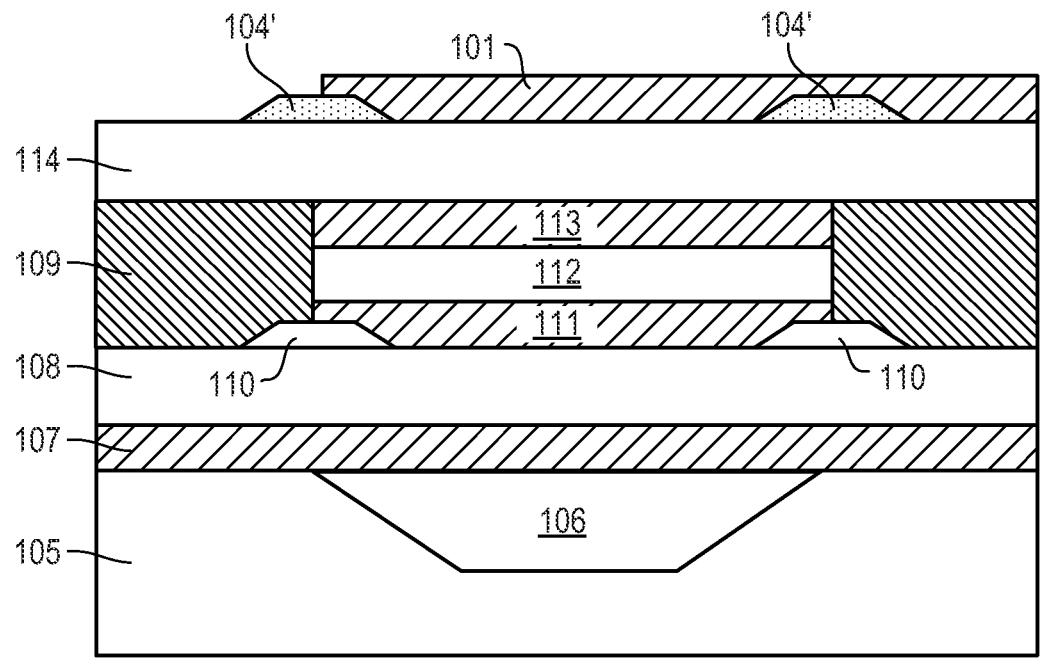
FIG. 1D is a cross-sectional view of a CRF in accordance with a representative embodiment.

FIG. 1D shows a cross-sectional view of CRF 100 in which the second bridge 104' is filled with a material to provide the acoustic impedance discontinuity to reduce losses, and the first bridge 110 is filled with air. This modification of the CRF 100 is fabricated by patterning a material (e.g., NEBSG) over the second piezoelectric layer 114 that will not release before forming the second upper electrode 101. The first bridge 110 is formed by patterning a sacrificial material over the first lower electrode 107, and releasing the sacrificial material as described above.

Figure 1E:
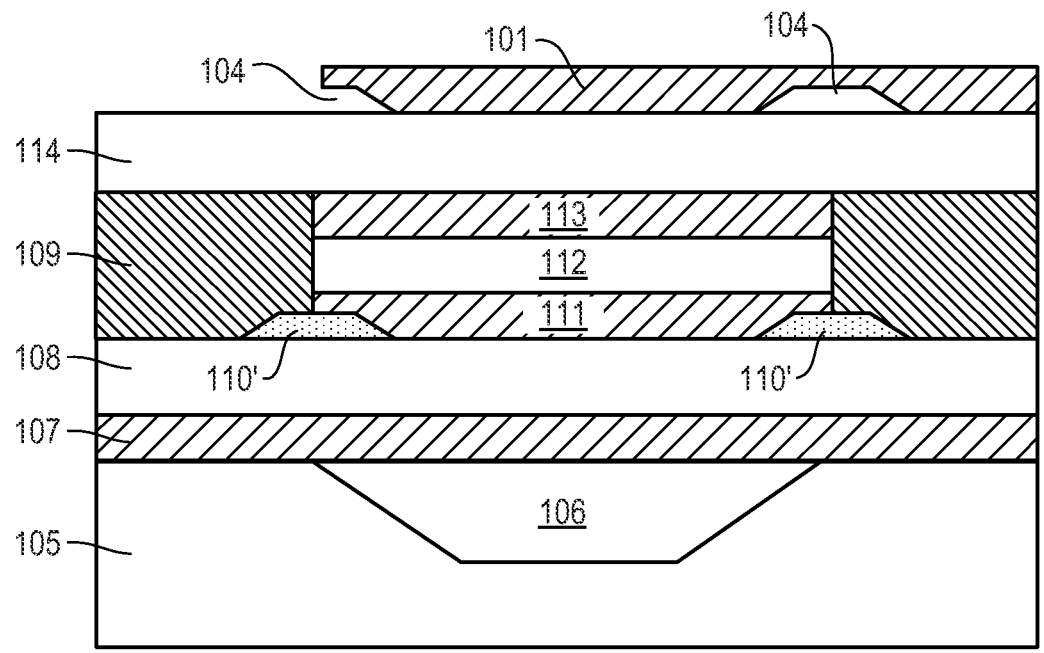
FIG. 1E is a cross-sectional view of a CRF in accordance with a representative embodiment.

FIG. 1E shows a cross-sectional view of CRF 100 in which the second bridge 104 is filled with air, and the first bridge 110' is filled with a material to provide the acoustic impedance discontinuity to reduce losses. This modification of the CRF 100 is fabricated by patterning a material (e.g., NEBSG) over the first piezoelectric layer 108 that will not release before forming the first upper electrode 111. The second bridge 104 is formed by patterning a sacrificial material over the second piezoelectric layer 114, and releasing the sacrificial material as described above.

Figure 1F:
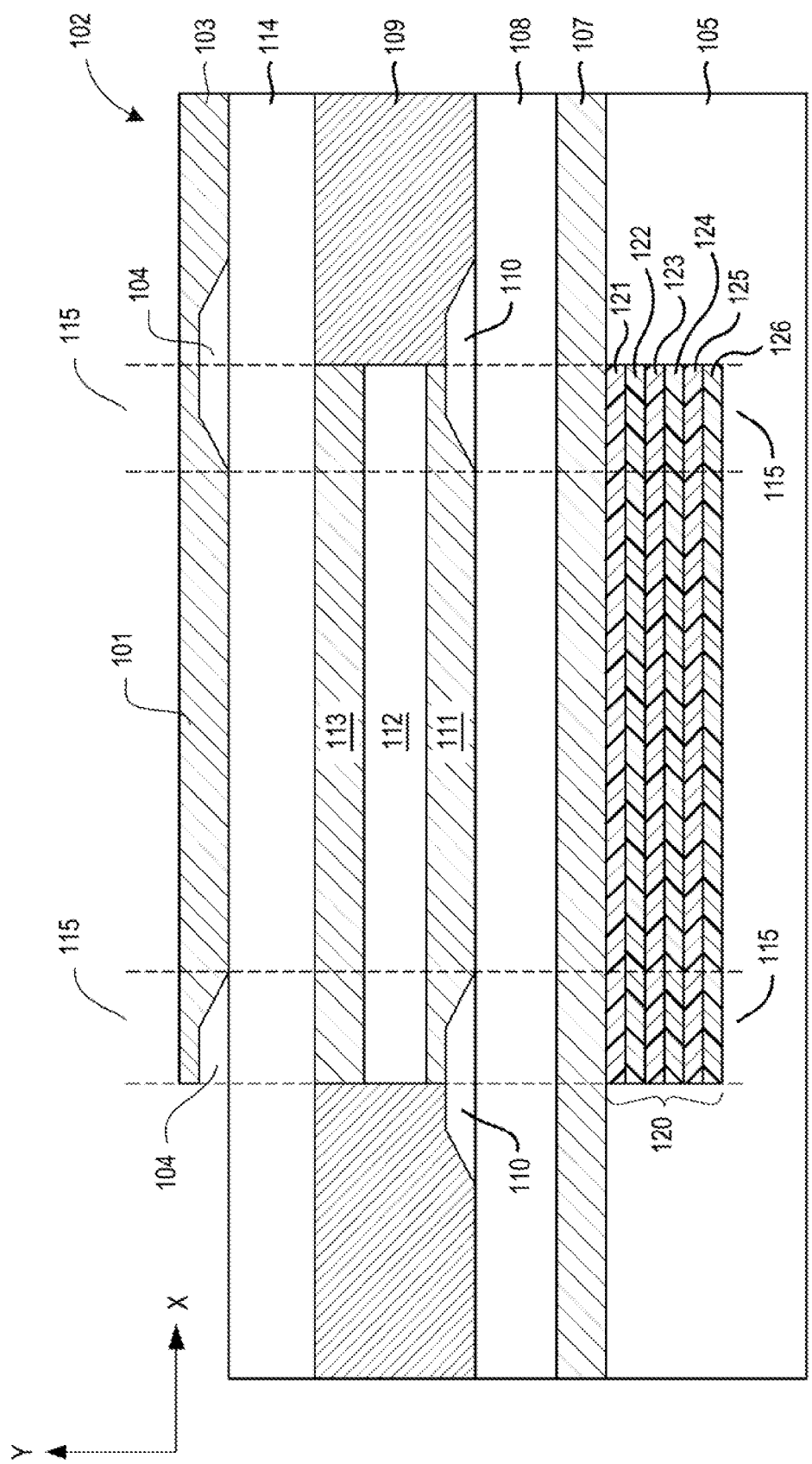
FIG. 1F is a cross-sectional view of a CRF in accordance with a representative embodiment.

FIG. 1F shows a cross-sectional view of the CRF 100 accordance with a representative embodiment. The CRF 100 comprises a plurality of layers disposed over a substrate 105 having an acoustic reflector 120. The acoustic reflector 120 is a so-called Bragg mirror, and comprises alternating layers 121-126 of low acoustic impedance material and high acoustic impedance materials, with the "odd" numbered layers being low acoustic impedance materials and the "even" numbered layers being high acoustic impedance materials.

A first lower electrode 107 is disposed over the substrate 105 and partially over the acoustic reflector 120 (or Bragg mirror). A first piezoelectric layer 108 is disposed over the first lower electrode 107. A planarization layer 109 is disposed over the first piezoelectric layer 108 and generally does not overlap the acoustic reflector 120. In a representative embodiment, the planarization layer 109 comprises non-etchable borosilicate glass (NEBSG). As should be appreciated by one of ordinary skill in the art, the structure provided by the first lower electrode 107, the first piezoelectric layer 108 and the first upper electrode 111 is a bulk acoustic wave (BAW) resonator, which in this illustrative embodiment comprises a first BAW resonator of the CRF 100. When the BAW resonator is disposed over a cavity, it is a so-called FBAR; and when the BAW resonator is disposed over an acoustic reflector (e.g., Bragg mirror) it is a so-called solidly mounted resonator (SMR). The present teachings contemplate the use of either FBARs or SMRs in filters (e.g., CRFs).

A first bridge 110 is provided at an interface of a first upper electrode 11 and the planarization layer 109, and is disposed about the perimeter of the CRF 100. In representative embodiments first and second bridges 110, 104 (and other bridges described in connection with representative embodiments below) have a trapezoidal cross-sectional shape. It is emphasized that the trapezoidal cross-sectional shape of the bridges of the representative embodiments is merely illustrative and the bridges are not limited to a trapezoidal cross-sectional shape. For example, the cross-sectional shape of the bridges of the representative embodiments could be square or rectangular, or of an irregular shape. The "slanting" walls of first and second bridges 110, 104 (and other bridges described in connection with representative embodiments below) is beneficial to the quality of layers (e.g., the quality of the crystalline piezoelectric layer(s)) grown over the first and second bridges 110, 104 (and other bridges described in connection with representative embodiments below). Notably, the first bridge 110 and the second bridge 104 (and other bridges described in connection with representative embodiments below) are not necessarily the same shape (e.g., one could have trapezoidal cross-sectional shape and one could have a rectangular cross-sectional in shape). Typical dimensions of the first and second bridges 110, 104 (and other bridges described in connection with representative embodiments below) are approximately 2.0 μm to approximately 10.0 μm in width (x-dimension in the coordinate system shown in FIG. 1F and approximately 300 A to approximately 1500 A in height (y-dimension in the coordinate system shown in FIG. 1F). In certain embodiments, first and second bridges 110, 104 (and other bridges described in connection with representative embodiments below) extend over the acoustic reflector 120 (depicted as overlap 115 in FIG. 1F). The overlap 115 has a width (x-dimension) of approximately 0.0 μm (i.e., no overlap with the acoustic reflector 120) to approximately 5.0 μm. Notably, the first bridge 110 and the second bridge 104 (and other bridges described in connection with representative embodiments below) do not need to be the same dimensions or located at the same relative position. For example, the overlap 115 of the first and second bridges 110 with acoustic reflector 120 is shown in FIG. 1F to be identical for all bridges 104, 110; but this is not essential as different bridges 104, 110 may overlap the acoustic reflector 120 to a greater or lesser extent than other bridges 104, 110.

Generally, first and second bridges 110, 104 (and other bridges described in connection with representative embodiments below) need to be wide enough to ensure suitable decay of evanescent waves at the boundary of a CRF region and a decoupling region (described below in connection with FIG. 2B) in order to minimize tunneling of modes into the field region (described below in connection with FIG. 2B) where propagating modes exist at the frequency of operation. On the other hand, if the bridge is too wide, reliability issues can arise and can also limit the placement of similar CRFs (not shown) from being placed in proximity (thus unnecessary increasing the total area of a chip). As such, the optimum width of the first and second bridges 110, 104 is determined experimentally.

In addition, the width and position of the first and second bridges 110, 104 (and other bridges described in connection with representative embodiments) and overlap 115 with the acoustic reflector 120 are selected to improve Q-enhancement of resonant mode. In general, the greater the overlap 115 of each bridge 104, 110 with the acoustic reflector 120 of the CRF 100, the greater the improvement $Q_o$ and $Q_e$ with the improvement realized being fairly small after an initial increase. The improvement in $Q_o$ and $Q_e$ must be weighed against a decrease in the electromechanical effective coupling coefficient $kt^2$, which decreases with increasing overlap 115 of the first and second bridges 110,104 with the acoustic reflector 120. Degradation of $kt^2$ results in a degradation of insertion loss ($S_{21}$). As such, the overlap 115 of the first and second bridges 110,104 with the acoustic reflector 120 is typically optimized experimentally.

The first and second bridges 110, 104 (and other bridges described in connection with representative embodiments below) have a height (y-dimension in the coordinate system of FIG. 1F) of approximately 300 A to approximately 1500 A. Notably, the lower limit of the height is determined by the limits of the process of releasing sacrificial material in the forming of the first and second bridges 110, 104 (and other bridges described in connection with representative embodiments below), and the upper limit of the height is determined by the quality of layers grown over the first and second bridges 110, 104 (and other bridges described in connection with representative embodiments) and by the quality of subsequent processing of possibly non-planar structures. An acoustic coupling layer 112 ("coupling layer 112") is provided over the first upper electrode 11. In a representative embodiment, the coupling layer 112 comprises carbon doped oxide (CDO), or NEBSG, or carbon-doped silicon oxide (SiOCH) such as described in the above-referenced commonly owned U.S. patent application Ser. No. 12/710,640, entitled "Bulk Acoustic Resonator Structures Comprising a Single Material Acoustic Coupling Layer Comprising Inhomogeneous Acoustic Property" to Elbrecht, et al. Notably, SiOCH films of the representative embodiment belong to a general class of comparatively low dielectric constant (low-k) dielectric materials often referred to as carbon-doped oxide (CDO). Alternatively, the coupling layer 112 may comprise other dielectric materials with suitable acoustic impedance and acoustic attenuation, including, but not limited to porous silicon oxynitride (SiON) porous boron doped silicate glass (BSG); or porous phosphosilicate glass (PSG). Generally, the material used for the coupling layer 112 is selected to provide comparatively low acoustic impedance and loss in order to provide desired pass-band characteristics.

A second lower electrode 113 is provided over the coupling layer 112, and a second piezoelectric layer 114 is provided over the second lower electrode 113. The second upper electrode 101 is provided over the second piezoelectric layer 114.

The second bridge 104 is disposed about the perimeter of the CRF 100. As should be appreciated by one of ordinary skill in the art, the structure provided by the second lower electrode 113, the second piezoelectric layer 114 and the second upper electrode 101 is a (BAW) resonator, which in this illustrative embodiment comprises a second BAW resonator of the CRF 100.

As should be appreciated by one of ordinary skill in the art, the structure provided by the second lower electrode 113, the second piezoelectric layer 114 and the second upper electrode 101 is an FBAR, which in this illustrative embodiment comprises the upper FBAR of the CRF 100.

The first and second bridges 110, 104 are formed by patterning a sacrificial material over the first piezoelectric layer 108 and the second piezoelectric layer 114, and forming the depicted layers thereover. After the layers of the CRF 100 are formed as desired, the sacrificial material is released leaving the first and second bridges 110, 104 "filled" with air. In a representative embodiment, the sacrificial material used to form the first and second bridges 110,104 is the same as the sacrificial material used to form the acoustic reflector 120 (e.g., PSG).

In a representative embodiment, the first bridge 110 and the second bridge 104 provide a perimeter around an active region of the CRF 100. The active region thus includes the portions of the first BAW resonator, the second BAW resonator, the coupling layer 112 disposed over the acoustic reflector 120, and bounded by the perimeter provided by the first bridge 110 and the second bridge 104. As should be appreciated by one of ordinary skill in the art, the active region of the CRF 100 is bordered around its perimeter by an acoustic impedance discontinuity created at least in part by the first and second bridges 110, 104, and above and below (acoustic reflector 120) by an acoustic impedance discontinuity. Thus, a resonant cavity is beneficially provided in the active region of the CRF 100. In certain embodiments, the first bridge 110 and the second bridge 104 are unfilled (i.e., contain air), as is the acoustic reflector 120. In other embodiments described more fully below, the first bridge 110, the second bridge 104, or both, are filled with a material to provide the desired acoustic impedance discontinuity.

It is noted that the first bridge 110, or the second bridge 104, or both, do not necessarily have to extend along all edges of the CRF 100, and therefore not along the entire perimeter of the CRF 100. For example, the first bridge 110 or the second bridge 104, or both, may be provided on four "sides" of the five-sided CRF 100 shown in FIG. 1A. In certain embodiments, the first bridge 110 is disposed along the same four sides of the CRF, for example, as the second bridge 104. In other embodiments, the first bridge 110 is disposed along four sides (e.g., all sides but the connection side 102) of the CRF 100 and the second bridge 104 is disposed along four sides of the CRF 100, but not the same four sides as the first bridge 110 (e.g., second bridge 104 is disposed along the connection side 102).

As described more fully below, the acoustic impedance mismatch provided by the first bridge 110 and the second bridge 104 causes reflection of acoustic waves at the boundary that may otherwise propagate out of the active region and be lost, resulting in energy loss. The first bridge 110 and the second bridge 104 serve to confine the modes of interest within the active region of the CRF 100 and reduce energy losses in the CRF. Reducing such losses serves to increase the Q-factor of the modes ($Q_o$ and $Q_e$) of interest in the CRF 100, and improve insertion loss over the passband of the CRF.

Figure 2A:
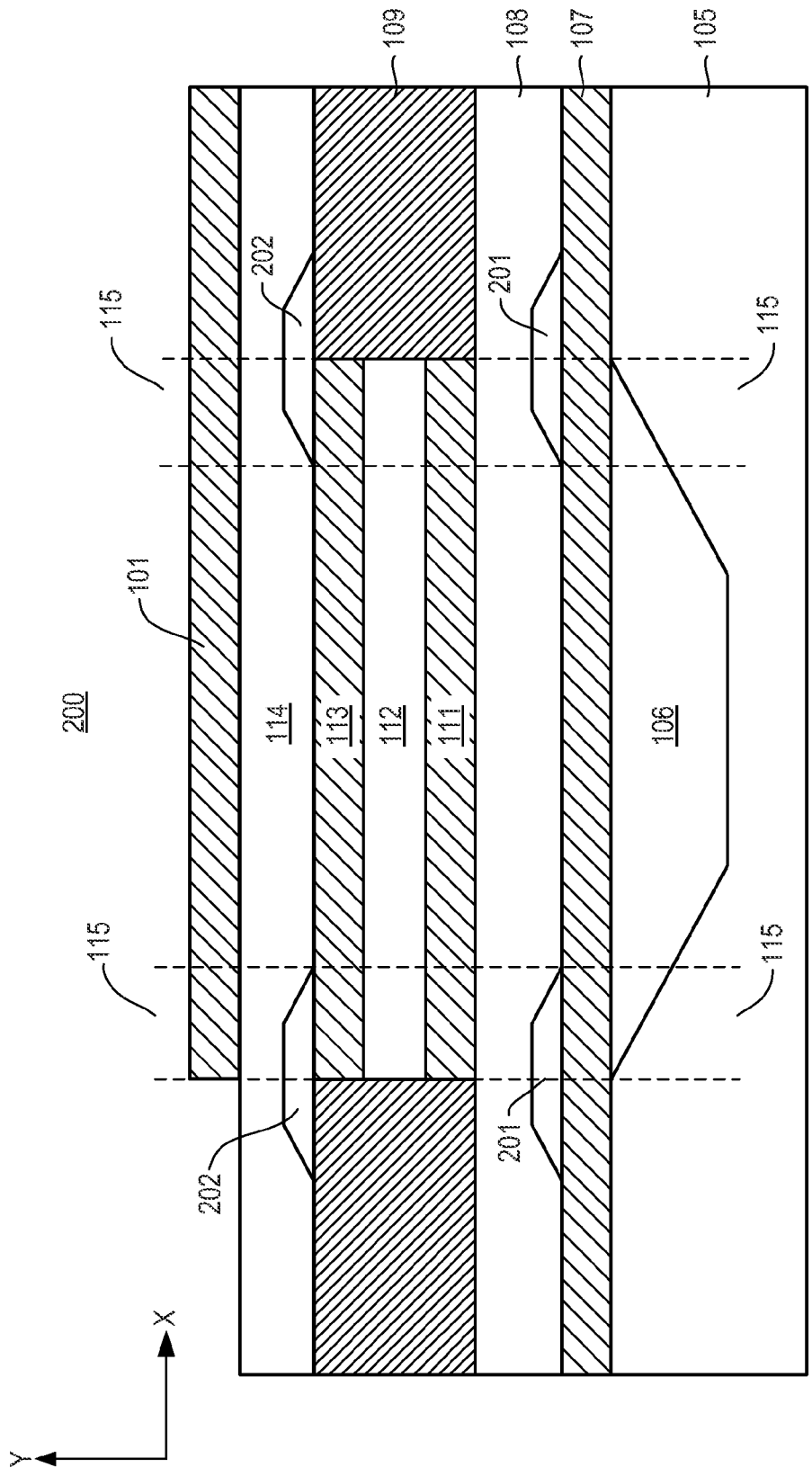
FIG. 2A is a cross-sectional view of a CRF in accordance with a representative embodiment.

FIG. 2A shows a cross-sectional view of the CRF 200 in accordance with a representative embodiment. The CRF 200 comprises a plurality of layers disposed over a substrate 105 having a cavity 106. The inclusion of a cavity 106 for reflection of acoustic waves in the CRF 100 is merely illustrative. It is emphasized that rather than cavity 106 a known Bragg mirror (not shown) comprising alternating layers of high and low acoustic impedance may be provided in the substrate 105 to provide acoustic isolation. Many aspects of the CRF 200 are common to those of CRF 100, and are not repeated in order to avoid obscuring the description of the representative embodiments presently described.

First lower electrode 107 is disposed over the substrate 105 and partially over the cavity 106 (or Bragg mirror). The first piezoelectric layer 108 is disposed over the first lower electrode 107. A planarization layer 109 is disposed over the first piezoelectric layer 108 and generally does not overlap the cavity 106. A first bridge 201 is provided in the first piezoelectric layer 108 and is disposed along the perimeter of the CRF 200 to delineate the active region of the CRF 200. The first bridge 201 is unfilled (i.e., filled with air).

Coupling layer 112 is provided over the first upper electrode 111, and beneath second lower electrode 113. A second bridge 202 is provided in the second piezoelectric layer 114 and is disposed along the perimeter of the CRF 200 to delineate the active region of the CRF 200. The second bridge 202 is unfilled (i.e., filled with air). Second upper electrode 101 is provided over the second piezoelectric layer 114. The overlap 115 of first and second bridges 201, 202 with cavity 106 are depicted as being substantially the same, although, as noted above, the overlap 115 of first and second bridges 201, 202 with cavity 106 may differ.

Figure 2B:
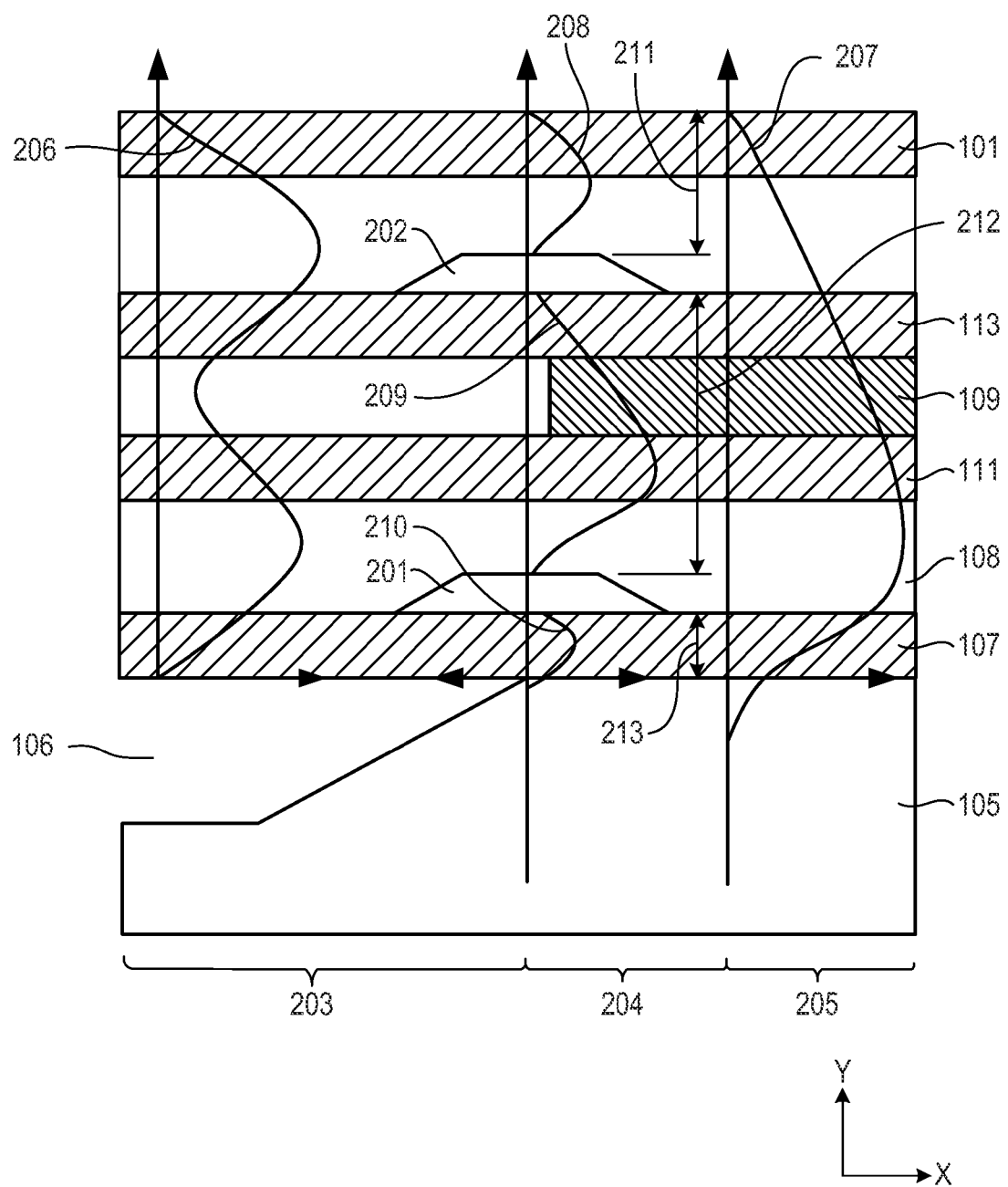
FIG. 2B is a cross-sectional view of a portion of the CRF shown in FIG. 2A.

FIG. 2B shows a partial cross-sectional view of the CRF 200 in accordance with a representative embodiment. Notably, approximately one-half of the CRF 200 depicted in FIG. 2A is shown. The CRF 200 comprises a CRF region 203, a decoupling region 204 and a field region 205. The CRF region 203 corresponds to the active region of the CRF 200 where electrical signals provided to the electrodes 101, 107, 111 and 113 are converted to acoustic signals in the CRF 200. As should be appreciated by one of ordinary skill in the art, the resonant cavity provided by the CRF 200 can support different modes and harmonics of these modes at different excitation frequencies. For purposes of illustration of the improved mode confinement provided by the first and second bridges 201, 202 of the CRF 200, only one mode, the modulus of stress distribution of an anti-symmetric mode 206, is depicted in the CRF region 203.

The modulus of stress distribution of a symmetric mode 207 is shown in the field region 205. The symmetric mode 207 represents one of the field plate modes. It is beneficial to reduce the coupling between anti-symmetric mode 206 and any of the filed plate modes, in this case illustrated by symmetric mode 207. Stated somewhat differently, by decoupling between anti-symmetric mode 206 in the CRF region 203 and the symmetric mode 207 in the field region 205, a greater degree of modal confinement will be realized in the CRF (active) region of the CRF 200. Greater modal confinement results in a reduction of acoustic energy loss, higher Q and reduced insertion loss.

The moduli of stress distributions of modes 208, 209, 210 are depicted in the decoupling region 204. Notably, there is no propagating mode excitation at either the first bridge 201, or the second bridge 202 due to the abrupt increase of the resonance frequencies of propagating modes at the first and second bridges 201, 202. First and second bridges 201, 202 "split" the layer structure into a few resonant cavities 211, 212, 213 bounded by the first and second bridges 201, 202, the cavity 106 and the ambient. In each of resonant cavities 211, 212, 213, the propagating modes 208~210 corresponding to the existing mode type in CRF region 203 (e.g., anti-symmetric mode 206) and field region 205 (symmetric mode 207) are at much higher frequencies, and only evanescent (in x-direction) versions of these modes exist at the operating frequency in the decoupling region 204, (i.e., exponentially decaying at the boundary of the CRF region 203 and the decoupling region 204). It can be shown that the amplitude of a mode in the field region ($A_f$) is proportional to the product of the amplitude of a mode in the CRF region ($A_{CRF}$) and a negative exponential function dependent on the width (x-direction in the coordinate axes shown) of the first and second bridges 201, 202. As such, increasing the width of the first and second bridges 201, 202 results in a decrease in the amplitude of the mode that exists in the field region, thus indicating better energy confinement of the mode in the CRF region.

Figure 2C:
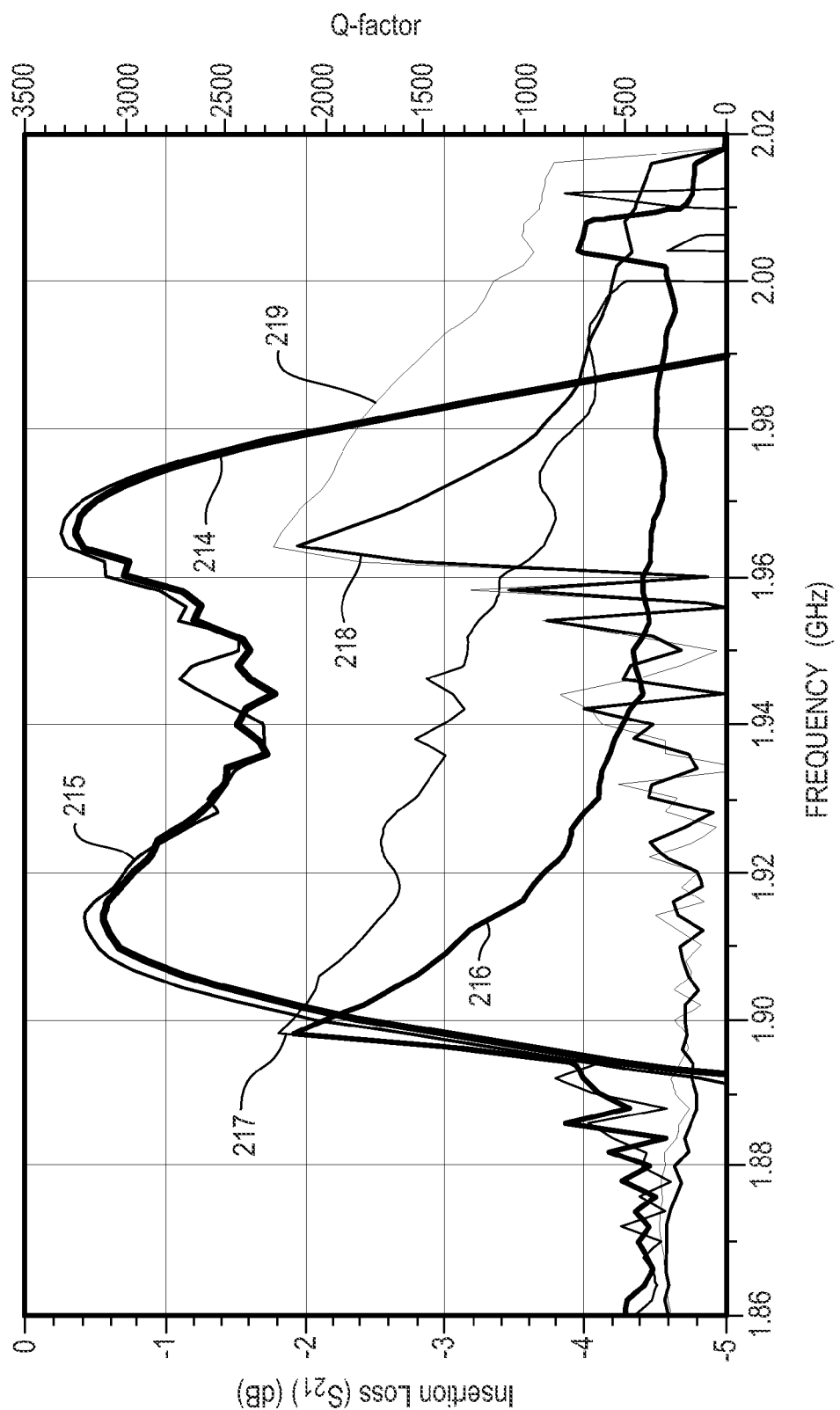
FIG. 2C is a graphical representation of the insertion loss ($S_{21}$ in dB) and the Q factors of odd and even modes ($Q_o$ and $Q_e$) of a known CRF and a CRF in accordance with a representative embodiment in accordance with a representative embodiment.

FIG. 2C shows a comparison of simulated insertion loss ($S_{21}$), the odd mode Q ($Q_o$) and the even mode Q ($Q_e$) of a known CRF with those of CRF 200 of a representative embodiment. For purposes of illustration of the improvement in mode confinement in the active region of the CRF 200, first bridge 201 having a width (x-dimension) of approximately 5.0 μm, a height of 2000 A, and overlapping the cavity 106 by 2.0 μm is provided. Curve 215 shows the insertion loss over the frequency range of approximately 1.89 GHz to approximately 1.99 GHz for the CRF 200. Curve 214 shows the insertion loss of a known CRF. Beneficially, over the frequency range depicted, the reduction in coupling of modes between the CRF region 203 and the field region 205 results in an increase in the insertion loss of at least 0.2 dB.

Curve 216 depicts $Q_o$ of a mode in a known CRF and curve 217 depicts $Q_o$ of a mode in CRF 200. Compared to the known CRF, an improvement of $Q_o$ up to three times (depending on frequency of operation, e.g. at 1.93 GHz) is realized due to the increased confinement of an odd mode in the CRF 200 by use of first and second bridges 201, 202 of the representative embodiment. Curve 218 depicts $Q_e$ of a mode in a known CRF and curve 219 depicts $Q_e$ of a mode in CRF 200. Compared to a known CRF, an improvement in $Q_e$ of up to three times (depending on frequency, e.g. at 1.99 GHz) is realized due to the increased confinement of an even mode in the CRF 200 by use of first and second bridges 201,202 of the representative embodiment.

Embodiments Comprising a Single Bridge

In the embodiments described presently, a single bridge is provided in an illustrative CRF. The single bridge is provided at a single layer in each embodiment, and is disposed about a perimeter that encloses the active area of the CRF. By placing the bridge under different layers, the various embodiments can be studied to test the degree of coupling of modes in the active (CRF) region and the modes in the field plate region. Generally, the bridge decouples modes with a comparatively large propagation constant ($k_r$) from the modes in the field plate region. As described below, certain embodiments comprise a "filled" bridge and certain embodiments comprise an "unfilled" bridge.

Figure 3A:
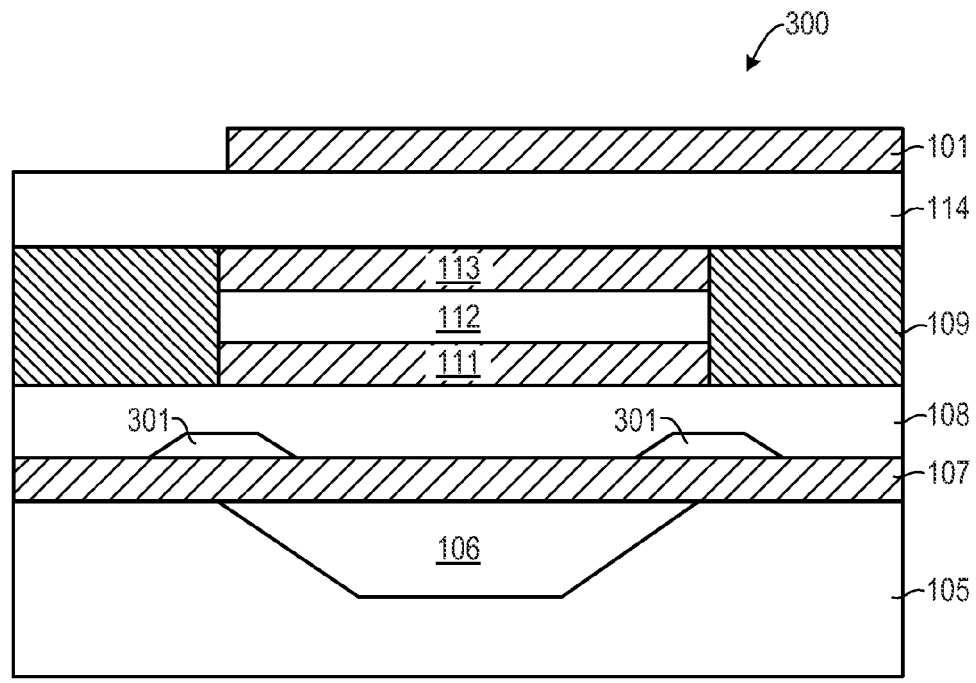
FIGS. 3A-3C are cross-sectional views of CRFs having bridges disposed in a single layer of the CRF in accordance with a representative embodiment.
Figure 3B:
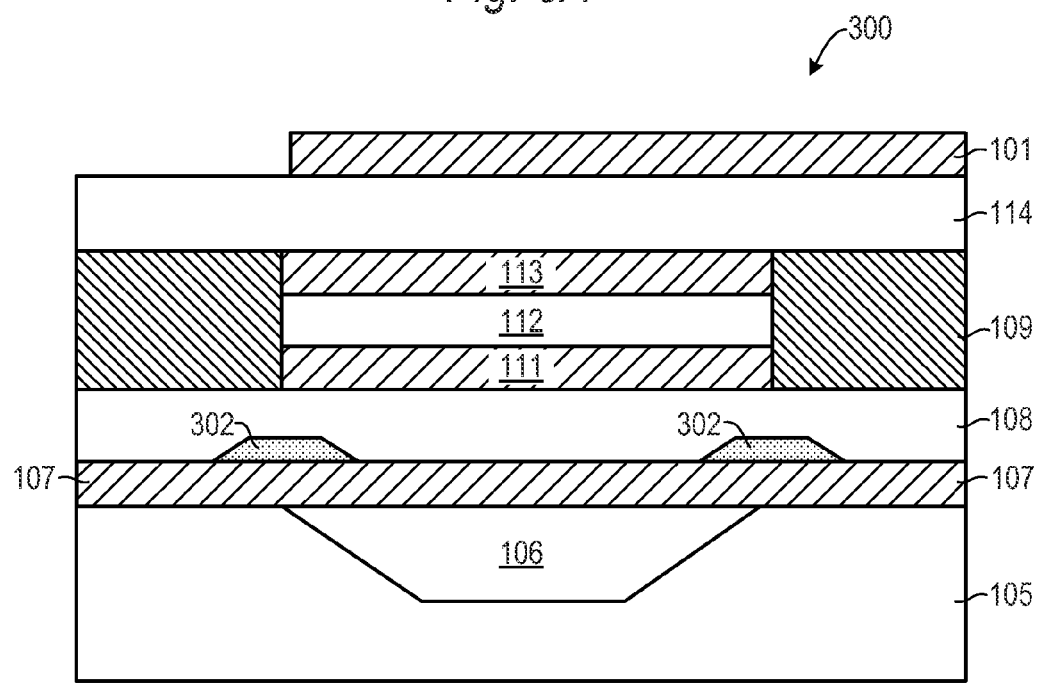

FIGS. 3A~3B show cross-sectional views of the CRF 300 in accordance with a representative embodiment. The CRF 300 comprises a plurality of layers disposed over a substrate 105 having a cavity 106. Many aspects of the CRF 300 are common to those of CRFs 100~200, and are not repeated in order to avoid obscuring the description of the representative embodiments presently described.

FIG. 3A shows a bridge 301 provided in the first piezoelectric layer 108. The bridge 301 is unfilled (i.e., filled with air). Bridge 301 is disposed around the perimeter of the active region of the CRF 300, and fosters confinement of modes in the active region of the CRF. For purposes of illustration of the improvement in mode confinement in the active region of the CRF 300, bridge 301 having a width (x-dimension) of approximately 5.0 μm, a height of 2000 A, and overlapping the cavity 106 by 2.0 μm predicts an increase in $Q_e$ of approximately 50% to approximately 100% above the series resonance frequency (Fs) compared to a CRF that does not include a bridge. $Q_o$ remains approximately the same as for CRF without the bridge. Incorporation of bridge 301 results in an improvement in a second peak of insertion loss ($S_{21}$) at approximately 1.97 GHz compared to a known CRF (without a bridge) of approximately 0.2 dB.

FIG. 3B shows a bridge 302 provided in the first piezoelectric layer 108. The bridge 302 is "filled" with a material (e.g., NEBSG or other material describe above) to provide an acoustic impedance discontinuity. Bridge 302 is disposed around the perimeter of the active region of the CRF 300, and fosters confinement of modes in the active region of the CRF. Similar improvements in $Q_e$ predicted for bridge 301 are expected with the use of bridge 302. Beneficially, the use of a filled bridge provides a more rugged structure.

Figure 3C:
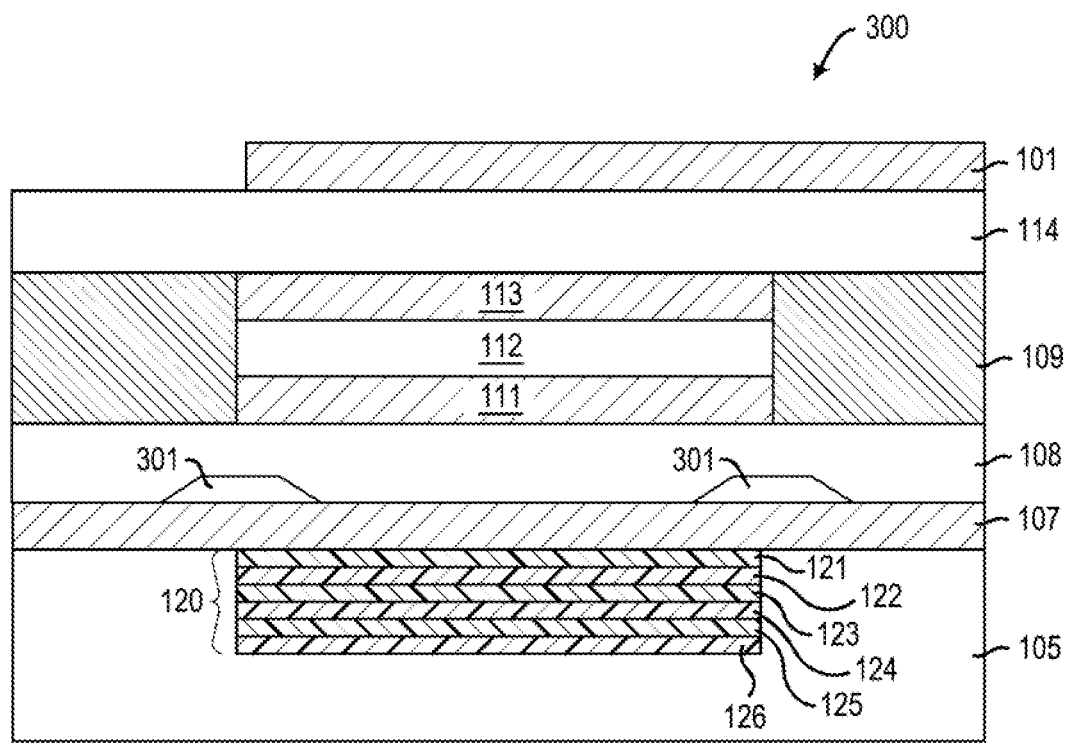

FIG. 3C shows bridge 301 provided in the first piezoelectric layer 108. The bridge 301 is unfilled (i.e., filled with air). Bridge 301 is disposed around the perimeter of the active region of the CRF 300, and fosters confinement of modes in the active region of the CRF. The CRF 300 comprises a plurality of layers disposed over a substrate 105 having an acoustic reflector 120. The acoustic reflector 120 is a so-called Bragg mirror, and comprises alternating layers 121-126 of low acoustic impedance material and high acoustic impedance materials, with the "odd" numbered layers being low acoustic impedance materials and the "even" numbered layers being high acoustic impedance materials.

Figure 4A:
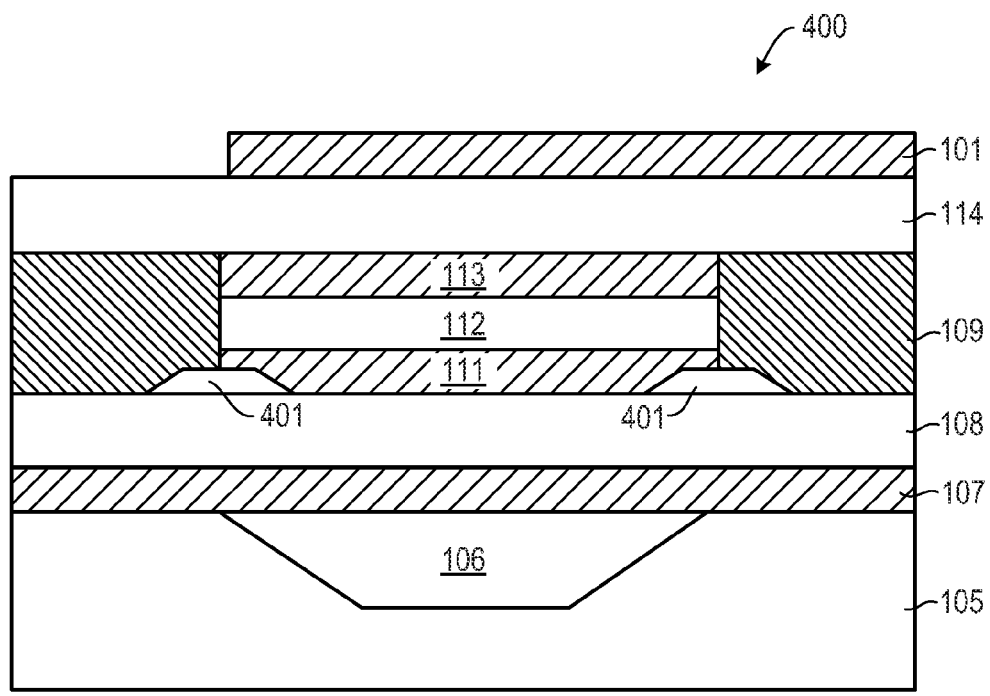
FIGS. 4A-4B are cross-sectional views of CRFs having bridges disposed in a single layer of the CRF in accordance with a representative embodiment.
Figure 4B:
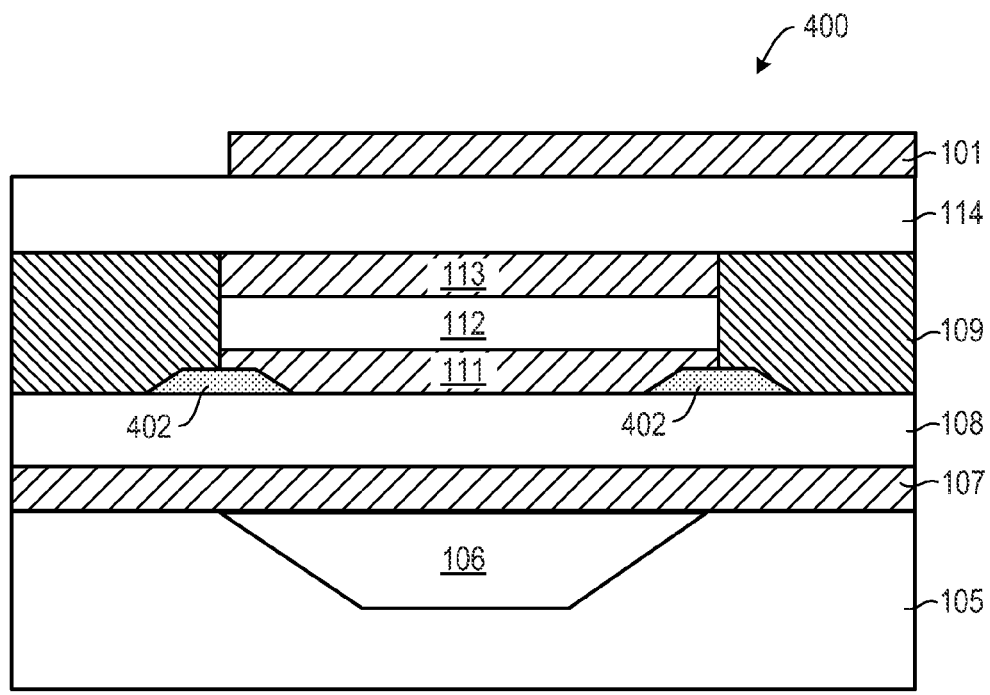

FIGS. 4A~4B show a cross-sectional view of the CRF 400 in accordance with a representative embodiment. The CRF 400 comprises a plurality of layers disposed over a substrate 105 having a cavity 106. Many aspects of the CRF 400 are common to those of CRFs 100~300, and are not repeated in order to avoid obscuring the description of the representative embodiments presently described.

FIG. 4A shows a bridge 401 provided in the first upper electrode 111 and into the planarization layer 109. The bridge 401 is unfilled (i.e., filled with air). Bridge 401 is disposed around the perimeter of the active region of the CRF 400, and fosters confinement of modes in the active region of the CRF. For purposes of illustration of the improvement in mode confinement in the active region of the CRF 400, bridge 401 having a width (x-dimension) of approximately 5.0 μm, a height of 2000 A, and overlapping the cavity 106 by 2.0 μm predicts an increase in $Q_e$ of approximately 75% above the series resonance frequency (Fs) compared to a CRF that does not include a bridge. $Q_o$ is approximately the same as for CRF without the bridge. Incorporation of bridge 401 results in an improvement in a second peak of insertion loss ($S_{21}$) at approximately 1.97 GHz compared to a known CRF (without a bridge) of approximately 0.1 dB.

FIG. 4B shows a bridge 402 provided in the first upper electrode 111. The bridge 402 is "filled" with a material (e.g., NEBSG or other material describe above) to provide an acoustic impedance discontinuity. Bridge 402 is disposed around the perimeter of the active region of the CRF 400, and fosters confinement of modes in the active region of the CRF. For bridge 402 having the same width, height and overlap of cavity 106 as bridge 401, similar improvements in $Q_c$ predicted for bridge 401 are expected with the use of bridge 402. Beneficially, the use of a filled bridge provides a more rugged structure.

Figure 5A:
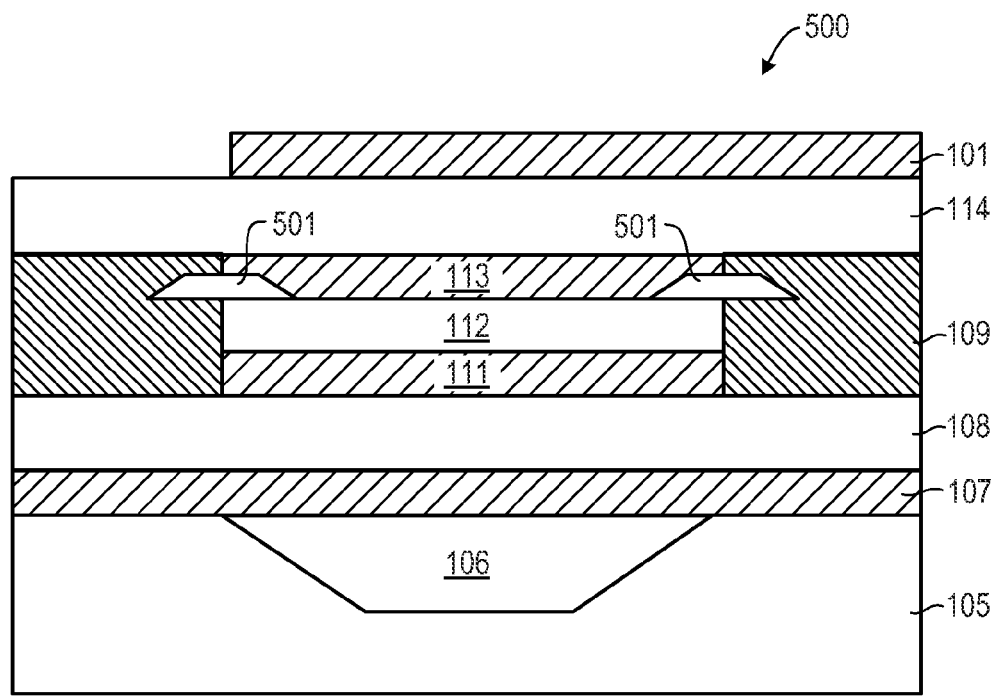
FIGS. 5A-5B are cross-sectional views of CRFs having bridges disposed in a single layer of the CRF in accordance with a representative embodiment.
Figure 5B:
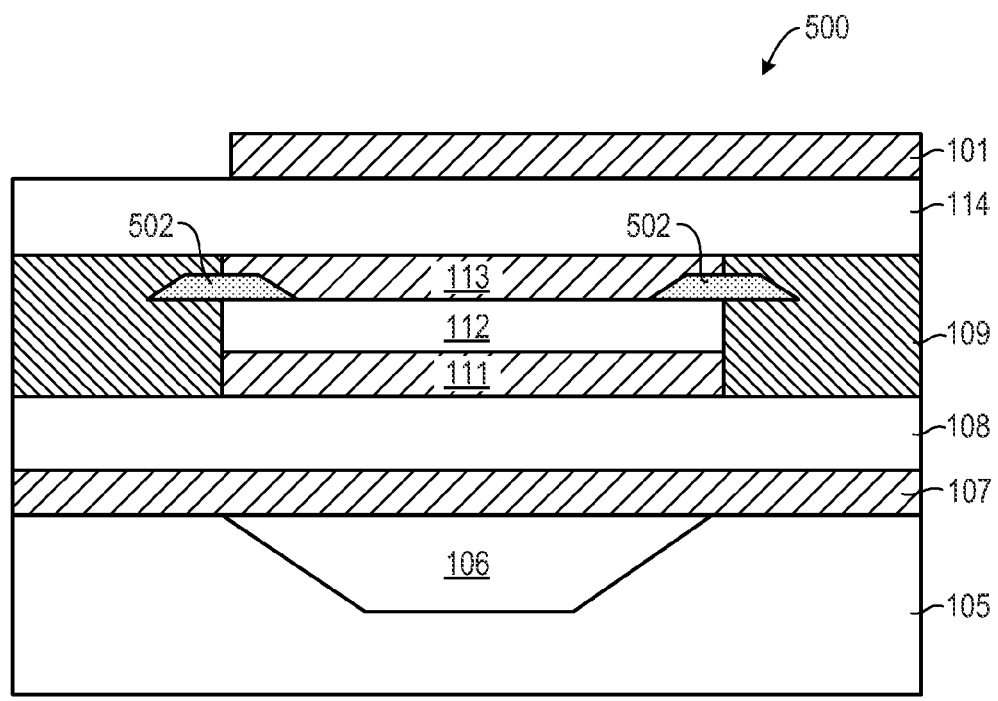

FIGS. 5A~5B show cross-sectional views of the CRF 500 in accordance with a representative embodiment. The CRF 500 comprises a plurality of layers disposed over a substrate 105 having a cavity 106. Many aspects of the CRF 400 are common to those of CRFs 100~400, and are not repeated in order to avoid obscuring the description of the representative embodiments presently described.

FIG. 5A shows a bridge 501 provided in the second lower electrode 113. The bridge 401 is unfilled (i.e., filled with air). Bridge 401 is disposed around the perimeter of the active region of the CRF 400, and fosters confinement of modes in the active region of the CRF. For purposes of illustration of the improvement in mode confinement in the active region of the CRF 500, bridge 501 having a width (x-dimension) of approximately 5.0 µm, a height of 2000 A, and overlapping the cavity 106 by 2.0 µm predicts an increase in $Q_e$ of approximately 100% below the series resonance frequency of the odd-mode (Fso) compared to a CRF that does not include a bridge. A slight degradation in $Q_o$ for CRF 500 is predicted compared to a known CRF without the bridge. Incorporation of bridge 501 results in an improvement in a first peak of insertion loss ($S_{21}$) at approximately 1.91 GHz compared to a known CRF (without a bridge) of approximately 0.1 dB, and a second peak of insertion loss at approximately 1.97 GHz is degraded by approximately 0.1 dB compared to the known CRF.

FIG. 5B shows a bridge 502 provided in the second lower electrode 113. The bridge 402 is "filled" with a material (e.g., NEBSG or other material describe above) to provide an acoustic impedance discontinuity. Bridge 402 is disposed around the perimeter of the active region of the CRF 400, and fosters confinement of modes in the active region of the CRF. For bridge 502 having the same width, height and overlap of cavity 106 as bridge 501, similar improvements in $Q_e$ predicted for bridge 501 are expected with the use of bridge 502. Beneficially, the use of a filled bridge provides a more rugged structure.

Figure 6A:
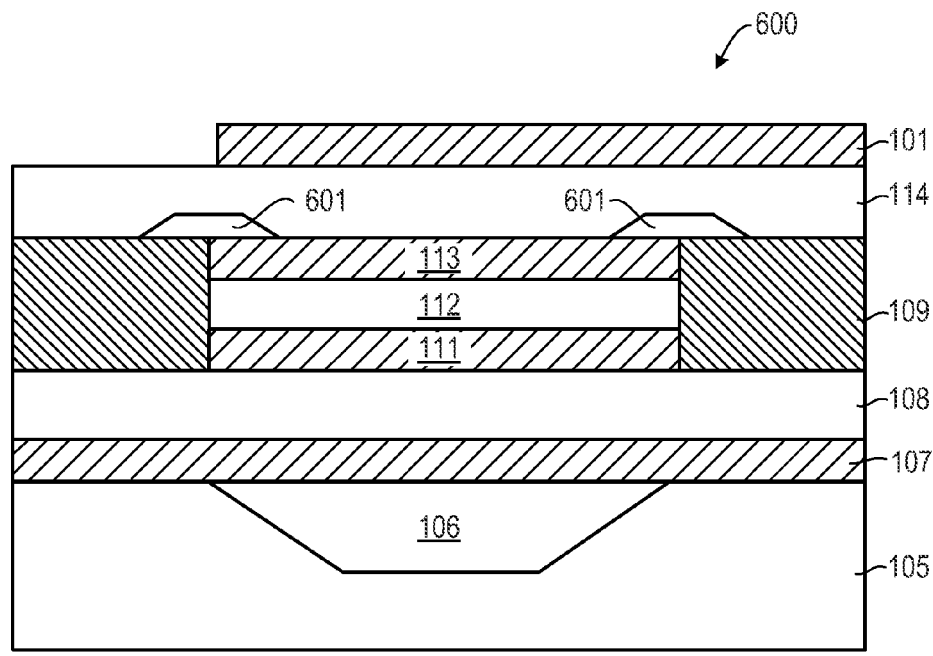
FIGS. 6A-6B are cross-sectional views of CRFs having bridges disposed in a single layer of the CRF in accordance with a representative embodiment.
Figure 6B:
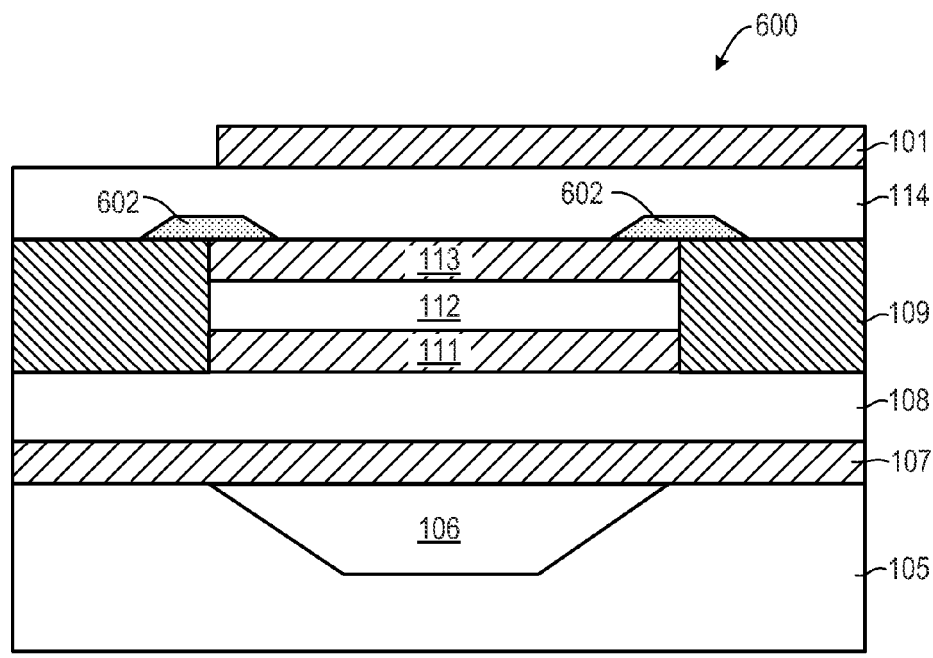

FIGS. 6A~6B show a cross-sectional views of the CRF 600 in accordance with a representative embodiment. The CRF 600 comprises a plurality of layers disposed over a substrate 105 having a cavity 106. Many aspects of the CRF 600 are common to those of CRFs 100~500, and are not repeated in order to avoid obscuring the description of the representative embodiments presently described.

FIG. 6A shows a bridge 601 provided in the second piezoelectric layer 114. The bridge 601 is unfilled (i.e., filled with air). Bridge 601 is disposed around the perimeter of the active region of the CRF 600, and fosters confinement of modes in the active region of the CRF. For purposes of illustration of the improvement in mode confinement in the active region of the CRF 600, bridge 601 having a width (x-dimension) of approximately 5.0 µm, a height of 2000 A, and overlapping the cavity 106 by 2.0 µm predicts an increase in Q, of approximately 30% above the series resonance frequency (Fs) compared to a CRF that does not include a bridge. A slight degradation in $Q_o$ for CRF 500 is predicted compared to a known CRF without the bridge. Incorporation of bridge 601 results in an improvement in a second peak of insertion loss ($S_{21}$) at approximately 1.97 GHz compared to a known CRF (without a bridge) of approximately 0.2 dB.

FIG. 6B shows a bridge 602 provided in the second piezoelectric layer 114. The bridge 602 is "filled" with a material (e.g., NEBSG or other material describe above) to provide an acoustic impedance discontinuity. Bridge 602 is disposed around the perimeter of the active region of the CRF 600, and fosters confinement of modes in the active region of the CRF. For bridge 602 having the same width, height and overlap of cavity 106 as bridge 601, similar improvements in $Q_e$ predicted for bridge 601 are expected with the use of bridge 602. Beneficially, the use of a filled bridge provides a more rugged structure.

Figure 7A:
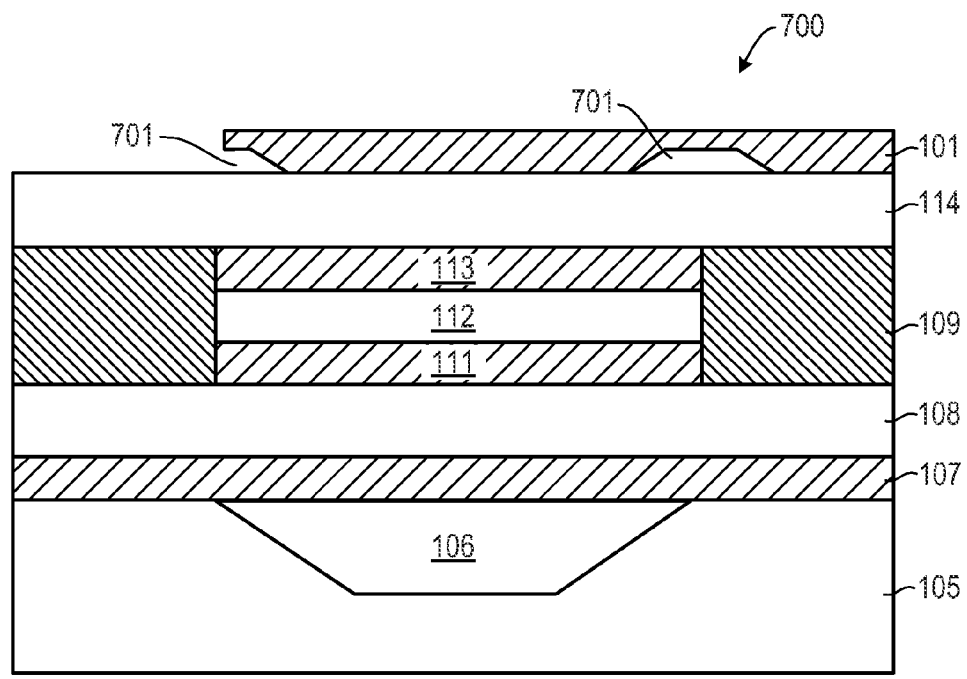
FIGS. 7A-7B are cross-sectional views of CRFs having bridges disposed in a single layer of the CRF in accordance with a representative embodiment.
Figure 7B:
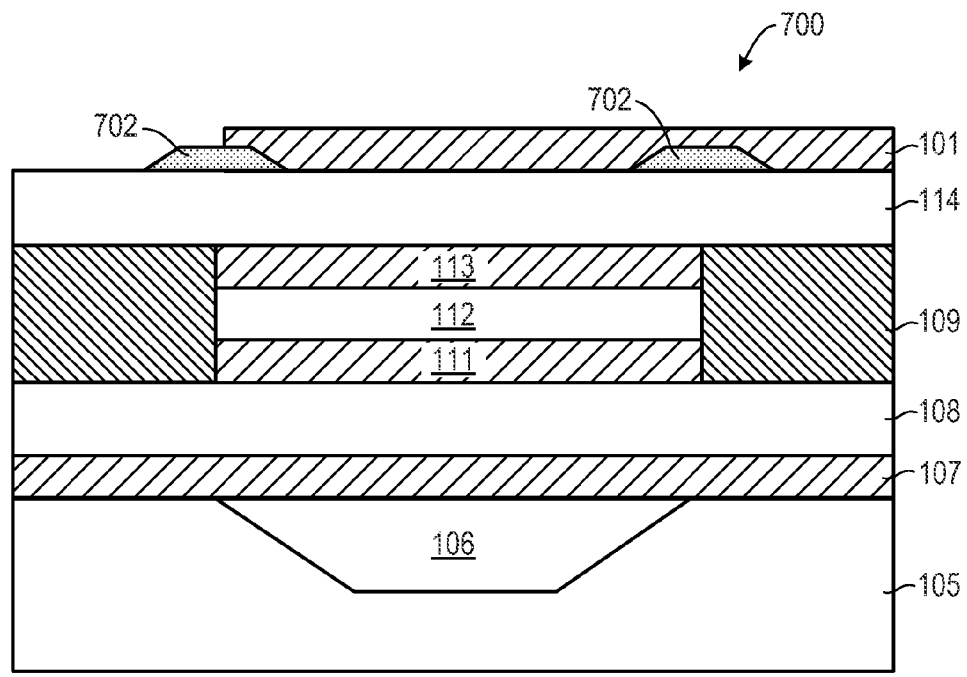

FIGS. 7A~7B show a cross-sectional view of the CRF 700 in accordance with a representative embodiment. The CRF 700 comprises a plurality of layers disposed over a substrate 105 having a cavity 106. Many aspects of the CRF 700 are common to those of CRFs 100~600, and are not repeated in order to avoid obscuring the description of the representative embodiments presently described.

FIG. 7A shows a bridge 701 provided in the second upper electrode 101. The bridge 701 is unfilled (i.e., filled with air). Bridge 701 is disposed around the perimeter of the active region of the CRF 700, and fosters confinement of modes in the active region of the CRF. For purposes of illustration of the improvement in mode confinement in the active region of the CRF 700, bridge 701 having a width (x-dimension) of approximately 5.0 µm, a height of 2000 A, and overlapping the cavity 106 by 2.0 µm predicts an increase in $Q_e$ of approximately 30% above the series resonance frequency (Fs) compared to a CRF that does not include a bridge. A slight degradation in $Q_o$ for CRF 500 is predicted compared to a known CRF without the bridge. Incorporation of bridge 701 results in a degradation in a first peak of insertion loss ($S_{21}$) at approximately 1.91 GHz compared to a known CRF (without a bridge) of approximately 0.1 dB, while a second peak of insertion loss at approximately 1.97 GHz is substantially the same as the known CRF (without a bridge).

FIG. 7B shows a bridge 702 provided in the second upper electrode 101. The bridge 702 is "filled" with a material (e.g., NEBSG or other material describe above) to provide an acoustic impedance discontinuity. Bridge 702 is disposed around the perimeter of the active region of the CRF 700, and fosters confinement of modes in the active region of the CRF. For bridge 702 having the same width, height and overlap of cavity 106 as bridge 701, similar improvements in $Q_e$ predicted for bridge 701 are expected with the use of bridge 702. Beneficially, the use of a filled bridge provides a more rugged structure.

Embodiments Comprising Two Bridges

In the embodiments described presently, two bridges are provided in an illustrative CRF. One bridge is provided in one layer of the CRF and a second bridge is provided in another layer in each embodiment. The bridges are generally concentric, although not circular in shape, and are disposed about a perimeter that encloses the active area of the CRF. By placing the bridges under different combinations of layers, the various embodiments can be studied to test the degree of coupling of modes in the active (CRF) region and the modes in the field plate region. Generally, the bridge decouples modes with a comparatively large propagation constant ($k_r$) from the modes in the field plate region. As described below, certain embodiments comprise a "filled" bridge and certain embodiments comprise an "unfilled" bridge.

FIGS. 8A~8D show a cross-sectional view of the CRF 800 in accordance with a representative embodiment. The CRF 800 comprises a plurality of layers disposed over a substrate 105 having a cavity 106. Many aspects of the CRF 800 are common to those of CRFs 100~700, and are not repeated in order to avoid obscuring the description of the representative embodiments presently described.

Figure 8A:
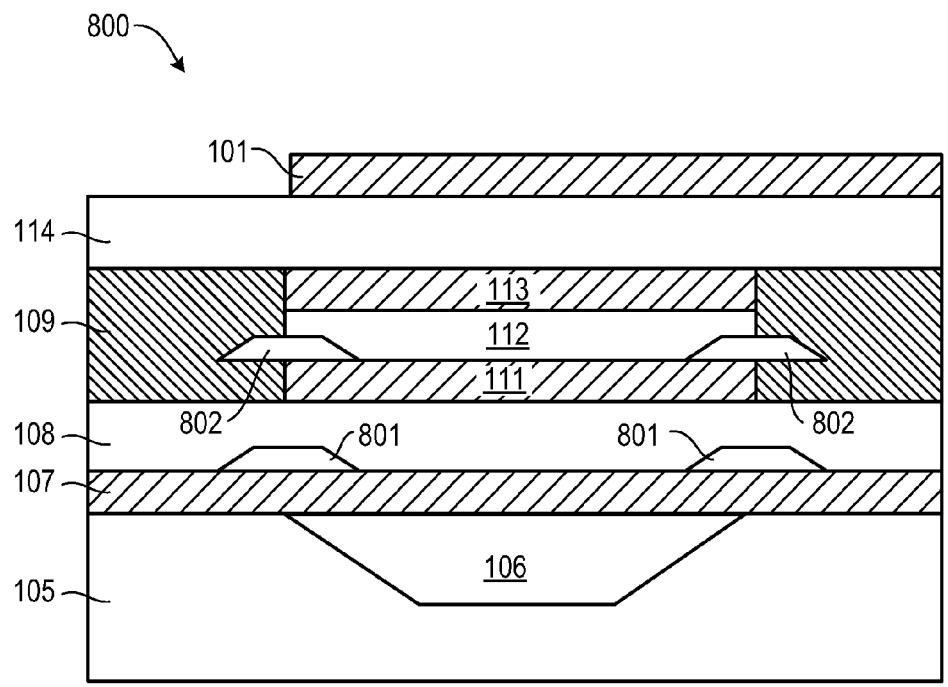
FIGS. 8A-8D are cross-sectional views of CRFs having bridges disposed in two layers of the CRF in accordance with a representative embodiment.

FIG. 8A shows a first bridge 801 provided in the first piezoelectric layer 108. The first bridge 801 is unfilled (i.e., filled with air). A second bridge 802 is provided in the coupling layer 112 and extends partially into the planarization layer 109. The second bridge 802 is unfilled (i.e., filled with air). First and second bridges 801, 802 are disposed around the perimeter of the active region of the CRF 800, and foster confinement of modes in the active region of the CRF 800. For purposes of illustration of the improvement in mode confinement in the active region of the CRF 800, first and second bridges 801, 802 each having a width (x-dimension) of approximately 5.0 µm, a height of 2000 A, and overlapping the cavity 106 by 2.0 µm are provided. Compared to a known CRF without bridges (depending on frequency of operation, e.g. at 1.93 GHz), an improvement of approximately 300% in $Q_o$ for the CRF 800 is expected due to the increased confinement of an odd mode in the CRF 800 by use of first and second bridges 801, 802 of the representative embodiment. Compared to a known CRF without bridges (depending on frequency of operation, e.g. at 1.98 GHz), an improvement of approximately 300% in $Q_e$ for the CRF 800 is expected due to the increased confinement of an even mode in the CRF 800 by use of first and second bridges 801, 802 of the representative embodiment. Incorporation of first and second bridges 801, 802 (depending on frequency of operation, e.g. at 1.93 GHz and 1.97 GHz) would result in an improvement of insertion loss ($S_{21}$) up to approximately 0.2 dB for the CRF 800 compared to a known CRF (without bridges), due to the increased confinement of odd and even mode in the CRF 800 by use of first and second bridges 801, 802 of the representative embodiment.

Figure 8B:
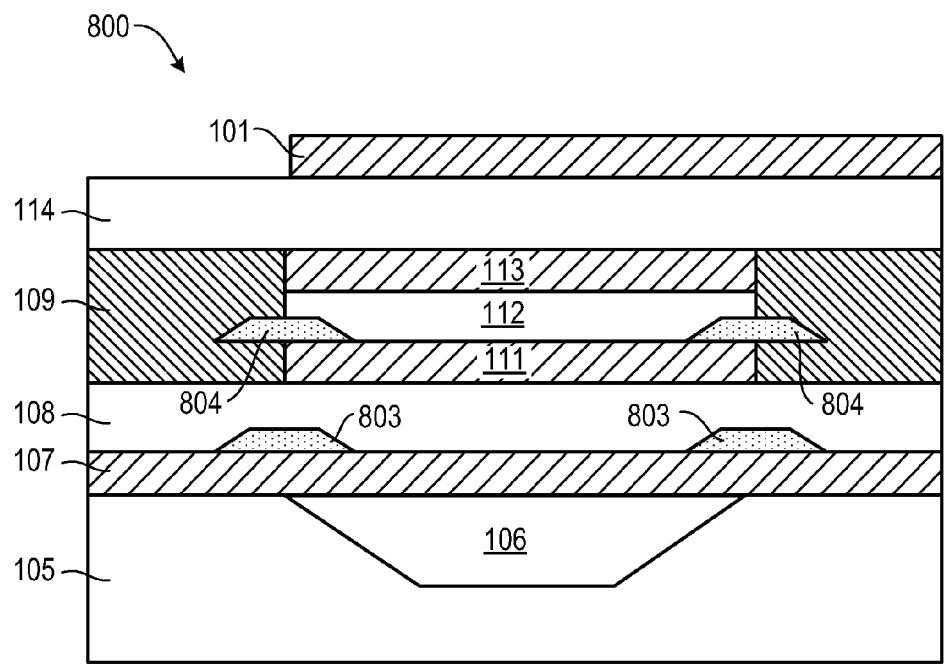

FIG. 8B shows a first bridge 803 provided in the first piezoelectric layer 108. The first bridge 803 is filled (e.g., filled with NEBSG). A second bridge 804 is provided coupling layer 112 and extends partially into the planarization layer 109. The second bridge 804 is also filled. First and second bridges 803, 804 are disposed around the perimeter of the active region of the CRF 800, and foster confinement of modes in the active region of the CRF 800. For first and second bridges 803, 804 having the same width, height and overlap of cavity 106 as first and second bridges 801, 802 similar improvements in $Q_o$, $Q_e$ and $S_{21}$ expected for first and second bridges 801, 802 are expected with the use of first and second bridges 801, 804. Beneficially, the use of filled bridges provides a more rugged structure.

Figure 8C:
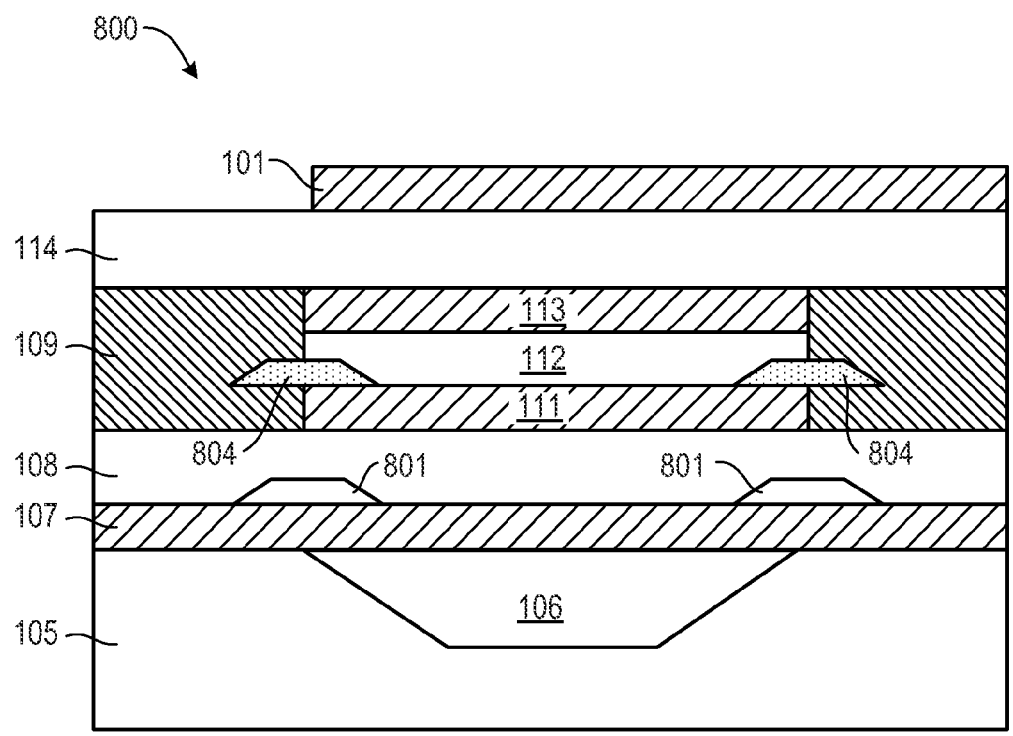

FIG. 8C shows a first bridge 801 provided in the first piezoelectric layer 108. The first bridge 801 is unfilled (i.e., filled with air). Second bridge 804 is provided in coupling layer 112 and extends partially into the planarization layer 109. The second bridge 804 is filled. First and second bridges 801, 804 are disposed around the perimeter of the active region of the CRF 800, and foster confinement of modes in the active region of the CRF 800. For first and second bridges 801, 804 having the same width, height and overlap of cavity 106 as first and second bridges 801, 802 similar improvements in $Q_o$, $Q_e$ and $S_{21}$ expected for first and second bridges 801, 802 are expected with the use of first and second bridges 801, 804. Beneficially, the use of a filled bridge provides a more rugged structure.

Figure 8D:
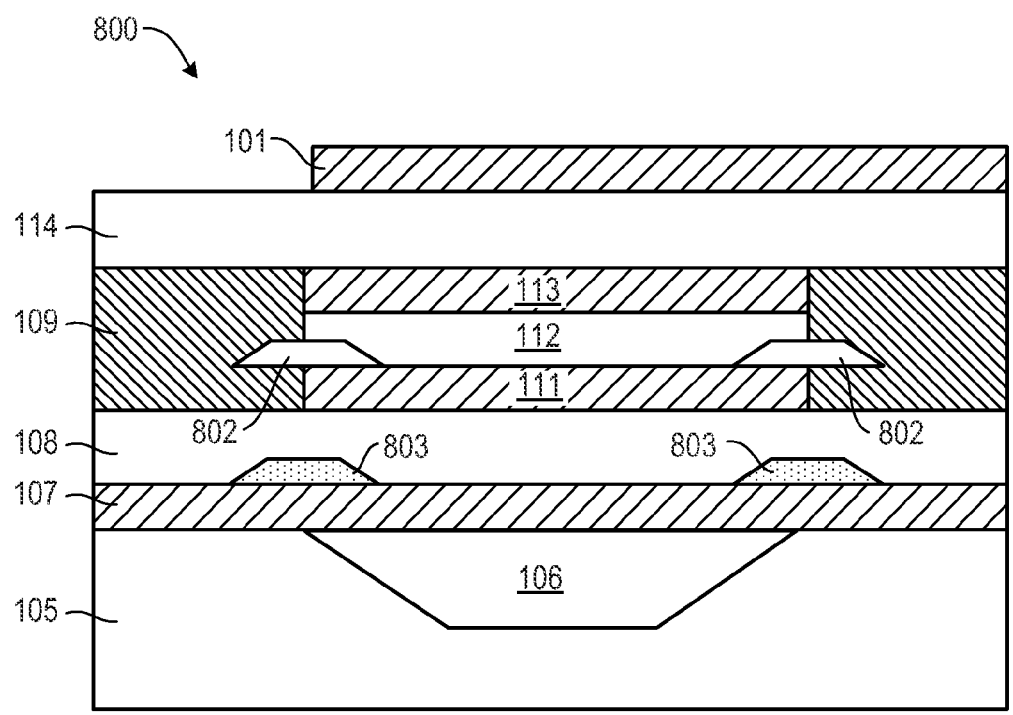

FIG. 8D shows a first bridge 803 provided in the first piezoelectric layer 108. The first bridge 803 is filled. A second bridge 802 is provided in coupling layer 112 and extends partially into the planarization layer 109. The second bridge 802 is unfilled (i.e., filled with air). First and second bridges 803, 802 are disposed around the perimeter of the active region of the CRF 800, and foster confinement of modes in the active region of the CRF 800. For first and second bridges 803, 802 having the same width, height and overlap of cavity 106 as first and second bridges 801, 802, similar improvements in $Q_o$, $Q_e$ and $S_{21}$ expected for first and second bridges 801, 802 are expected with the use of first and second bridges 803, 802. Beneficially, the use of a filled bridge provides a more rugged structure.

FIGS. 9A~9D show cross-sectional views of the CRF 900 in accordance with a representative embodiment. The CRF 900 comprises a plurality of layers disposed over a substrate 105 having a cavity 106. Many aspects of the CRF 900 are common to those of CRFs 100~800, and are not repeated in order to avoid obscuring the description of the representative embodiments presently described.

Figure 9A:
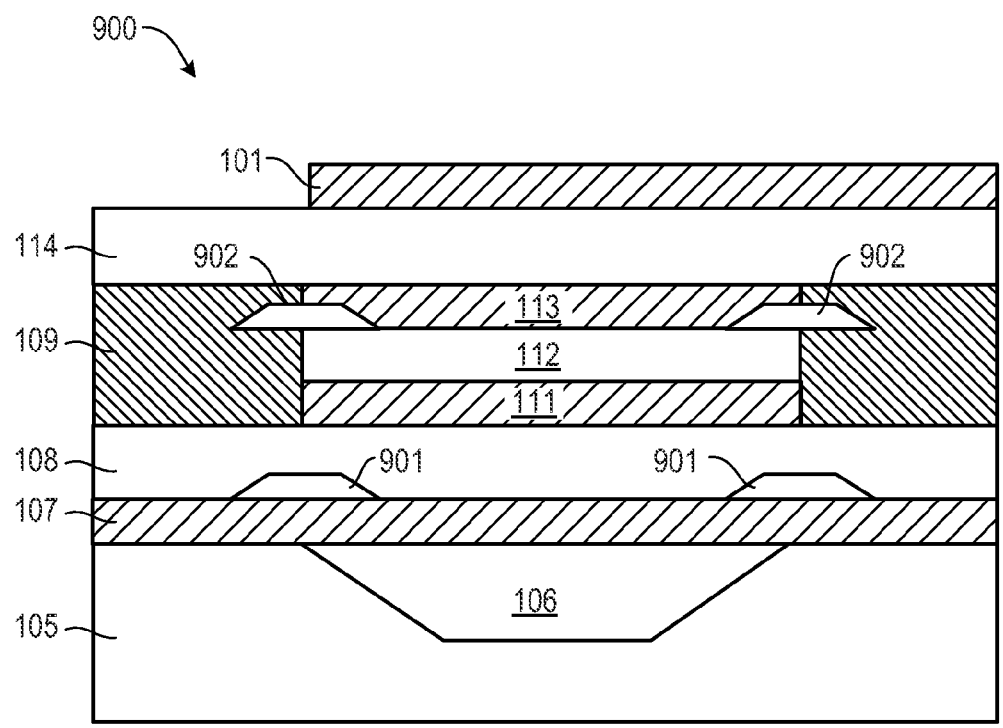
FIGS. 9A-9D are cross-sectional views of CRFs having bridges disposed in two layers of the CRF in accordance with a representative embodiment.

FIG. 9A shows a first bridge 901 provided in the first piezoelectric layer 108. The first bridge 901 is unfilled (i.e., filled with air). A second bridge 902 is provided in the second lower electrode 113 and extends partially into the planarization layer 109. The second bridge 902 is unfilled (i.e., filled with air). First and second bridges 901, 902 are disposed around the perimeter of the active region of the CRF 900, and foster confinement of modes in the active region of the CRF. For purposes of illustration of the improvement in mode confinement in the active region of the CRF 900, first and second bridges 901, 902 each having a width (x-dimension) of approximately 5.0 μm, a height of 2000 Å, and overlapping the cavity 106 by 2.0 μm are provided. Compared to a known CRF without bridges (depending on frequency of operation, e.g. at 1.93 GHz), an improvement of approximately 300% in $Q_o$ for the CRF 900 is expected due to the increased confinement of an odd mode in the CRF 900 by use of first and second bridges 901, 902 of the representative embodiment. Compared to a known CRF without bridges (depending on frequency of operation, e.g. at 1.98 GHz), an improvement of approximately 300% in $Q_e$ for the CRF 900 is expected due to the increased confinement of an even mode in the CRF 900 by use of first and second bridges 901, 902 of the representative embodiment. Incorporation of first and second bridges 901, 902 (depending on frequency of operation, e.g. at 1.93 GHz and 1.97 GHz) would result in an improvement of insertion loss ($S_{21}$) up to approximately 0.2 dB for the CRF 900 compared to a known CRF (without bridges), due to the increased confinement of odd and even mode in the CRF 800 by use of first and second bridges 901, 902 of the representative embodiment.

Figure 9B:
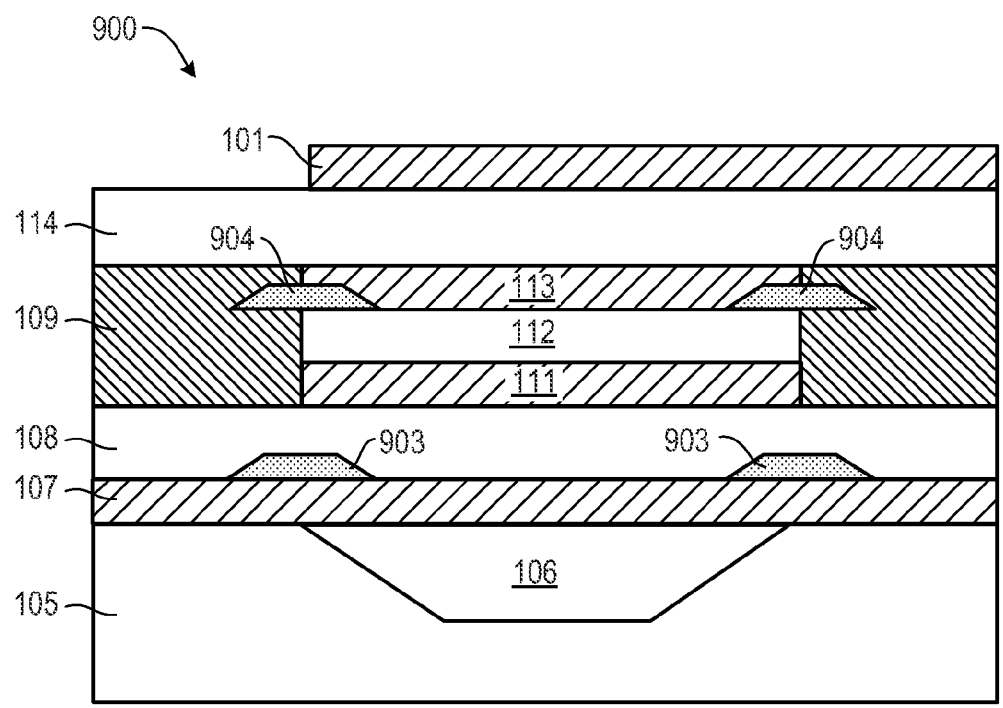

FIG. 9B shows a first bridge 903 provided in the first piezoelectric layer 108. The first bridge 903 is filled. A second bridge 904 is provided in the second lower electrode 113 and extends partially into the planarization layer 109. The second bridge 904 is filled. First and second bridges 903, 904 are disposed around the perimeter of the active region of the CRF 900, and foster confinement of modes in the active region of the CRF 900. For first and second bridges 903, 904 having the same width, height and overlap of cavity 106 as first and second bridges 901, 902, similar improvements in $Q_o$, $Q_e$ and $S_{21}$ expected for first and second bridges 901, 902 are expected with the use of first and second bridges 903, 904. Beneficially, the use of a filled bridge provides a more rugged structure.

Figure 9C:
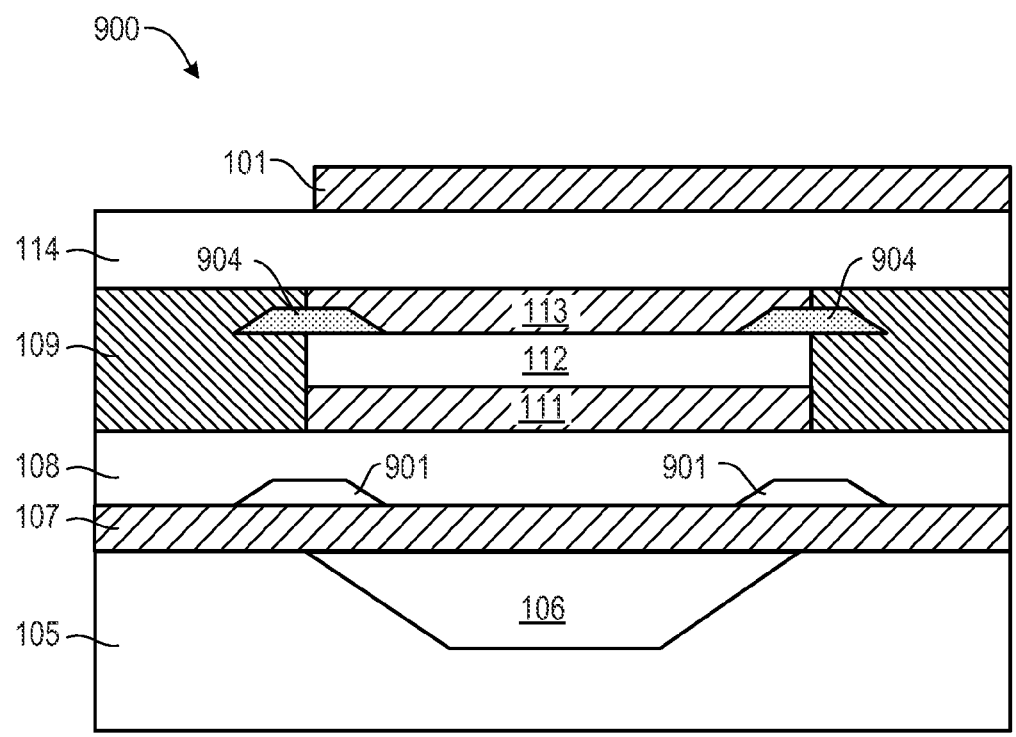

FIG. 9C shows first bridge 901 provided in the first piezoelectric layer 108. The first bridge 901 is unfilled (i.e., filled with air). Second bridge 904 is provided in the second lower electrode 113 and extends partially into the planarization layer 109. The second bridge 904 is filled. First and second bridges 901, 904 are disposed around the perimeter of the active region of the CRF 900, and foster confinement of modes in the active region of the CRF 900. For first and second bridges 901, 904 having the same width, height and overlap of cavity 106 as first and second bridges 901, 902, similar improvements in $Q_o$, $Q_e$ and $S_{21}$ expected for first and second bridges 901, 902 are expected with the use of first and second bridges 901, 904. Beneficially, the use of a filled bridge provides a more rugged structure.

Figure 9D:
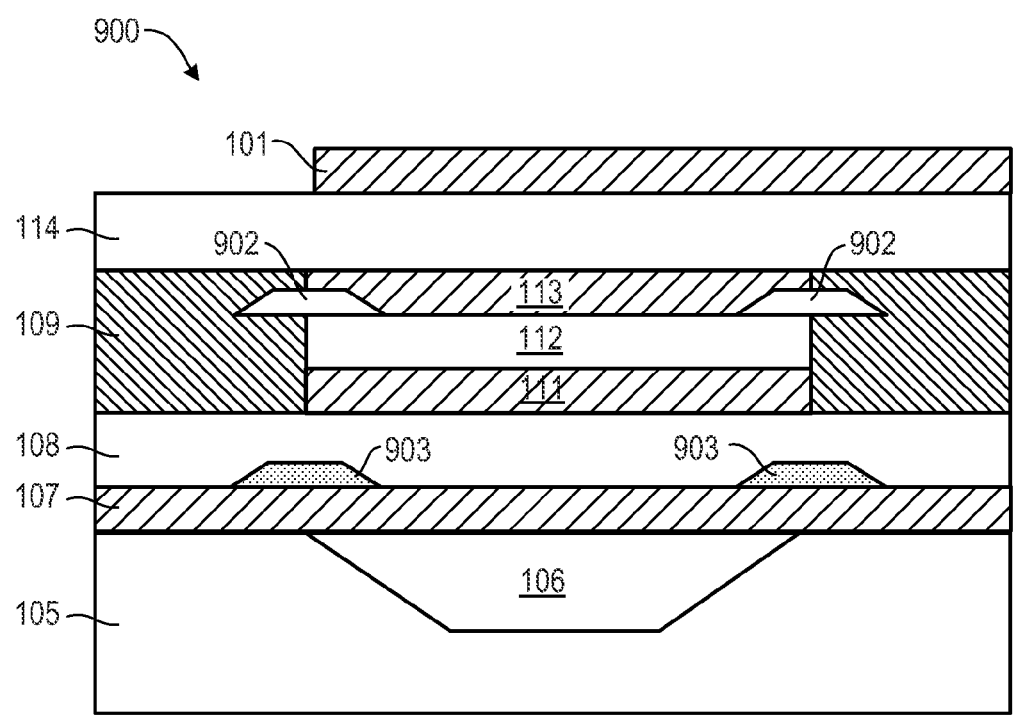

FIG. 9D shows first bridge 903 provided in the first piezoelectric layer 108. The first bridge 903 is filled. Second bridge 902 is provided in the second lower electrode 113 and extends partially into the planarization layer 109. The second bridge 902 is unfilled (i.e., filled with air). First and second bridges 903, 902 are disposed around the perimeter of the active region of the CRF 900, and foster confinement of modes in the active region of the CRF 900. For first and second bridges 903, 902 having the same width, height and overlap of cavity 106 as first and second bridges 901, 902, similar improvements in $Q_o$, $Q_e$ and $S_{21}$ expected for first and second bridges 901, 902 are expected with the use of first and second bridges 903, 902. Beneficially, the use of a filled bridge provides a more rugged structure.

Figure 10A:
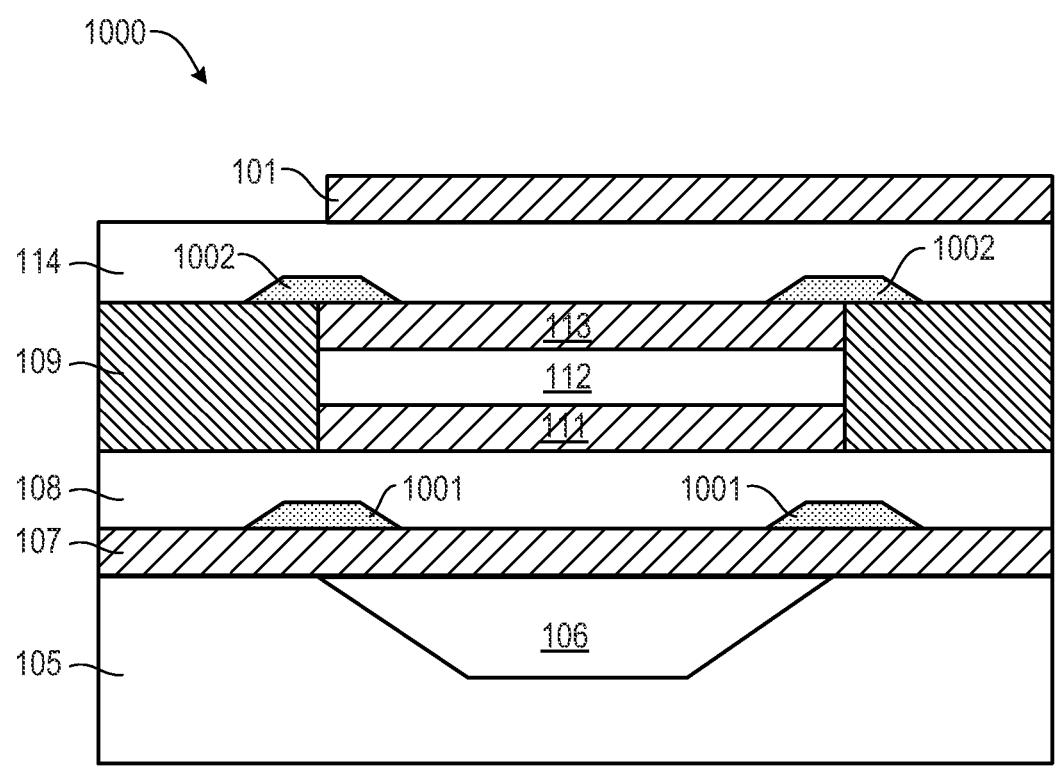
FIGS. 10A-10C are cross-sectional views of CRFs having bridges disposed in two layers of the CRF in accordance with a representative embodiment.
Figure 10B:
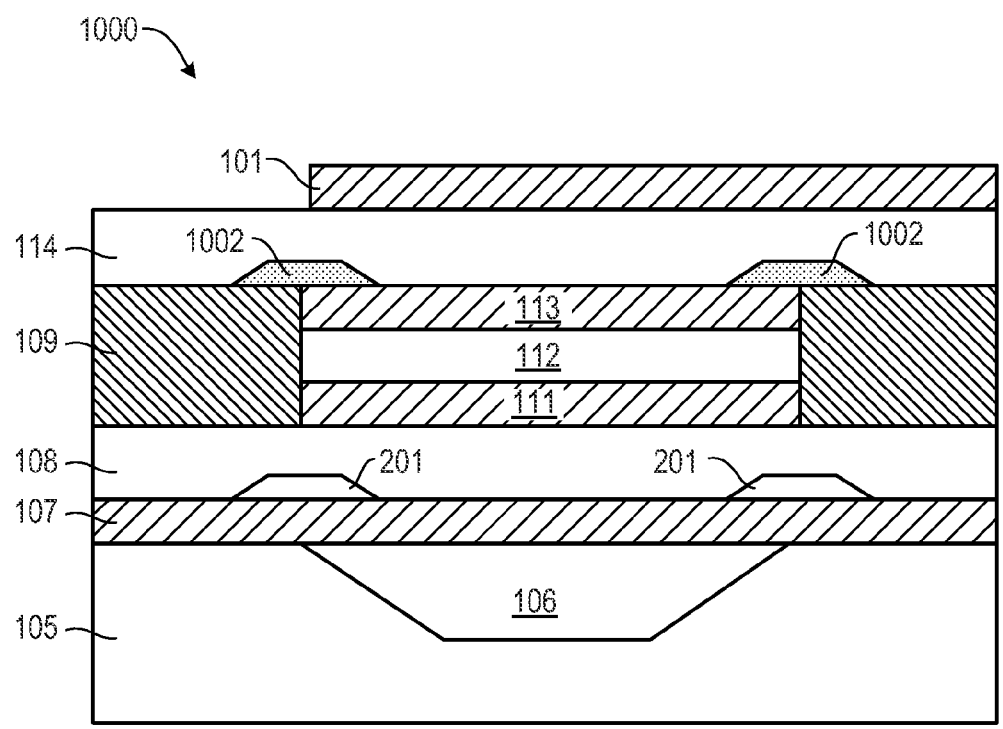
Figure 10C:
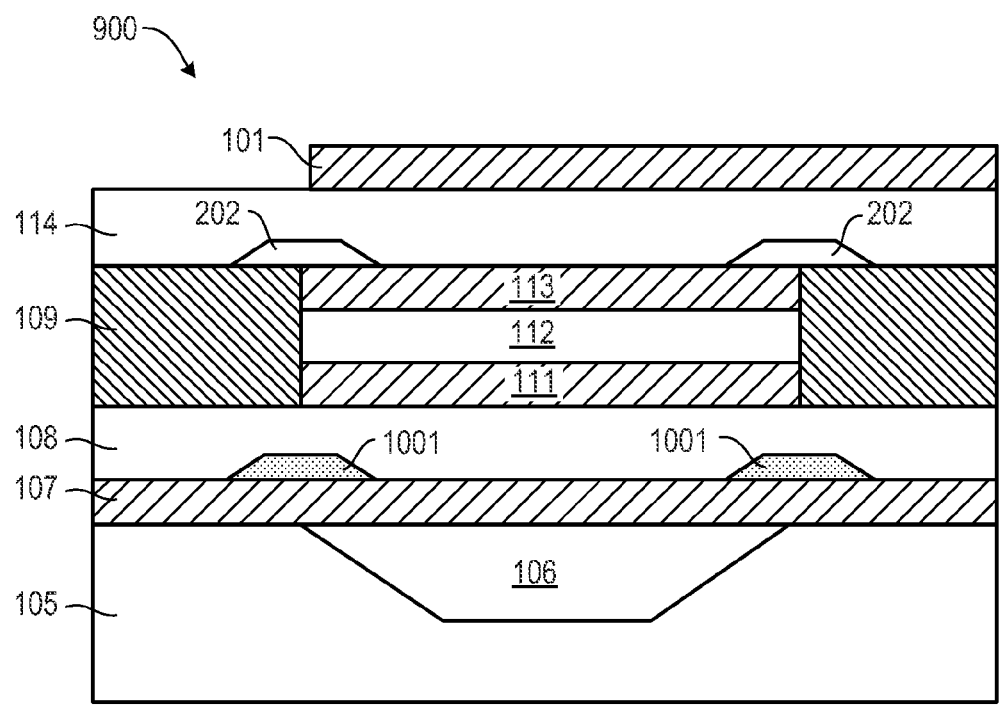

FIGS. 10A~10C show cross-sectional views of the CRF 1000 in accordance with a representative embodiment. The CRF 1000 comprises a plurality of layers disposed over a substrate 105 having a cavity 106. Many aspects of the CRF 1000 are common to those of CRFs 100~900, and are not repeated in order to avoid obscuring the description of the representative embodiments presently described. Notably, FIG. 2A depicts two unfilled first and second bridges 201, 202 disposed in the first piezoelectric layer 108 and the second piezoelectric layer 114, respectively.

FIG. 100A shows a first bridge 1001 provided in the first piezoelectric layer 108. The first bridge 1001 is filled. A second bridge 1002 is provided in the second piezoelectric layer 114. The second bridge 1002 is filled. First and second bridges 1001, 1002 are disposed around the perimeter of the active region of the CRF 1000, and foster confinement of modes in the active region of the CRF 1000. For purposes of illustration of the improvement in mode confinement in the active region of the CRF 1000, first and second bridges 1001, 1002 each having a width (x-dimension) of approximately 5.0 μm, a height of 2000 Å, and overlapping the cavity 106 by 2.0 μm are provided. Compared to a known CRF without bridges (depending on frequency of operation, e.g. at 1.93 GHz), an improvement of approximately 300% in $Q_o$ for the CRF 1000 is expected due to the increased confinement of an odd mode in the CRF 900 by use of first and second bridges 1001, 1002 of the representative embodiment. Compared to a known CRF without bridges (depending on frequency of operation, e.g. at 1.98 GHz), an improvement of approximately 300% in $Q_e$ for the CRF 1000 is expected due to the increased confinement of an even mode in the CRF 1000 by use of first and second bridges 1001, 1002 of the representative embodiment. Incorporation of first and second bridges 1001, 1002 (depending on frequency of operation, e.g. at 1.93 GHz and 1.97 GHz), would result in an improvement of insertion loss ($S_{21}$) up to approximately 0.2 dB for the CRF 1000 compared to a known CRF (without bridges), due to the increased confinement of odd and even mode in the CRF 1000 by use of first and second bridges 1001, 1002 of the representative embodiment.

FIG. 10B shows first bridge 1001 provided in the first piezoelectric layer 108. The first bridge 201 is unfilled (i.e., filled with air). Second bridge 1002 is provided in the second piezoelectric layer 114. The second bridge 1002 is filled. First and second bridges 201, 1002 are disposed around the perimeter of the active region of the CRF 1000, and foster confinement of modes in the active region of the CRF 1000. For first and second bridges 201, 1002 having the same width, height and overlap of cavity 106 as first and second bridges 1001, 1002, similar improvements in $Q_o$, $Q_e$ and $S_{21}$ expected for first and second bridges 1001, 1002 are predicted with the use of first and second bridges 201, 1002. Beneficially, the use of a filled bridge provides a more rugged structure.

FIG. 10C shows first bridge 1001 provided in the first piezoelectric layer 108. The first bridge 1001 is filled. Second bridge 202 is provided in the second piezoelectric layer 114. The second bridge 202 is unfilled. First and second bridges 1001, 202 are disposed around the perimeter of the active region of the CRF 1000, and foster confinement of modes in the active region of the CRF. For first and second bridges 1001, 202 having the same width, height and overlap of cavity 106 as first and second bridges 1001, 1002, similar improvements in $Q_o$, $Q_e$ and $S_{21}$ expected for first and second bridges 1001, 1002 are expected with the use of first and second bridges 1001, 202. Beneficially, the use of a filled bridge provides a more rugged structure.

FIGS. 11A~11D show cross-sectional views of the CRF 1100 in accordance with a representative embodiment. The CRF 1100 comprises a plurality of layers disposed over a substrate 105 having a cavity 106. Many aspects of the CRF 1100 are common to those of CRFs 100~1000, and are not repeated in order to avoid obscuring the description of the representative embodiments presently described.

Figure 11A:
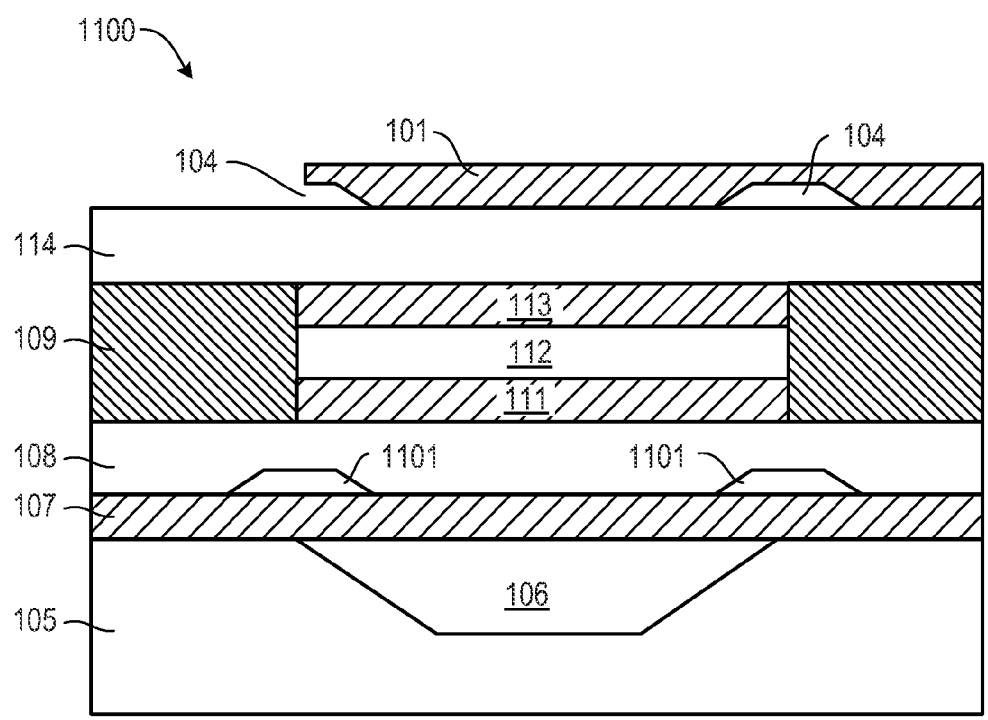
FIGS. 11A-11D are cross-sectional views of CRFs having bridges disposed in two layers of the CRF in accordance with a representative embodiment.

FIG. 11A shows a first bridge 1101 provided in the first piezoelectric layer 108. The first bridge 1101 is unfilled (i.e., filled with air). A second bridge 104 is provided in the second upper electrode 101 and extends partially into the planarization layer 109. The second bridge 902 is unfilled (i.e., filled with air). First and second bridges 1101, 104 are disposed around the perimeter of the active region of the CRF 1100, and foster confinement of modes in the active region of the CRF. For purposes of illustration of the improvement in mode confinement in the active region of the CRF 1100, first and second bridges 1101, 104 each having a width (x-dimension) of approximately 5.0 μm, a height of 2000 Å, and overlapping the cavity 106 by 2.0 μm are provided. Compared to a known CRF without bridges (depending on frequency of operation, e.g. at 1.93 GHz), an improvement of approximately 300% in $Q_o$ for the CRF 1100 is expected due to the increased confinement of an odd mode in the CRF 1100 by use of first and second bridges 1101, 104 of the representative embodiment. Compared to a known CRF without bridges (depending on frequency of operation, e.g. at 1.98 GHz), an improvement of approximately 300% in $Q_e$ for the CRF 1100 is expected due to the increased confinement of an even mode in the CRF 1100 by use of first and second bridges 1101, 104 of the representative embodiment. Incorporation of first and second bridges 1101, 104 (depending on frequency of operation, e.g. at 1.93 GHz and 1.97 GHz) would result in an improvement of insertion loss ($S_2$) up to approximately 0.2 dB in insertion loss ($S_{21}$) for the CRF 1100 compared to a known CRF (without bridges), due to the increased confinement of odd and even mode in the CRF 1100 by use of first and second bridges 1101, 104 of the representative embodiment.

Figure 11B:
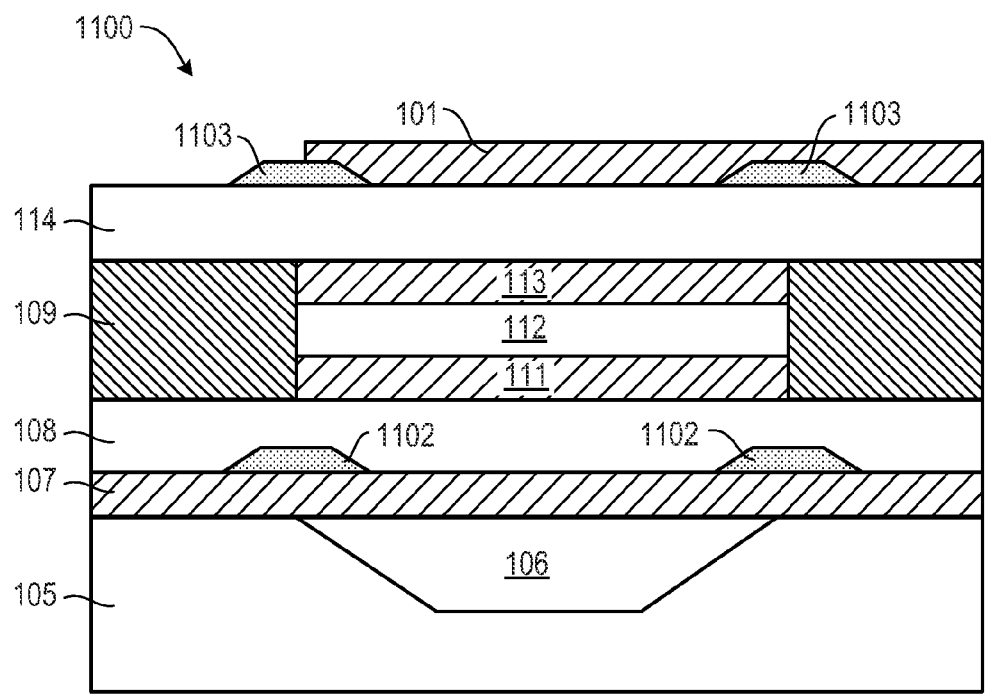

FIG. 11B shows a first bridge 1102 provided in the first piezoelectric layer 108. The first bridge 1102 is filled. A second bridge 1103 is provided in the second upper electrode 101. The second bridge 1103 is filled. First and second bridges 1102, 1103 are disposed around the perimeter of the active region of the CRF 1100, and foster confinement of modes in the active region of the CRF 900. For first and second bridges 1102, 1103 having the same width, height and overlap of cavity 106 as first and second bridges 1101, 104 similar improvements in $Q_o$, $Q_e$ and $S_{21}$ expected for first and second bridges 1101, 104 are expected with the use of first and second bridges 1101, 1103. Beneficially, the use of a filled bridge provides a more rugged structure.

Figure 11C:
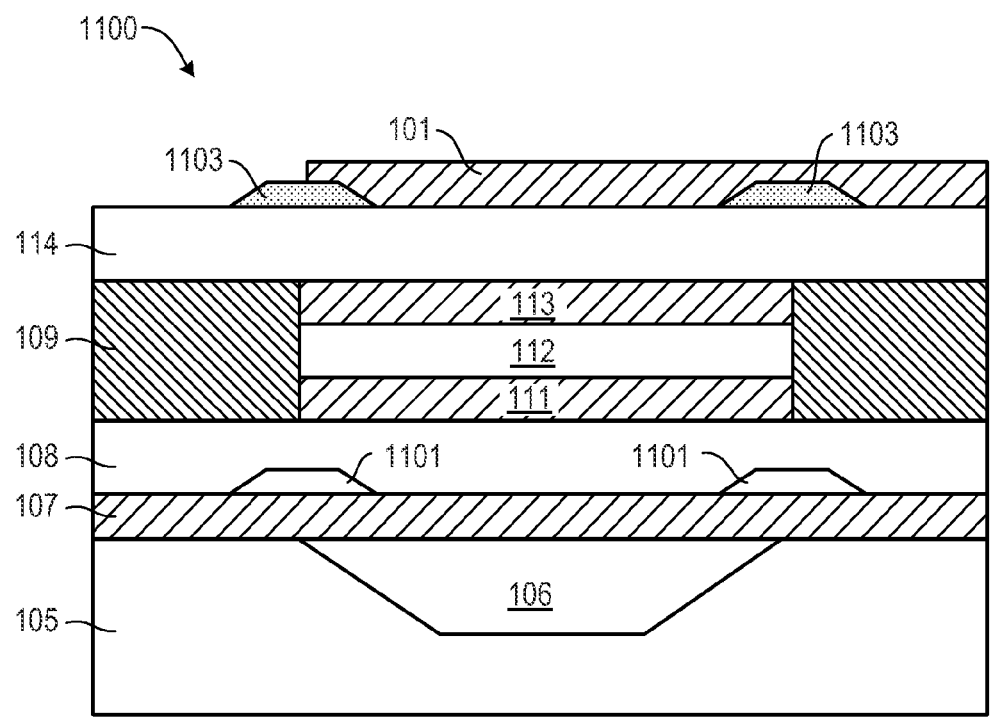

FIG. 11C shows first bridge 1101 provided in the first piezoelectric layer 108. The first bridge 1101 is unfilled (i.e., filled with air). Second bridge 1103 is provided in the second upper electrode 101. The second bridge 1103 is filled. First and second bridges 1101, 1103 are disposed around the perimeter of the active region of the CRF 1100, and foster confinement of modes in the active region of the CRF 1100. For first and second bridges 1101, 1103 having the same width, height and overlap of cavity 106 as first and second bridges 1101, 104 similar improvements in $Q_o$, $Q_e$ and $S_{21}$ expected for first and second bridges 1101, 104 are expected with the use of first and second bridges 1101, 1103. Beneficially, the use of a filled bridge provides a more rugged structure.

Figure 11D:
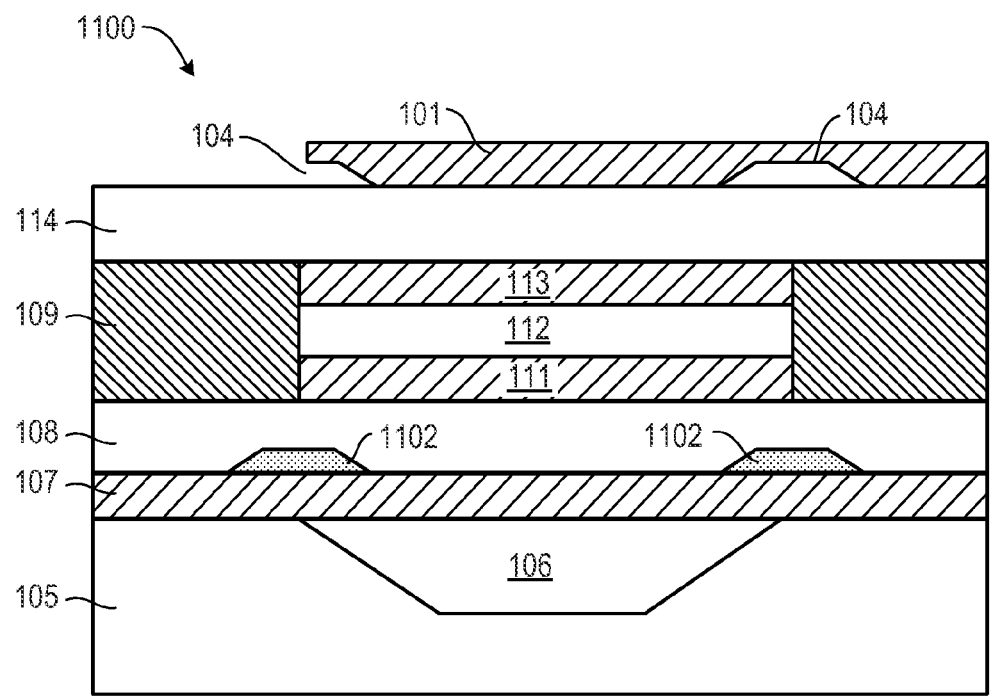

FIG. 11D shows first bridge 1102 provided in the first piezoelectric layer 108. The first bridge 1102 is filled. Second bridge 104 is provided in the second upper electrode 101. The second bridge 104 is unfilled (i.e., filled with air). First and second bridges 1102, 104 are disposed around the perimeter of the active region of the CRF 1100, and foster confinement of modes in the active region of the CRF 1100. For first and second bridges 1102, 104 having the same width, height and overlap of cavity 106 as first and second bridges 1102, 104 similar improvements in $Q_o$, $Q_e$ and $S_{21}$ expected for first and second bridges 1101, 104 are expected with the use of first and second bridges 1102, 104. Beneficially, the use of a filled bridge provides a more rugged structure.

FIGS. 12A~12D show cross-sectional views of the CRF 1200 in accordance with a representative embodiment. The CRF 1200 comprises a plurality of layers disposed over a substrate 105 having a cavity 106. Many aspects of the CRF 1200 are common to those of CRFs 100~1100, and are not repeated in order to avoid obscuring the description of the representative embodiments presently described.

Figure 12A:
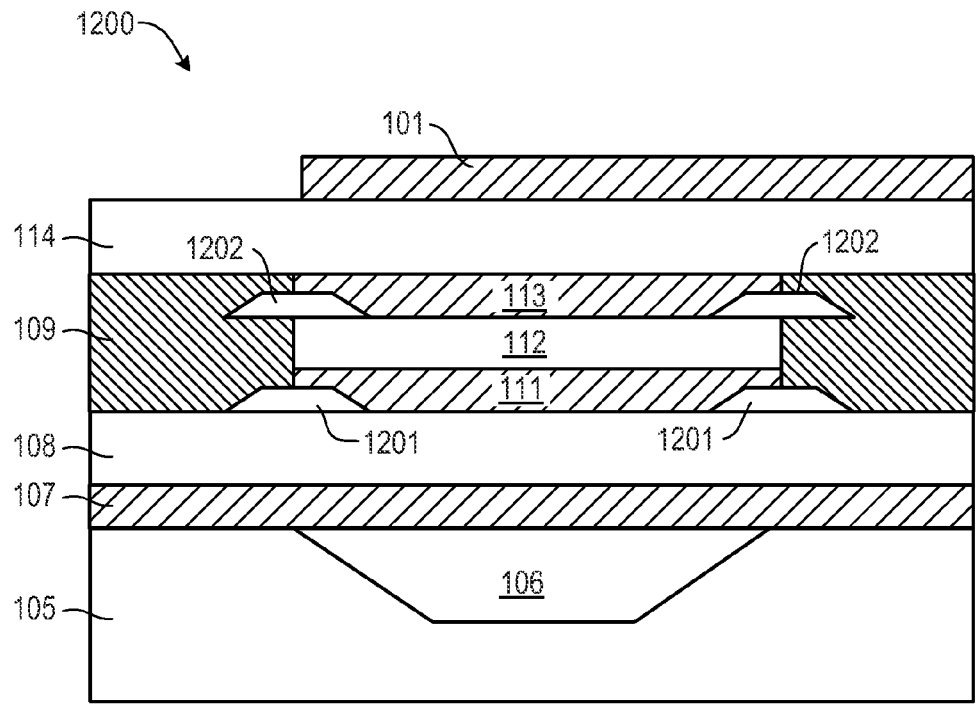
FIGS. 12A-12D are cross-sectional views of CRFs having bridges disposed in two layers of the CRF in accordance with a representative embodiment.

FIG. 12A shows a first bridge 1201 provided in the first upper electrode 111 and extending partially into the planarization layer 109. The first bridge 1201 is unfilled (i.e., filled with air). A second bridge 1202 is provided in the second lower electrode 113 and extends partially into the planarization layer 109. The second bridge 1202 is unfilled (i.e., filled with air). First and second bridges 1201, 1202 are disposed around the perimeter of the active region of the CRF 1200, and foster confinement of modes in the active region of the CRF. For purposes of illustration of the improvement in mode confinement in the active region of the CRF 1200, first and second bridges 1201, 1202 each having a width (x-dimension) of approximately 5.0 µm, a height of 2000 A, and overlapping the cavity 106 by 2.0 µm are provided. Compared to a known CRF without bridges (depending on frequency of operation, e.g. at 1.93 GHz), an improvement of approximately 300% in $Q_o$ for the CRF 1200 is expected due to the increased confinement of an odd mode in the CRF 1200 by use of first and second bridges 1101, 104 of the representative embodiment. Compared to a known CRF without bridges (depending on frequency of operation, e.g. at 1.98 GHz), an improvement of approximately 300% in $Q_e$ for the CRF 1200 is expected due to the increased confinement of an even mode in the CRF 1200 by use of first and second bridges 1201, 1202 of the representative embodiment. Incorporation of first and second bridges 1201, 1202 (depending on frequency of operation, e.g. at 1.93 GHz and 1.97 GHz) would result in an improvement of insertion loss ($S_{21}$) up to approximately 0.2 dB in insertion loss ($S_{21}$) for the CRF 1200 compared to a known CRF (without bridges), due to the increased confinement of odd and even mode in the CRF 1200 by use of first and second bridges 1201, 1202 of the representative embodiment.

Figure 12B:
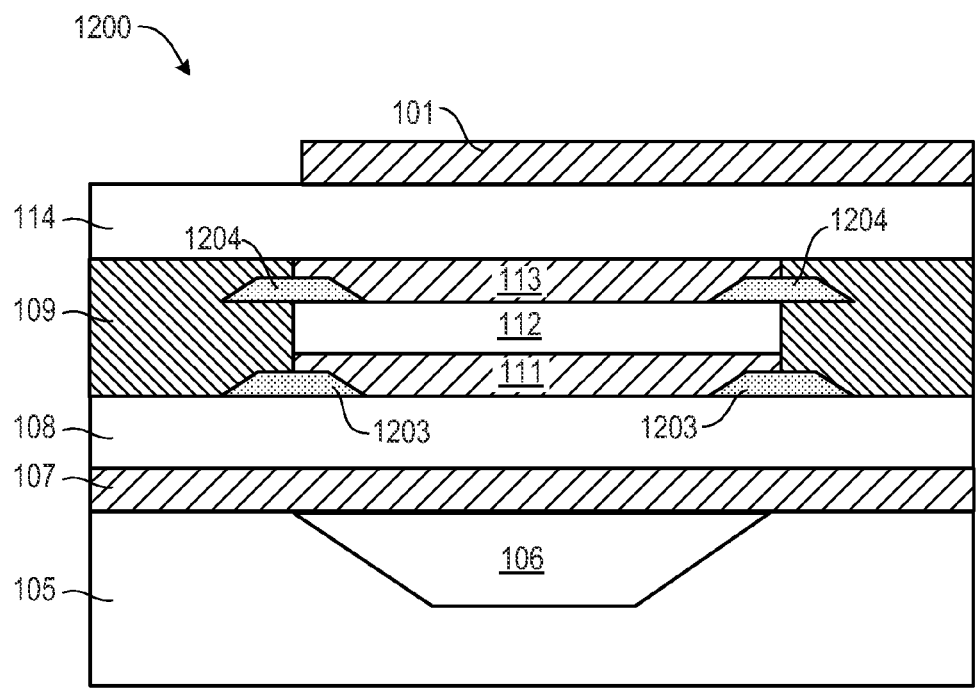

FIG. 12B shows a first bridge 1203 provided in the first upper electrode 111 and extending partially into the planarization layer 109. The first bridge 1203 is filled. A second bridge 1204 is provided in the second lower electrode 113 and extends partially into the planarization layer 109. The second bridge 1204 is filled. First and second bridges 1203, 1204 are disposed around the perimeter of the active region of the CRF 1200, and foster confinement of modes in the active region of the CRF 1200. For first and second bridges 1203, 1204 having the same width, height and overlap of cavity 106 as first and second bridges 1201, 1202, similar improvements in $Q_o$, $Q_e$ and $S_{21}$ expected for first and second bridges 1201, 1202 are expected with the use of first and second bridges 1203, 1204. Beneficially, the use of a filled bridge provides a more rugged structure.

Figure 12C:
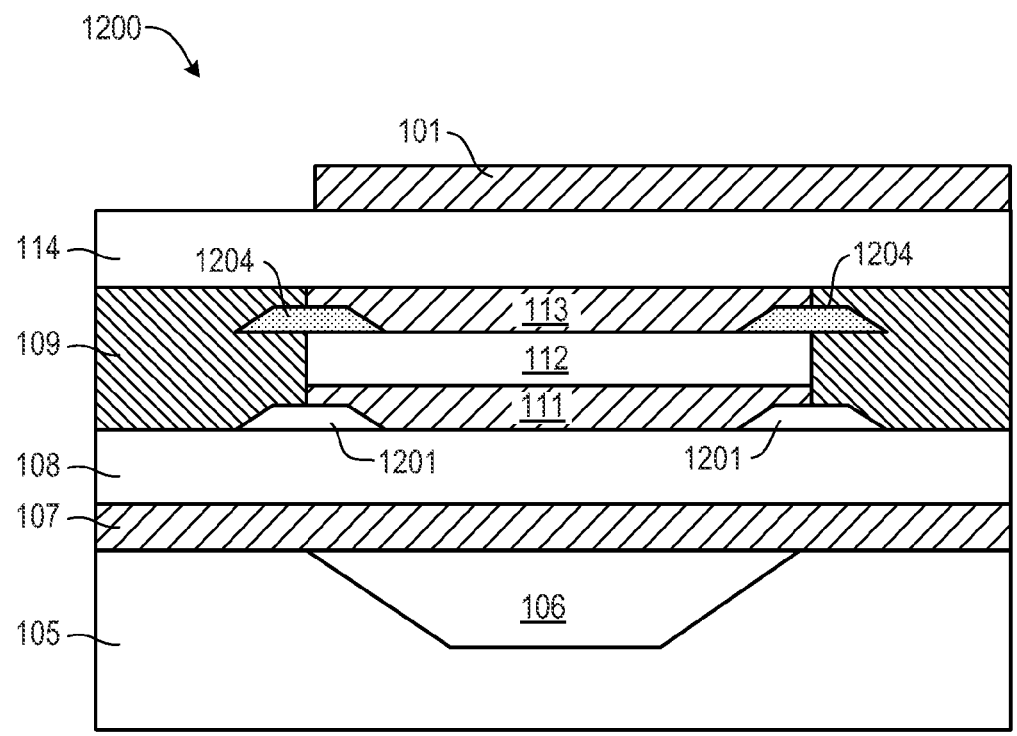

FIG. 12C shows first bridge 1201 provided in the first upper electrode 111 and extending partially into the planarization layer 109. The first bridge 1201 is unfilled (i.e., filled with air). Second bridge 1204 is provided in the second lower electrode 113 and extends partially into the planarization layer 109. The second bridge 1204 is filled. First and second bridges 1201, 1204 are disposed around the perimeter of the active region of the CRF 1200, and foster confinement of modes in the active region of the CRF 1200. For first and second bridges 1201, 1204 having the same width, height and overlap of cavity 106 as first and second bridges 1201, 1202, similar improvements in $Q_o$, $Q_e$ and $S_{21}$ expected for first and second bridges 1201, 1202 are expected with the use of first and second bridges 1201, 1204. Beneficially, the use of a filled bridge provides a more rugged structure.

Figure 12D:
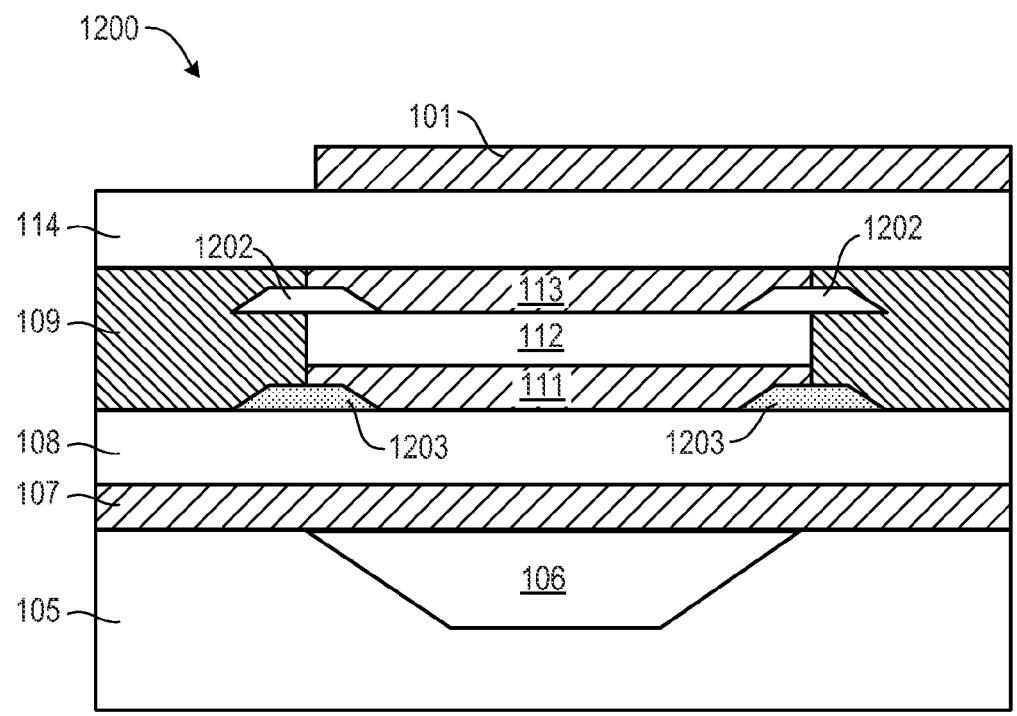

FIG. 12D shows first bridge 1203 provided in the first upper electrode 111 and extending partially into the planarization layer 109. The first bridge 1203 is filled. Second bridge 1202 is provided in the second lower electrode 113 and extends partially into the planarization layer 109. The second bridge 1202 is unfilled (i.e., filled with air). First and second bridges 1203, 1202 are disposed around the perimeter of the active region of the CRF 1200, and foster confinement of modes in the active region of the CRF 1200. For first and second bridges 1203, 1202 having the same width, height and overlap of cavity 106 as first and second bridges 1201, 1202, similar improvements in $Q_o$, $Q_e$ and $S_{21}$ expected for first and second bridges 1201, 1202 are expected with the use of first and second bridges 1203, 1202. Beneficially, the use of a filled bridge provides a more rugged structure.

FIGS. 13A~13D show cross-sectional views of the CRF 1300 in accordance with a representative embodiment. The CRF 1300 comprises a plurality of layers disposed over a substrate 105 having a cavity 106. Many aspects of the CRF 1300 are common to those of CRFs 100~1200, and are not repeated in order to avoid obscuring the description of the representative embodiments presently described.

Figure 13A:
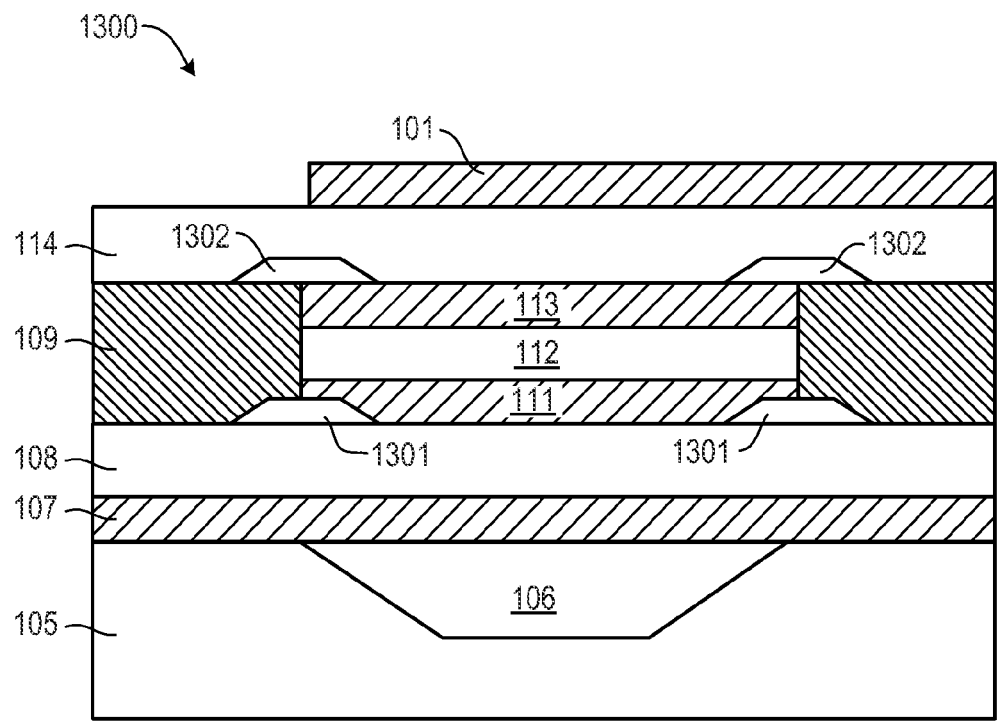
FIGS. 13A-13D are cross-sectional views of CRFs having bridges disposed in two layers of the CRF in accordance with a representative embodiment.

FIG. 13A shows a first bridge 1301 provided in the first upper electrode 111 and extending partially into the planarization layer 109. The first bridge 1301 is unfilled (i.e., filled with air). A second bridge 1302 is provided in the second piezoelectric layer 114. The second bridge 1302 is unfilled (i.e., filled with air). First and second bridges 1301, 1302 are disposed around the perimeter of the active region of the CRF 1300, and foster confinement of modes in the active region of the CRF. For purposes of illustration of the improvement in mode confinement in the active region of the CRF 1300, first and second bridges 1301, 1302 each having a width (x-dimension) of approximately 5.0 µm, a height of 2000 A, and overlapping the cavity 106 by 2.0 µm are provided. Compared to a known CRF without bridges (depending on frequency of operation, e.g. at 1.93 GHz), an improvement of approximately 300% in $Q_o$ for the CRF 1300 is expected due to the increased confinement of an odd mode in the CRF 1300 by use of first and second bridges 1301, 1302 of the representative embodiment. Compared to a known CRF without bridges (depending on frequency of operation, e.g. at 1.98 GHz), an improvement of approximately 300% in $Q_e$ for the CRF 1300 is expected due to the increased confinement of an even mode in the CRF 1300 by use of first and second bridges 1301, 1302 of the representative embodiment. Incorporation of first and second bridges 1301, 1302 (depending on frequency of operation, e.g. at 1.93 GHz and 1.97 GHz) would result in an improvement of insertion loss ($S_{21}$) up to approximately 0.2 dB in insertion loss ($S_{21}$) for the CRF 1300 compared to a known CRF (without bridges), due to the increased confinement of odd and even mode in the CRF 1300 by use of first and second bridges 1301, 1302 of the representative embodiment.

Figure 13B:
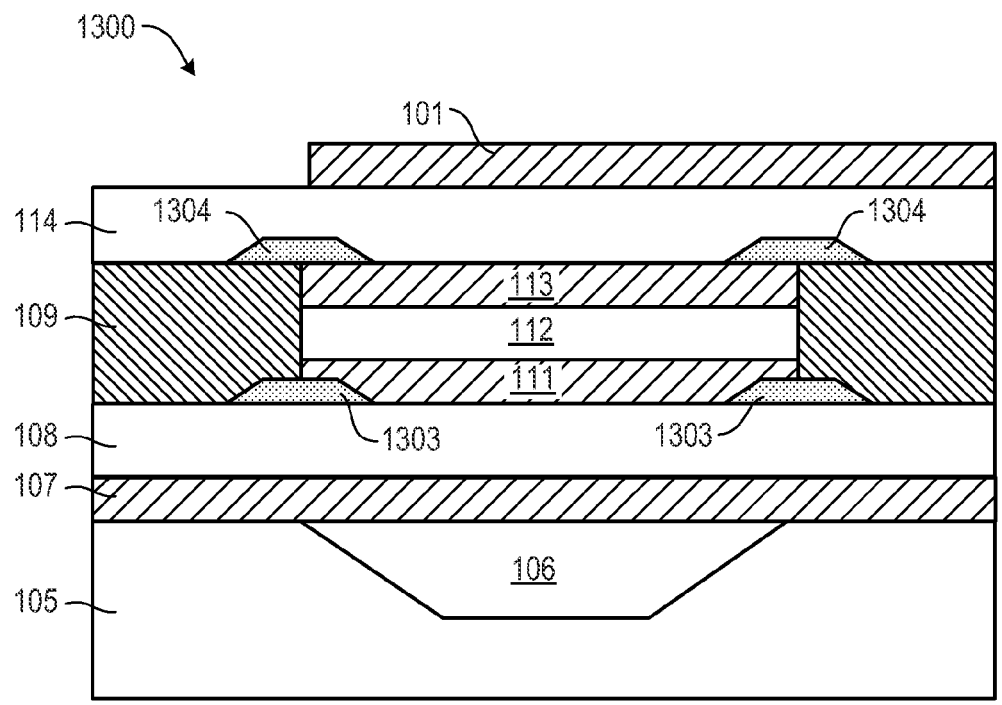

FIG. 13B shows a first bridge 1303 provided in the first upper electrode 111 and extending partially into the planarization layer 109. The first bridge 1303 is filled. A second bridge 1304 is provided in the second piezoelectric layer 114. The second bridge 1304 is filled. First and second bridges 1303, 1304 are disposed around the perimeter of the active region of the CRF 1300, and foster confinement of modes in the active region of the CRF 1300. For first and second bridges 1303, 1304 having the same width, height and overlap of cavity 106 as first and second bridges 1301, 1302, similar improvements in $Q_o$, $Q_e$ and $S_{21}$ expected for first and second bridges 1301, 1302 are expected with the use of first and second bridges 1303, 1304. Beneficially, the use of a filled bridge provides a more rugged structure.

Figure 13C:
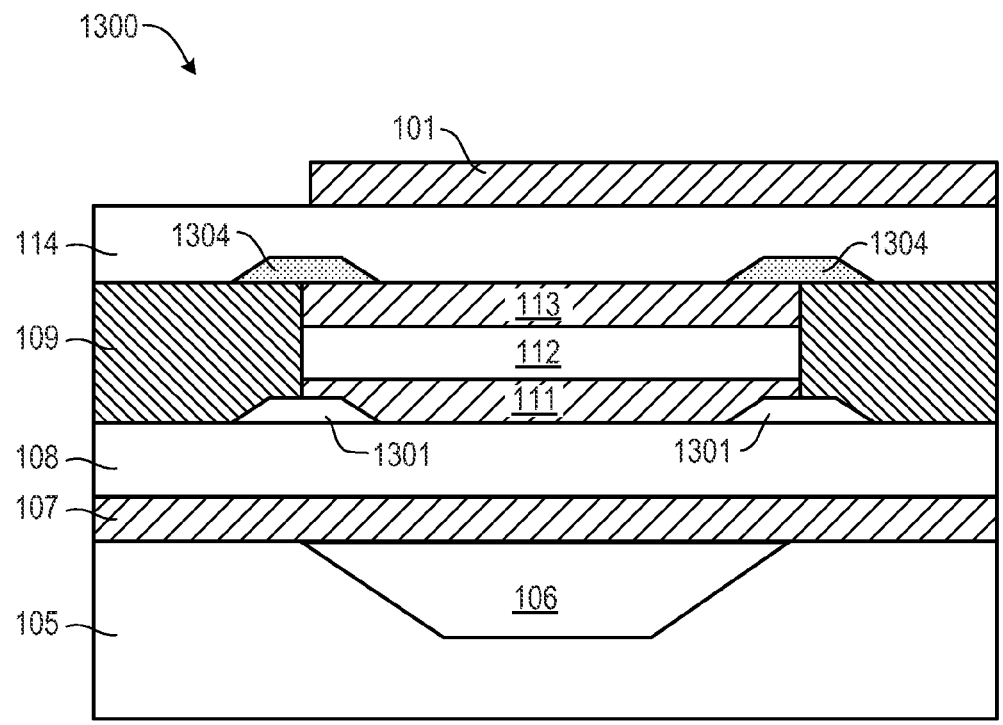

FIG. 13C shows first bridge 1301 provided in the first upper electrode 111 and extending partially into the planarization layer 109. The first bridge 1301 is unfilled (i.e., filled with air). Second bridge 1304 is provided in the second piezoelectric layer 114. The second bridge 1304 is filled. First and second bridges 1301, 1304 are disposed around the perimeter of the active region of the CRF 1300, and foster confinement of modes in the active region of the CRF 1300. For first and second bridges 1301, 1304 having the same width, height and overlap of cavity 106 as first and second bridges 1301, 1302, similar improvements in $Q_o$, $Q_e$ and $S_{21}$ expected for first and second bridges 1301, 1302 are expected with the use of first and second bridges 1301, 1304. Beneficially, the use of a filled bridge provides a more rugged structure.

Figure 13D:
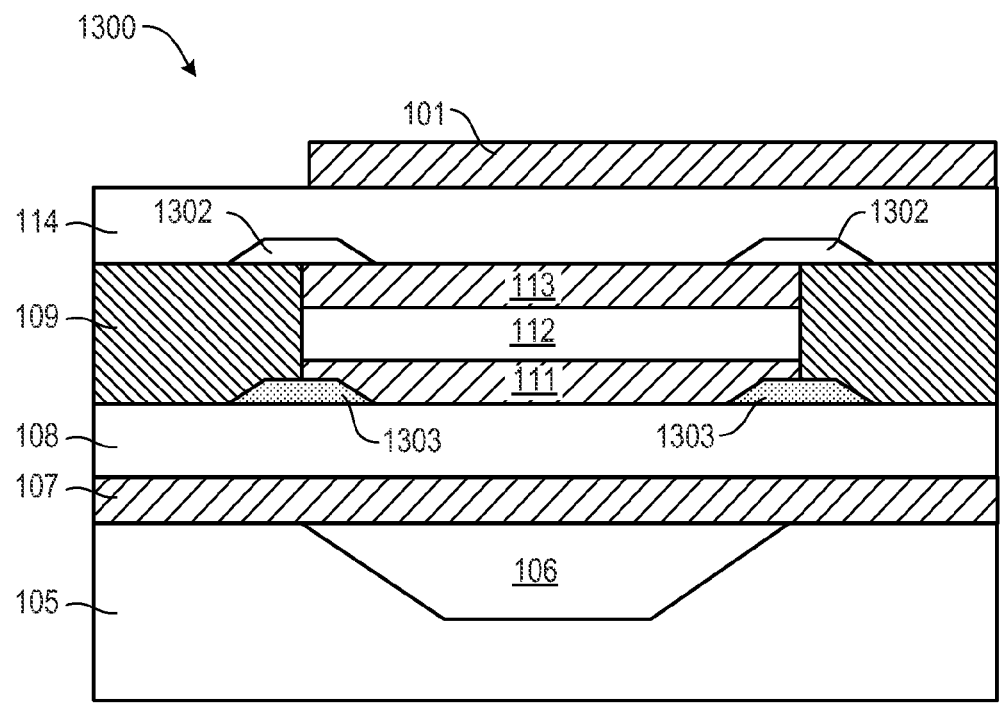

FIG. 13D shows first bridge 1303 provided in the first upper electrode 111 and extending partially into the planarization layer 109. The first bridge 1303 is filled. Second bridge 1302 is provided in the second piezoelectric layer 114. The second bridge 1302 is unfilled (i.e., filled with air). First and second bridges 1303, 1302 are disposed around the perimeter of the active region of the CRF 1300, and foster confinement of modes in the active region of the CRF 1300. For first and second bridges 1303, 1302 having the same width, height and overlap of cavity 106 as first and second bridges 1301, 1302, similar improvements in $Q_o$, $Q_e$ and $S_{21}$ expected for first and second bridges 1301, 1302 are expected with the use of first and second bridges 1303, 1302. Beneficially, the use of a filled bridge provides a more rugged structure.

In accordance with illustrative embodiments, BAW resonator structures comprising a single-material acoustic coupling layer and their methods of fabrication are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator structure, comprising:
   a first BAW resonator comprising a first lower electrode, a first upper electrode and a first piezoelectric layer disposed between the first lower electrode and the first upper electrode;
   a second BAW resonator comprising a second lower electrode, a second upper electrode and a second piezoelectric layer disposed between the second lower electrode and the second upper electrode;
   an acoustic coupling layer disposed between the first BAW resonator and the second BAW resonator; and
   a first bridge disposed between the first lower electrode of the first BAW resonator and the second upper electrode of the second BAW resonator, wherein the BAW resonator structure has a first perimeter, and the first bridge is disposed completely along the first perimeter; and
   a second bridge disposed between the first upper electrode of the first BAW resonator and the second lower electrode of the second BAW resonator.

2. A BAW resonator structure as claimed in claim 1, wherein the first bridge has a trapezoidal cross-sectional shape.

3. A BAW resonator structure as claimed in claim 1, further comprising a fill material having acoustic impedance disposed beneath the first bridge.

4. A BAW resonator structure as claimed in claim 3, wherein the fill material comprises non-etchable borosilicate glass (NEBSG).

5. A BAW resonator structure as claimed in claim 1, further comprising a fill material having acoustic impedance disposed beneath the second bridge.

6. A BAW resonator structure as claimed in claim 5, wherein the fill material comprises non-etchable borosilicate glass (NEBSG).

7. A BAW resonator structure as claimed in claim 1, wherein the second bridge has a trapezoidal cross-sectional shape.

8. A BAW resonator structure as claimed in claim 1, wherein neither the first bridge nor the second bridge is disposed in the first lower electrode of the BAW resonator structure.

9. A BAW resonator structure as claimed in claim 1, wherein the first BAW resonator comprises a first bulk acoustic wave resonator (FBAR) and the second BAW resonator comprises a second FBAR.

10. A BAW resonator structure as claimed in claim 1, wherein the first BAW resonator comprises a first solidly mounted resonator (SMR) and the second BAW resonator comprises a second SMR.

11. A coupled resonator filter (CRF) comprising the BAW resonator structure of claim 1.

12. A bulk acoustic wave (BAW) resonator structure, comprising:
   a first BAW resonator comprising a first lower electrode, a first upper electrode and a first piezoelectric layer disposed between the first lower electrode and the first upper electrode;
   a second BAW resonator comprising a second lower electrode, a second upper electrode and a second piezoelectric layer disposed between the second lower electrode and the second upper electrode;
   an acoustic coupling layer disposed between the first BAW resonator and the second BAW resonator;
   a first bridge disposed in the first upper electrode of the first BAW resonator; and
   a second bridge disposed in the second upper electrode, wherein the first bridge is disposed about a first perimeter of the BAW resonator structure.

13. A BAW resonator structure as claimed in claim 12, wherein the second bridge is disposed about a second perimeter of the BAW resonator structure.

14. A BAW resonator structure as claimed in claim 12, wherein the first bridge has a trapezoidal cross-sectional shape.

15. A BAW resonator structure as claimed in claim 12, wherein the second bridge has a trapezoidal cross-sectional shape.

16. A BAW resonator structure as claimed in claim 12, further comprising a fill material having acoustic impedance disposed beneath the first bridge.

17. A BAW resonator structure as claimed in claim 16, wherein the fill material comprises non-etchable borosilicate glass (NEBSG).

18. A BAW resonator structure as claimed in claim 12, further comprising a fill material having acoustic impedance disposed beneath the second bridge.

19. A BAW resonator structure as claimed in claim 18, wherein the fill material comprises non-etchable borosilicate glass (NEBSG).

20. A BAW resonator structure as claimed in claim 12, wherein neither the first bridge nor the second bridge is disposed in the first lower electrode of the BAW resonator structure.

21. A BAW resonator structure as claimed in claim 12, wherein the first BAW resonator comprises a first bulk acoustic wave resonator (FBAR) and the second BAW resonator comprises a second FBAR.

22. A BAW resonator structure as claimed in claim 21, further comprising a cavity disposed beneath the first and second FBARs, wherein the first bridge and the second bridge extend past an edge of the cavity.

23. A BAW resonator structure as claimed in claim 12, wherein the first BAW resonator comprises a first solidly mounted resonator (SMR) and the second BAW resonator comprises a second SMR.

24. A BAW resonator structure as claimed in claim 23, further comprising a Bragg reflector disposed beneath the first and second FBARs, wherein the first bridge and the second bridge extend past an edge of the Bragg reflector.

25. A coupled resonator filter (CRF) comprising the BAW resonator structure of claim 12.

26. A bulk acoustic wave (BAW) resonator structure, comprising:
a first BAW resonator comprising a first lower electrode, a first upper electrode and a first piezoelectric layer disposed between the first lower electrode and the first upper electrode;
a second BAW resonator comprising a second lower electrode, a second upper electrode and a second piezoelectric layer disposed between the second lower electrode and the second upper electrode;
an acoustic coupling layer disposed between the first BAW resonator and the second BAW resonator;
a first bridge disposed in the first piezoelectric layer; and
a second bridge disposed in the second piezoelectric layer, wherein the first bridge is disposed about a first perimeter of the BAW resonator structure.

27. A BAW resonator structure as claimed in claim 26, wherein the second bridge is disposed about a second perimeter of the BAW resonator structure.

28. A BAW resonator structure as claimed in claim 26, wherein the first bridge has a trapezoidal cross-sectional shape.

29. A BAW resonator structure as claimed in claim 26, wherein the second bridge has a trapezoidal cross-sectional shape.

30. A BAW resonator structure as claimed in claim 26, further comprising a fill material having acoustic impedance disposed beneath the first bridge.

31. A BAW resonator structure as claimed in claim 30, wherein the fill material comprises non-etchable borosilicate glass (NEBSG).

32. A BAW resonator structure as claimed in claim 26, further comprising a fill material having acoustic impedance disposed beneath the second bridge.

33. A BAW resonator structure as claimed in claim 32, wherein the fill material comprises non-etchable borosilicate glass (NEBSG).

34. A BAW resonator structure as claimed in claim 26, wherein neither the first bridge nor the second bridge is disposed in the first lower electrode of the BAW resonator structure.

35. A BAW resonator structure as claimed in claim 26, wherein the first BAW resonator comprises a first bulk acoustic wave resonator (FBAR) and the second BAW resonator comprises a second FBAR.

36. A BAW resonator structure as claimed in claim 35, further comprising a cavity disposed beneath the first and second FBARs, wherein the first bridge and the second bridge extend past an edge of the cavity.

37. A BAW resonator structure as claimed in claim 26, wherein the first BAW resonator comprises a first solidly mounted resonator (SMR) and the second BAW resonator comprises a second SMR.

38. A BAW resonator structure as claimed in claim 37, further comprising a Bragg reflector disposed beneath the first and second FBARs, wherein the first bridge and the second bridge extend past an edge of the Bragg reflector.

39. A coupled resonator filter (CRF) comprising the BAW resonator structure of claim 26.

40. A bulk acoustic wave (BAW) resonator structure, comprising:
a first BAW resonator comprising a first lower electrode, a first upper electrode and a first piezoelectric layer disposed between the first lower electrode and the first upper electrode;
an acoustic reflector or a cavity disposed beneath the first BAW resonator
a second BAW resonator comprising a second lower electrode, a second upper electrode and a second piezoelectric layer disposed between the second lower electrode and the second upper electrode;
an acoustic coupling layer disposed between the first BAW resonator and the second BAW resonator; and
a bridge disposed in the first piezoelectric layer, wherein the bridge is disposed about a perimeter of the BAW resonator structure, the bridge extending past an edge of the acoustic reflector or the cavity.

41. A BAW resonator structure as claimed in claim 40, wherein the bridge has a trapezoidal cross-sectional shape.

42. A BAW resonator structure as claimed in claim 40, further comprising a fill material having acoustic impedance disposed beneath the bridge.

43. A BAW resonator structure as claimed in claim 42, wherein the fill material comprises non-etchable borosilicate glass (NEBSG).

44. A BAW resonator structure as claimed in claim 40, wherein the first BAW resonator comprises a first bulk acoustic wave resonator (FBAR) and the second BAW resonator comprises a second FBAR.

45. A BAW resonator structure as claimed in claim 40, wherein the first BAW resonator comprises a first solidly mounted resonator (SMR) and the second BAW resonator comprises a second SMR.

46. A coupled resonator filter (CRF) comprising the BAW resonator structure of claim 40.

\* \* \* \* \*